(12) United States Patent
Jin

(10) Patent No.: US 12,105,148 B2
(45) Date of Patent: Oct. 1, 2024

(54) GAS DENSITY RELAY HAVING SIMULATION CHECK FUNCTION AND SIMULATION CHECK METHOD THEREOF

(71) Applicant: SHANGHAI ROYE ELECTRIC CO., LTD., Shanghai (CN)

(72) Inventor: Haiyong Jin, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 211 days.

(21) Appl. No.: 17/997,543

(22) PCT Filed: Feb. 9, 2021

(86) PCT No.: PCT/CN2021/076129
§ 371 (c)(1),
(2) Date: Oct. 29, 2022

(87) PCT Pub. No.: WO2021/218284
PCT Pub. Date: Nov. 4, 2021

(65) Prior Publication Data
US 2023/0221370 A1      Jul. 13, 2023

(30) Foreign Application Priority Data

Apr. 29, 2020  (CN) .......................... 202010359601.7

(51) Int. Cl.
*G01R 31/327*      (2006.01)
*H01H 35/28*       (2006.01)
*H01H 35/38*       (2006.01)

(52) U.S. Cl.
CPC ......... *G01R 31/3278* (2013.01); *H01H 35/28* (2013.01); *H01H 35/38* (2013.01)

(58) Field of Classification Search
CPC .............. G01R 31/3278; G01R 31/327; G01N 2009/006; G01N 9/002; G01N 9/00;
(Continued)

(56) References Cited

U.S. PATENT DOCUMENTS

| 4,783,580 A | 11/1988 | Bassin | |
|---|---|---|---|
| 2016/0084909 A1* | 3/2016 | Mashaney | ............ G01R 31/327 324/418 |
| 2016/0195582 A1* | 7/2016 | Voß | .................... G05B 19/0425 324/418 |

FOREIGN PATENT DOCUMENTS

| CN | 110441195 A | 11/2019 |
|---|---|---|
| CN | 111446118 A | 7/2020 |

* cited by examiner

*Primary Examiner* — Christopher P McAndrew
(74) *Attorney, Agent, or Firm* — Hsuanyeh Law Group, PC

(57) ABSTRACT

Disclosed are a gas density relay having a simulation check function and a simulation check method thereof, the gas density relay includes a gas density relay body, a simulation reference signal unit, a simulation check signal unit, a driving contact action mechanism, and an intelligent control unit. The intelligent control unit obtains, according to the check, by the simulation reference signal unit, of a simulation check signal generated by the simulation check signal unit, a current working state of a monitoring part, so as to quantitatively and accurately measure the precision of the gas density relay; by providing the driving contact action mechanism, the gas density relay body generates an alarm and/or a locking contact action to ensure that a contact execution mechanism of the gas density relay body and a contact itself are normal. The present application completes online simulation or virtual check of the gas density relay while being used for monitoring the gas density of a insulation or arc extinguishing electrical equipment, thereby improving working efficiency, reducing operation and maintenance costs, and guaranteeing safe operation of a power grid.

20 Claims, 6 Drawing Sheets

(58) Field of Classification Search
CPC ........ H01H 35/28; H01H 35/38; H01H 35/32; H01H 35/36; H01H 35/26; H01H 33/563; H01H 11/0062
USPC .......................................................... 324/418
See application file for complete search history.

GAS DENSITY RELAY HAVING SIMULATION CHECK FUNCTION AND SIMULATION CHECK METHOD THEREOF

RELATED APPLICATIONS

This is a US national stage application of international application no. PCT/CN2021/076129, filed Feb. 9, 2021, which claims the priority of Chinese Patent Application 202010359601.7 (TITLE: GAS DENSITY RELAY HAVING SIMULATION CHECK FUNCTION, AND SIMULATION CHECK METHOD THEREOF) filed on Apr. 29, 2020.

TECHNICAL FIELD

The present invention relates to the technical field of electric power, and in particular to a gas density relay having a simulation check function and applied to high-voltage and medium-voltage electrical equipment, and a simulation check method of the gas density relay.

BACKGROUND

At present, SF6 (sulfur hexafluoride) electrical equipment has been widely used in electric power departments and industrial and mining enterprises, promoting the rapid development of the electric power industry. In recent years, with the rapid economic development, the capacity of China's electric power system has expanded rapidly, and the amount of SF6 electrical equipment is increasing. The SF6 gas plays the role of arc extinguishing and insulation in the high-voltage electrical equipment. If the density of the SF6 gas in the high-voltage electrical equipment is reduced and moisture content exceeds the standard, the safe operation of the SF6 high-voltage electrical equipment may be seriously affected: the reduction of the SF6 gas density to a certain extent may lead to the loss of insulation and arc extinguishing performance.

Regular inspection of the gas density relay on the electrical equipment is a necessary measure to prevent problems before they happen and ensure the safe and reliable operation of the electrical equipment. Both Electric Power Preventive Test Regulations and Twenty-five Key Requirements for Preventing Major Accidents in Electric Power Production require that the gas density relay be checked regularly. From an actual operation point of view, a regular check of the gas density relay is one of a necessary means to ensure the safe and reliable operation of an electric power equipment. However, in the prior art, the check or inspection of a gas density online monitoring apparatus or a remote transmission density relay requires a lot of manpower and material resources.

Therefore, it is very necessary to develop a gas density relay or gas density monitoring apparatus having a simulation check function is developed, which is applied to a gas density monitoring system based on the Ubiquitous Electric Internet of Things to complete the online simulation or virtual self-check and check of the gas density relay, and then realize the intelligent diagnostic of the gas density relay and realize the maintenance-free.

SUMMARY

The present invention provides a gas density relay (or gas density monitoring apparatus) having a simulation check function and for high-voltage or medium-voltage electrical equipment, and a simulation check method of the gas density relay, which are used to monitor the gas density of gas-insulating or arc-extinguishing electrical equipment and complete online simulation self-check and check of the gas density relay, thereby improving efficiency, avoiding maintenance, reducing operation and maintenance costs, and ensuring the safe operation of a power grid.

To achieve the above purpose, the invention uses the following technical solutions:

a first aspect of the present application discloses a gas density relay (or gas density monitoring apparatus) having a simulation check function, including: a gas density relay body, a simulation reference signal unit, a simulation check signal unit, a driving contact action mechanism and an intelligent control unit, where the gas density relay body comprises: a housing, and a pressure detection element, a temperature compensation element, a signal generator, and a signal action mechanism which are arranged in the housing;

the driving contact action mechanism is configured to trigger the signal generator to make the gas density relay body generate an alarm and/or locking contact signal action;

the intelligent control unit is respectively connected to the simulation reference signal unit, the simulation check signal unit and the driving contact action mechanism, and is configured to receive data and/or signals collected by the simulation reference signal unit and the simulation check signal unit to complete the control of the driving contact action mechanism and monitor the contact signal action of the gas density relay body;

the simulation reference signal unit is configured to monitor a pressure change value or a temperature change value or a gas density change value in the gas density relay body; the simulation check signal unit is configured to detect one or more of the deformation quantity of a part subjected to deformation and the displacement quantity of a part subjected to displacement due to pressure change or temperature change or gas density change in the gas density relay body; the intelligent control unit determines whether a difference value between the deformation quantity of the part subjected to deformation and/or the displacement quantity of the part subjected to displacement when pressure or temperature or gas density in the gas density relay body changes and a preset standard value, and a corresponding preset standard value is within a preset threshold; or, the simulation reference signal unit is configured to collect a pressure value or a temperature value or a gas density value in the gas density relay body; the simulation check signal unit is configured to detect one or more of the deformation state of a part subjected to deformation or the position of a part subjected to displacement due to pressure change or temperature change or gas density change in the gas density relay body; the intelligent control unit determines whether a difference value between the deformation state of the part subjected to deformation and/or the position of the part subjected to displacement corresponding to a set pressure value or temperature value or gas density value in the gas density relay body and a preset standard value, and a preset standard value corresponding thereto is within a preset threshold; or, the simulation check signal unit is configured to output a simulation check signal when any one or more of pressure, temperature and gas density in the gas density relay body changes; the simulation reference signal unit is configured to monitor one or more of a pressure value, a temperature value and a gas density value in the gas density relay body when the simulation check signal is output; and the intelligent control unit determines whether a difference value between the pressure value and/or the temperature value and/or the gas density value and a preset standard value, and a preset standard value corresponding thereto is within a preset threshold.

The simulation check signal unit is configured to output a simulation check signal when any one or more of pressure, temperature and gas density in the gas density relay body changes and reaches the corresponding set value; the simulation reference signal unit is configured to monitor one or more of an actual pressure value, temperature value and gas density value in the gas density relay body when the simulation check signal is output; and the intelligent control unit determines whether a difference value between the actual pressure value and/or temperature value and/or gas density value and a preset standard value corresponding thereto is within a preset threshold.

In a preferred embodiment, the gas density relay includes a use terminal and a background communicating with the use terminal; the gas density relay body, the simulation reference signal unit, the simulation check signal unit and the driving contact action mechanism are located at the use terminal; and the intelligent control units may be all located at the use terminal, or may be partially located at the use terminal and partially located at the background.

For example, a data collection module of the intelligent control unit is located at the use terminal, and a determination module of the intelligent control unit is located at the background.

The data collection module is configured to receive data and/signals collected by the simulation reference signal unit and the simulation check signal unit, and monitor the contact signal action or signal change of the gas density relay body.

The determination module is configured to determine any one or more of A)-C):
A) determine whether a difference value between the deformation quantity of a part subjected to deformation and/or the displacement quantity of a part subjected to displacement and a preset standard value, and a corresponding preset standard value when pressure or temperature or gas density in the gas density relay body changes is within a preset threshold;
B) determine whether a difference value between the deformation state of the part subjected to deformation and/or the position of the part subjected to displacement corresponding to a set pressure value or temperature value or gas density value in the gas density relay body and a preset standard value, and a corresponding preset standard value is within a preset threshold; and
C) determine whether a difference value between the pressure value and/or temperature value and/or gas density value in the gas density relay body when the simulation reference signal unit outputs the simulation check signal, and a preset standard value corresponding thereto is within a preset threshold.

The above-mentioned gas density relay having the simulation check function refers to that the elements are designed into an integrated structure; and the gas density monitoring apparatus having the simulation check function refers to that the elements are designed into a split structure with flexible composition.

Preferably, the simulation check signal unit includes at least one diagnostic sensor, the diagnostic sensor is arranged in a housing of the gas density relay body, and the simulation check signal unit is configured to detect any one or more of the deformation state and the deformation quantity of the part subjected to deformation and the position and the displacement quantity of the part subjected to displacement due to the pressure change or temperature change or gas density change in the gas density relay body through the diagnostic sensor.

More preferably, the diagnostic sensor is arranged on a pressure detection element; or, the diagnostic sensor is arranged on a temperature compensation element; or, the diagnostic sensor is arranged on a signal action mechanism; or, two diagnostic sensors are provided, one is arranged on the pressure detection element, and the other one is arranged on the temperature compensation element.

More preferably, the diagnostic sensor includes one or more of a displacement sensor, a magnetic sensor, a gravity sensor, a pressure sensor, a deformation quantity sensor, a distance measuring sensor, a photoelectric sensor, an angle sensor, an ultrasonic sensor, an infrared sensor, a deformation sheet sensor, and a camera.

Preferably, the simulation check signal unit includes a simulation signal device, the simulation signal device is arranged in the housing of the gas density relay body, and the simulation check signal unit is configured to output a simulation check signal by triggering the contact action or signal change of the simulation signal device when gas pressure monitored by the pressure detection element changes, and/or gas density monitored by the pressure detection element and the temperature compensation element changes, and/or gas temperature monitored by the temperature compensation element changes.

More preferably, the simulation signal device includes one or more of a micro switch, an electrical contact, a mercury switch, a photoelectric switch, a reed switch, a proximity switch, an electronic switch, a photoelectric sensor, a variable resistor and a voltage or current measuring device.

More preferably, the simulation check signal generated by the simulation check signal unit includes one of a switch quantity signal, a digital quantity signal, and an analog quantity signal.

Preferably, the signal generator includes a micro switch or a magnetic-assisted electrical contact, and the gas density relay body outputs an alarm and/or a locking contact signal through the signal generator; the pressure detection element includes a Bourdon tube or bellow filled with sealing gas; and the temperature compensation element adopts a temperature compensation sheet or a gas enclosed in the housing.

Preferably, the simulation reference signal unit includes a gas density detection sensor, and the gas density detection sensor communicates with the gas density relay body; and/or, the simulation reference signal unit includes a pressure sensor, and the pressure sensor communicates with a gas path of the gas density relay body; and/or, the simulation reference signal unit includes a temperature sensor, and the temperature sensor is mounted on or outside a gas path of the gas density relay body, or mounted in the gas density relay body, or mounted outside the gas density relay body.

More preferably, the gas density detection sensor includes at least one pressure sensor and at least one temperature sensor, or adopts a gas density transmitter formed by a pressure sensor and a temperature sensor, or adopts a density detection sensor using a quartz tuning fork technology.

More preferably, the pressure sensor includes a relative pressure sensor and/or an absolute pressure sensor.

Preferably, the preset standard value may be a pre-stored value, or may be a value output by the simulation reference signal unit as the preset standard value. For example, the simulation reference signal unit includes a simulation reference signal device, the intelligent control unit determines whether a temperature difference value and/or a pressure difference value and/or a density difference value is within a preset threshold when respective contacts of the simulation reference signal device and the simulation signal device act or signals change.

In a preferred embodiment, the simulation reference signal unit includes a simulation reference signal device, and further includes a second pressure detection element and a second temperature compensation element; the simulation reference signal unit is configured to monitor the gas density change in the gas density relay body; and when the gas density change reaches a standard set density value, the simulation reference signal device outputs a standard set density value signal.

In a preferred embodiment, the simulation reference signal unit includes a simulation reference signal device, and further includes a second pressure detection element; the simulation reference signal unit is configured to monitor the pressure change in the gas density relay body; and when the pressure change reaches a standard set pressure value, the simulation reference signal device outputs a standard set pressure value signal.

In a preferred embodiment, the simulation reference signal unit includes a simulation reference signal device, and further includes a second temperature compensation element; the simulation reference signal unit is configured to monitor the temperature change in the gas density relay body; and when the temperature change reaches a standard set density value, the simulation reference signal device outputs a standard set density value signal.

More preferably, the signal value of the standard set density value signal is a standard set density value, and the standard set density value is a gas density value corresponding to a preset situation when the simulation check signal unit should generate the simulation check signal. In other words: the standard set density value is the density value when the simulation check signal unit should generate the simulation check signal, and the density value is set in advance according to the corresponding gas density relay simulation check requirements. That is, in an ideal state, when the gas density value reaches the standard set density value, the simulation check signal unit should generate the simulation check signal.

More preferably, the signal value of the standard set pressure value signal is a standard set pressure value, and the standard set pressure value is a pressure value corresponding to a preset situation when the simulation check signal unit should generate the simulation check signal. In other words: the standard set pressure value is the pressure value when the simulation check signal unit should generate the simulation check signal, and the pressure value is set in advance according to the corresponding gas density relay simulation check requirements. That is, in an ideal state, when the gas pressure value reaches the standard set pressure value, the simulation check signal unit should generate the simulation check signal.

More preferably, the signal value of the standard set temperature value signal is a standard set temperature value, and the standard set temperature is a temperature value corresponding to a preset situation when the simulation check signal unit should generate the simulation check signal. In other words: the standard set temperature value is the temperature value when the simulation check signal unit should generate the simulation check signal, and the temperature value is set in advance according to the corresponding gas density relay simulation check requirements. That is, in an ideal state, when the gas temperature value reaches the standard set temperature value, the simulation check signal unit should generate the simulation check signal.

More preferably, the simulation reference signal device includes one or more of a micro switch, an electric contact, a mercury switch, a photoelectric switch, a reed switch, a proximity switch, an electronic switch, a photoelectric sensor, a variable resistor and a voltage or current measuring device.

In a preferred embodiment of the present application, the simulation reference signal unit of the present application may include a pressure sensor, and/or a temperature sensor, as well as a simulation reference signal device, a second pressure detection element and/or a second temperature compensation element.

In a preferred embodiment of the present application, the simulation reference signal unit may only include a simulation reference signal device, a second pressure detection element and/or a second temperature compensation element; the simulation reference signal unit is configured to output two standard set values through the simulation reference signal device: a first standard set value when a first simulation reference signal is output, and a second standard set value when a second simulation reference signal is output; the set simulation check signal value is a corresponding temperature value or pressure value or gas density value when a preset simulation check signal is output; the set simulation check signal value is between the first standard set value and the second standard set value; when the simulation check signal actually output by the simulation check signal unit, and the first simulation reference signal and the second simulation reference signal output by the simulation reference signal unit are output according to a preset sequence, it is determined that the difference value between the pressure value and/or temperature value and/or gas density value when the simulation check signal unit actually outputs the simulation check signal and the preset standard value, and a preset standard value corresponding thereto is within the preset threshold.

Preferably, the simulation reference signal unit is configured to output two standard set density value signals through the simulation reference signal device: a first standard set density value signal and a second standard set density value signal; the signal value of the first standard set density value signal is an upper tolerance required value of the corresponding set simulation check signal value; the signal value of the second standard set density value signal is a lower tolerance required value of the corresponding set simulation check signal; and when the simulation check signal actually output by the simulation check signal unit, and the first standard set density value signal and the second standard set density value signal output by the simulation reference signal are output according to a preset sequence, it is determined that the difference value between the gas density value when the simulation check signal unit actually outputs the simulation check signal and the preset standard value, and a preset standard value corresponding thereto is within the preset threshold.

Preferably, the driving contact action mechanism is a temperature adjusting mechanism, and the temperature adjusting mechanism is a heating element; or, the temperature adjusting mechanism includes a heating element, a heat insulation part, a temperature controller, a temperature detector, and a temperature adjusting mechanism outer housing; or, the temperature adjusting mechanism includes a heating element and a temperature controller; or, the temperature adjusting mechanism includes a heating element, a heating power adjuster and a temperature controller; or, the temperature adjusting mechanism includes a heating element, a refrigeration element, a heating power adjuster and a temperature controller; or, the temperature adjusting mechanism includes a heating element, a heating power adjuster, and a thermostatic controller; or, the temperature adjusting mechanism includes a heating element, a temperature controller and a temperature detector; or, the temperature adjusting mechanism includes a miniature thermostat.

More preferably, the heating element is arranged close to the temperature compensation element.

More preferably, the number of the heating element is at least one, and the heating element includes one of a silicon rubber heater, a resistance wire, an electric heating tape, an electric heating rod, a hot-air blower, an infrared ray heating device, and a semiconductor.

More preferably, the temperature controller is connected to the heating element and used to control a heating temperature of the heating element, and the temperature controller includes one of a PID controller, a controller combining PID and fuzzy control, a variable-frequency controller, and a PLC controller.

Preferably, the driving contact action mechanism is a pressure adjusting mechanism, the pressure adjusting mechanism is a cavity with an opening at one end, and the other end of the cavity communicates with an internal gas chamber of the housing of the gas density relay body; the cavity is internally provided with a piston, one end of the piston is connected to a adjusting rod, the outer end of the adjusting rod is connected to a drive part, the other end of the piston extends into the opening and is in sealed contact with the inner wall of the cavity, and the adjusting rod is driven by the drive part to drive the piston to move in the cavity; or the pressure adjusting mechanism is a sealing gas chamber, the sealing gas chamber communicates with an internal gas chamber of the housing of the gas density relay body, the sealing gas chamber is internally provided with a piston, the piston is in sealed contact with the inner wall of the sealing gas chamber, a drive part is arranged outside the sealing gas chamber, and the drive part pushes the piston through an electromagnetic force to move in the cavity; or, the pressure adjusting mechanism is an airbag of which one end is connected to a drive part, the airbag has volume changes under the driving of the drive part, and the airbag communicates with the internal gas chamber of the housing of the gas density relay body; or the pressure adjusting mechanism is a bellow, one end of the bellow communicates with the internal gas chamber of the housing of the gas density relay body, and the other end of the bellow extends and withdraws under the driving of the drive part.

Preferably, the driving contact action mechanism includes a force application mechanism and a motion mechanism, the force application mechanism includes a drive part and a force transmission part driven by the drive part, the motion mechanism includes a push rod, and the push rod is driven by the force application mechanism to move apply an action force to the gas density relay body and directly or indirectly make the signal action mechanism produce displacement, thereby triggering the signal generator to generate an alarm and/or locking contact signal action.

More preferably, the force transmission part includes one of a cam, a connecting rod, a spring, a metal part, a non-metal part, an expansion part and a non-expansion part.

The above-mentioned drive part includes one of a magnetic drive mechanism, a gravity, a motor (such as electric push rod motor or stepping motor), a reciprocating motion mechanism, a Carnot cycle mechanism, an air compressor, a compressor, an air release valve, a pressure making pump, a booster pump, a booster valve, an electric air pump, an electromagnetic air pump, a pneumatic element, a magnetic coupling thrust mechanism, a mechanism generating thrust with heating, a mechanism generating thrust with electrical heating, and a mechanism generating thrust with chemical reaction.

Preferably, the gas density relay (or gas density monitoring apparatus) further includes: an online check contact signal sampling unit, and the online check contact signal sampling unit is respectively connected to the signal generator and the intelligent control unit of the gas density relay body and is configured to sample the alarm and/or the locking contact signal of the gas density relay body.

More preferably, the online check contact signal sampling unit includes an isolation sampling element, and the isolation sampling element is controlled by a driving contact action mechanism or an intelligent control unit; in a non-check state, the online check contact signal sampling unit is relatively isolated on from a contact signal of the gas density relay body on the circuit by means of the isolation sampling element; and in a check state, the online check contact signal sampling unit cuts off a contact signal control loop of the gas density relay body by means of isolation sampling element and connect the contact of the gas density relay body with the intelligent control unit, where the isolation sampling element includes one of a travel switch, a micro switch, a button, an electric switch, a displacement switch, an electromagnetic relay, an optocoupler, and a silicon controlled rectifier.

Further, the online check contact signal sampling unit includes a first connection circuit and a second connection circuit, the first connection circuit is connected to the contact of the gas density relay body and the contact signal control loop, and the second connection circuit is connected to the contact of the gas density relay body and the intelligent control unit; in the non-check state, the second connection circuit is disconnected, and the first connection circuit is closed; in the check state, the online calibration check contact signal sampling unit cuts off the first connection circuit, communicates with the second connection circuit, and connects the contact of the gas density relay body to the intelligent control unit.

More preferably, the gas density relay (or gas density monitoring apparatus) further includes: a multi-way connector; and the gas density relay body, the simulation reference signal unit, the online check contact signal sampling unit, and one or more of the intelligent control units are arranged on the multi-way connector.

Preferably, control of the intelligent control unit is realized in the field, and/or realized through the background.

Preferably, the intelligent control unit obtains the gas density value collected by the simulation reference signal unit; or, the intelligent control unit obtains the pressure value and temperature value collected by the simulation reference signal unit to complete online monitoring of the gas density of the monitored electrical equipment by the gas density relay.

Preferably, the intelligent control unit automatically controls the whole check process, including all peripherals, logic, input and output, based on an embedded system built-in algorithm and control program of the microprocessor.

More preferably, the intelligent control unit automatically controls a whole check process which includes all peripherals, logic, input and output, based on built-in algorithms and control programs of a general-purpose computer, an industrial control computer, an ARM chip, an AI chip, a CPU, a MCU, a FPGA, a PLC, an industrial control main board, an embedded master control board, etc.

Preferably, the intelligent control unit is provided with an electrical interface, and the electrical interface completes test data storage, and/or test data export, and/or test data printing, and/or data communication with an upper computer, and/or analog quantity and digital quantity information inputting.

More preferably, the gas density relay (or gas density monitoring apparatus) supports basic information input, and the basic information includes one or more of a manufacturing number, an accuracy requirement, a rated parameter, a manufacturer, and an operating position.

Preferably, the intelligent control unit further includes a communication module that realizes long-distance transmission of test data and/or check results.

More preferably, the communication mode of the communication module is wired communication or wireless communication.

More preferably, the wired communication mode includes but is not limited to one or more of an RS232 bus, an RS422 bus, an RS485 bus, a CAN-BUS, 4-20 mA, Hart, IIC, SPI, Wire, a coaxial cable, a PLC power carrier, and a cable.

Further, the wireless communication mode includes but is not limited to one or more of NB-IOT, 2G/3G/4G/5G, WIFI, Bluetooth, Lora, Lorawan, Zigbee, infrared, ultrasonic wave, sound wave, satellite, light wave, quantum communication, and sonar.

Preferably, the gas density relay body further includes: a base and an end base that are arranged in the housing; the pressure detection element is a Bourdon tube filled with a sealing gas, one end of the Bourdon tube is fixed on the base and communicate with the base, the other end of the Bourdon tube is connected to one end of the temperature compensation element through the end base, and the other end of the temperature compensation element is provided with the signal action mechanism; the signal action mechanism is provided with a adjusting screw or a triggering part for pushing the signal generator to switch on or off the contact of the signal generator; and the gas density relay body outputs an alarm and a locking contact signal through the signal generator.

Preferably, the gas density relay body includes a first bellow arranged in the housing and serving as a pressure detection element, and further includes a second bellow, where a first open end of the first bellow is fixed to the inner wall of the first bellow, a second open end of the first bellow is in sealed connection with a first sealing part, a first sealing gas chamber is surrounded jointly the inner wall of the first bellow, the first sealing part and the inner wall of the housing, and the first sealing gas chamber is provided with an interface communicating with insulating gas of electrical equipment; a first open end of the second bellow is in sealing connection with the first sealing part, a second open port of the second bellow is connected to the inner wall of the housing through a second sealing part, a second sealing gas chamber is surrounded jointly by the outer wall of the first bellow, the first sealing part, the outer wall of the second bellow, the second sealing part and the inner wall of the housing, and the second sealing gas chamber is filled with a standard compensation gas to form a temperature compensation element; and a third gas chamber is surrounded jointly by the inner wall of the second bellow, the second sealing part and the inner wall of the housing, the signal generator and the signal action mechanism are arranged in the third gas chamber, the signal action mechanism is connected to the first sealing part, and the signal generator is arranged corresponding to the signal action mechanism.

More preferably, the outer diameter of the first bellow is greater than the outer diameter of the second bellow.

More preferably, the signal action mechanism includes a moving rod; one end of the moving rod extends into the second bellow, is connected to the first sealing part, and is displaced with the deformation of the first bellow; the other end of the moving rod extends out of the second bellow, and is fixedly connected to an adjusting and fixing part; and the adjusting and fixing part is provided with an adjusting screw or a triggering part, and the adjusting screw or the triggering part is used to trigger the signal generator under the pushing force of the moving rod.

Preferably, a display mechanism for displaying a density of the insulating gas is further arranged on the housing of the gas density relay body.

More preferably, the display mechanism includes: a connection rod, a core, a pointer, and a dial, where the core is connected to the signal action mechanism or the temperature compensation element through the connection rod, the pointer is mounted on the core and arranged in front of the dial, and the gas density value is displayed through combination of the pointer and the dial.

More preferably, the display mechanism includes a liquid crystal and/or a digital tube.

More preferably, the display mechanism includes a display pressure detection element, a display temperature compensation element, a display end base, a core, a pointer, a dial, and a display base, where one end of the display pressure detection element and one end of the display temperature compensation element are fixed on the display end base, the other end of the display pressure detection element is fixed on the display base and communicates with the display base, the display base communicates with the pressure detection element of the gas density relay body through a gas tube, the other end of the display temperature compensation element is connected to the core, and the pointer is mounted on the core and arranged in front of the dial.

Further, the display pressure detection element includes a Bourdon tube or bellow filled with sealing gas; and the display temperature compensation element adopts a temperature compensation sheet or a gas enclosed in the housing.

Further, the diagnostic sensor is arranged on the core, or on the pointer, or on the connection rod.

Preferably, at least two of the gas density relays (or gas density monitoring apparatuses) are sequentially connected with a remote background detection system through a hub and a protocol converter; where the gas density relays (or gas density monitoring apparatuses) are arranged on electrical equipment with corresponding gas chambers.

More preferably, a RS485 hub is adopted as the hub.

More preferably, an IEC61850 protocol converter or an IEC104 protocol converter is adopted as the protocol converter.

Preferably, the gas density relay body includes, but is not limited to, a gas density relay compensated by a bimetallic sheet, a gas density relay compensated by gas, and a gas density relay with mixed compensation of a bimetallic sheet and gas; a fully-mechanical gas density relay, a digital gas density relay, and a mechanical-digital-combined gas density relay; a gas density relay with pointer display, a digital-display gas density relay, and a gas density switch without display or indication; and a SF6 gas density relay, a SF6 mixed gas density relay, and a N2 gas density relay.

A third aspect of the present application provides a simulation check method of a gas density relay having a simulation check function, including:

precision measurement, where the precision measurement adopts any one or more of A)-C):

A) monitoring a pressure change value or a temperature change value or a gas density change value in the gas density relay body by a simulation reference signal unit; collecting, by a simulation check signal unit, one or more of the deformation quantity of a part subjected to deformation and the displacement quantity of a part subjected to displacement in the change value interval when pressure or temperature or gas density in the gas density relay body changes; determining whether a difference value between the deformation quantity of the part subjected to deformation and/or the displacement quantity of the part subjected to displacement when pressure or temperature or gas density in the gas density relay body changes and a preset standard value, and a preset standard value corresponding thereto is within a preset threshold;

B) collecting a pressure value or a temperature value or a gas density value in the gas density relay body by the simulation reference signal unit; detecting, by the simulation check signal unit, one or more of a deformation state signal of a part subjected to deformation or a position signal of a part subjected to displacement due to pressure change or temperature change or gas density change in the gas density relay body; determining whether a difference value between the deformation state of the part subjected to deformation and/or the position of the part subjected to displacement corresponding to a set pressure value or temperature value or gas density value in the gas density relay body and a preset standard value, and a preset standard value corresponding thereto is within a preset threshold; and C) outputting a simulation check signal by the simulation check signal unit when any one or more of pressure, temperature and gas density in the gas density relay body changes; monitoring one or more of a pressure value, a temperature value and a gas density value in the gas density relay body by the simulation reference signal unit when the simulation check signal is output; determining whether a difference value between the pressure value and/or the temperature value and/or the gas density value and a preset standard value, and a preset standard value corresponding thereto is within a preset threshold.

Preferably, the determination may be performed by the intelligent control unit of the use terminal, or may be performed by sending the value collected by the intelligent unit to the background.

Preferably, the simulation check signal unit includes at least one diagnostic sensor, the diagnostic sensor is arranged in a housing of the gas density relay body, and the simulation check signal unit detects one or more of the deformation state and the deformation quantity of the part subjected to deformation and the position and the displacement quantity of the part subjected to displacement due to the pressure change or temperature change or gas density change in the gas density relay body through the diagnostic sensor; and the intelligent unit receives data and/or signals collected by the simulation check signal unit, and determines whether the current working state of the pressure detection element and/or the temperature compensation element and/or the signal action mechanism of the gas density relay body is normal by determining whether a difference value between the deformation state and/or the deformation quantity and/or the displacement quantity, and a preset standard value corresponding thereto is within a preset threshold.

More preferably, the diagnostic sensor detects the deformation quantity of the temperature compensation element relative to the overall dimension at 20° C., and the intelligent control unit determines whether the deformation quantity is within a preset threshold, and if the deformation quantity is within the preset threshold, the current working state of the temperature compensation element is a normal working state, otherwise, the current working state of the temperature compensation element is an abnormal working state; or, a corresponding relationship between a temperature change value $\Delta T$ of each historically detected environmental temperature T relative to 20° C. and a corresponding preset standard value of the deformation quantity $\Delta L$ of the temperature compensation element is generated into a data table in advance; and the intelligent control unit calculates a difference value between the deformation quantity of the temperature compensation element detected by the diagnostic sensor under the current temperature change and the corresponding preset standard value obtained by querying the data table, that is, an error, and determines whether the error is within a preset threshold, if the error is within the preset threshold, the current working state of the temperature compensation element is a normal working state, otherwise, the current working state of the temperature compensation element is an abnormal working state, where $\Delta T=|T-20|°$ C., $\Delta L=|LT-L20|$, LT is the overall dimension corresponding to the temperature compensation element at an ambient temperature T, and L20 is the overall dimension corresponding to the temperature compensation element at 20° C.

More preferably, the diagnostic sensor detects the position of the temperature compensation element under a set gas density value, and the intelligent control unit determines whether the position is within a preset threshold, and if the position is within the preset threshold, the current working state of the temperature compensation element is a normal working state, otherwise, the current working state of the temperature compensation element is an abnormal working state; or, a corresponding relationship between each historically detected gas density value and a corresponding preset standard value of the position of the temperature compensation element is generated into a data table in advance; and the intelligent control unit calculates a difference value between the position of the temperature compensation element detected by the diagnostic sensor under the current gas density and the corresponding preset standard value obtained by querying the data table, that is, an error, and determines whether the error is within a preset threshold, if the error is within the preset threshold, the current working state of the temperature compensation element is a normal working state, otherwise, the current working state of the temperature compensation element is an abnormal working state; or, the diagnostic sensor detects the displacement quantity of the temperature compensation element when the gas density changes, and the intelligent control unit determines whether the displacement quantity is within a preset threshold, and if the displacement quantity is within the preset threshold, the current working state of the temperature compensation element is a normal working state, otherwise, the current working state of the temperature compensation element is an abnormal working state; or, a corresponding relationship between each historically detected gas density change value and a corresponding preset standard value of the displacement quantity of the temperature compensation element is generated into a data table in advance; and the intelligent control unit calculates a difference value between the displacement quantity of the temperature compensation element detected by the diagnostic sensor under the current gas density change and the corresponding preset standard value obtained by querying the data table, that is, an error, and determines whether the error is within a preset threshold, if the error is within the preset threshold, the current working state of the temperature compensation element is a normal working state, otherwise, the current working state of the temperature compensation element is an abnormal working state.

More preferably, the diagnostic sensor detects the position of the pressure detection element under a set gas pressure value, and the intelligent control unit determines whether the position is within a preset threshold, and if the position is within the preset threshold, the current working state of the pressure detection element is a normal working state, otherwise, the current working state of the pressure detection element is an abnormal working state; or, a corresponding relationship between each historically detected gas pressure value and a corresponding preset standard value of the position of the pressure detection element is generated into a data table in advance; and the intelligent control unit calculates a difference value between the position of the pressure detection element detected by the diagnostic sensor under the current gas pressure and the corresponding preset standard value obtained by querying the data table, that is, an error, and determines whether the error is within a preset threshold, if the error is within the preset threshold, the current working state of the pressure detection element is a normal working state, otherwise, the current working state of the pressure detection element is an abnormal working state; or, the diagnostic sensor detects the displacement quantity of the pressure detection element when the gas Pressure changes, and the intelligent control unit determines whether the displacement quantity is within a preset threshold, and if the displacement quantity is within the preset threshold, the current working state of the pressure detection element is a normal working state, otherwise, the current working state of the pressure detection element is an abnormal working state; or, a corresponding relationship between each historically detected gas pressure change value and a corresponding preset standard value of the displacement quantity of the pressure detection element is generated into a data table in advance; and the intelligent control unit calculates a difference value between the displacement quantity of the pressure detection element detected by the diagnostic sensor under the current gas pressure change and the corresponding preset standard value obtained by querying the data table, that is, an error, and determines whether the error is within a preset threshold, if the error is within the preset threshold, the current working state of the pressure detection element is a normal working state, otherwise, the current working state of the pressure detection element is an abnormal working state.

More preferably, the diagnostic sensor detects the position of the signal action mechanism under a set gas density value, and the intelligent control unit determines whether the position is within a preset threshold, and if the position is within the preset threshold, the current working state of the signal action mechanism is a normal working state, otherwise, the current working state of the signal action mechanism is an abnormal working state; or, a corresponding relationship between each historically detected gas density value and a corresponding preset standard value of the position of the signal action mechanism is generated into a data table in advance; and the intelligent control unit calculates a difference value between the position of the signal action mechanism detected by the diagnostic sensor under the current gas density and the corresponding preset standard value obtained by querying the data table, that is, an error, and determines whether the error is within a preset threshold, if the error is within the preset threshold, the current working state of the signal action mechanism is a normal working state, otherwise, the current working state of the signal action mechanism is an abnormal working state; or, the diagnostic sensor detects the displacement quantity of the signal action mechanism when the gas density value changes, and the intelligent control unit determines whether the displacement quantity is within a preset threshold, and if the displacement quantity is within the preset threshold, the current working state of the signal action mechanism is a normal working state, otherwise, the current working state of the signal action mechanism is an abnormal working state; or, a corresponding relationship between each historically detected gas density change value and a corresponding preset standard value of the displacement quantity of the signal action mechanism is generated into a data table in advance; and the intelligent control unit calculates a difference value between the displacement quantity of the signal action mechanism detected by the diagnostic sensor under the current gas density change and the corresponding preset standard value obtained by querying the data table, that is, an error, and determines whether the error is within a preset threshold, if the error is within the preset threshold, the current working state of the signal action mechanism is a normal working state, otherwise, the current working state of the signal action mechanism is an abnormal working state.

Preferably, the simulation check signal unit includes a simulation signal device, the simulation signal device is arranged in the housing of the gas density relay body, and the simulation check signal unit outputs a simulation check signal by triggering the contact action or signal change of the simulation signal device when gas pressure monitored by the pressure detection element changes, and/or gas density monitored by the pressure detection element and the temperature compensation element changes, and/or gas temperature monitored by the temperature compensation element changes; and the intelligent control unit compares the pressure value and/or the temperature value and/or the gas density value with the corresponding preset standard value to diagnose whether the current working state of the pressure detection element and/or the temperature compensation element and/or the signal action mechanism of the gas density relay body is normal.

Preferably, the intelligent control unit controls the driving contact action mechanism, the driving contact action mechanism applies an external force to the signal action mechanism of the gas density relay body through temperature adjustment or pressure adjustment or directly or indirectly, so that the gas pressure monitored by the pressure detection element of the gas density relay body changes, or the gas temperature monitored by the temperature compensation element changes, or the gas density monitored by the pressure detection element and the temperature compensation element changes.

Preferably, the simulation reference signal unit includes a simulation reference signal device, and further includes a second pressure detection element and a second temperature compensation element; when the gas density in the gas density relay body monitored by the pressure detection element and the temperature compensation element changes, the gas density in the gas density relay body monitored by the second pressure detection element and the second temperature compensation element changes at the same time, the simulation check signal unit outputs a simulation check signal; the simulation check signal unit outputs a standard set density value signal by triggering the contact action or signal change of the simulation reference signal device when the gas density reaches a standard set density value; the intelligent control unit receives data and/or signals collected by the simulation reference signal unit, and compares the corresponding gas density value when the simulation check signal unit outputs the simulation check signal with the corresponding gas density value when the simulation reference signal unit outputs the standard set density value signal; and if the difference value between the two gas density values is within the preset threshold, the current working state of the gas density relay body is a normal working state, otherwise, the current working state of the gas density relay body is an abnormal working state; or, Preferably, the simulation reference signal unit includes a simulation reference signal device, and further includes a second pressure detection element; when gas pressure in the gas density relay body monitored by the pressure detection element changes, the gas pressure in the gas density relay body monitored by the second pressure detection element changes at the same time, the simulation check signal unit outputs a simulation check signal; the simulation check signal unit outputs a standard set pressure value signal by triggering the contact action or signal change of the simulation reference signal device when the gas pressure reaches a standard set pressure value; the intelligent control unit receives data and/or signals collected by the simulation reference signal unit, and compares the corresponding gas pressure value when the simulation check signal unit outputs the simulation check signal with the corresponding gas pressure value when the simulation reference signal unit outputs the standard set pressure value signal; and if the difference value between the two gas pressure values is within the preset threshold, the current working state of the gas density relay body is a normal working state, otherwise, the current working state of the gas density relay body is an abnormal working state; or, the simulation reference signal unit includes a simulation reference signal device, and further includes a second temperature compensation element; when the gas temperature in the gas density relay body monitored by the temperature compensation element changes, the gas temperature in the gas density relay body monitored by the second temperature compensation element changes at the same time, the simulation check signal unit outputs a simulation check signal when the gas temperature reaches to a standard set temperature value, and the simulation reference signal unit outputs a standard set temperature value signal by triggering the contact action or signal change of the simulation reference signal device; the intelligent control unit receives data and/or signals collected by the simulation reference signal unit, and compares the corresponding gas temperature value when the simulation check signal unit outputs the simulation check signal with the corresponding gas temperature value when the simulation reference signal unit outputs the standard set temperature value signal; and if the difference value between the two gas temperature values is within the preset threshold, the current working state of the gas density relay body is a normal working state, otherwise, the current working state of the gas density relay body is an abnormal working state.

Preferably, the simulation reference signal unit includes a simulation reference signal device, a second pressure detection element and/or a second temperature compensation element; the simulation reference signal unit outputs two standard set values through the simulation reference signal device: a first standard set value when a first simulation reference signal is output, and a second standard set value when a second simulation reference signal is output; the set simulation check signal value is a corresponding preset temperature value or pressure value or gas density value when a preset simulation check signal is output; and the set simulation check signal value is between the first standard set value and the second standard set value. The simulation check method includes:

when the simulation check signal actually output by the simulation check signal unit, and the first simulation reference signal and the second simulation reference signal output by the simulation reference signal unit are output according to a preset sequence, the intelligent control unit determines that the difference value between the pressure value and/or temperature value and/or gas density value when the simulation check signal unit actually outputs the simulation check signal and the preset standard value, and a preset standard value corresponding thereto is within the preset threshold, the current working state of the gas density relay body is a normal working state, otherwise, the current working state of the gas density relay body is an abnormal working state.

More preferably, the simulation reference signal unit outputs two standard set density value signals through the simulation reference signal device: a first standard set density value signal and a second standard set density value signal; the signal value of the first standard set density value signal is an upper tolerance required value of the corresponding set simulation check signal value; the signal value of the second standard set density value signal is a lower tolerance required value of the corresponding set simulation check signal;

the intelligent control unit monitors the actual output sequence of the first standard set density value signal, the second standard set density value signal and the simulation check signal; and if the monitored sequence is: the actual output of the simulation check signal is between the output of the first standard set density value signal and the output of the second standard set density value signal, the intelligent control unit determines that the difference value between the gas density value when the simulation check signal unit actually outputs the simulation check signal and a preset standard value corresponding thereto is within a preset threshold, and the current working state of the gas density relay body is a normal working state, otherwise, the current working state of the gas density relay body is an abnormal working state.

Preferably, the gas density relay (or gas density monitoring apparatus) further includes an online check contact signal sampling unit, and the online check contact signal sampling unit is respectively connected to the signal generator and the intelligent control unit of the gas density relay body and is configured to sample the alarm and/or the locking contact signal of the gas density relay body. The simulation check method further includes:

in the gas density relay (or the gas density monitoring apparatus), according to the set simulation check time and/or the simulation check instruction, and the situation of the gas density value and/or the situation of the temperature value, and in the situation of allowing and/or being possible to perform simulation check on the gas density relay body:

the intelligent control unit adjusts the online check contact signal sampling unit to a simulation or virtual check state, and in the simulation or virtual check state, the online check contact signal sampling unit cuts off a control loop of the contact signal of the gas density relay body to connect the contact of the gas density relay body to the intelligent control unit;

the intelligent control unit controls a driving contact action mechanism, the driving contact action mechanism applies an external force to a signal action mechanism through temperature adjustment or pressure adjustment or directly or indirectly, so that the gas density relay body generates an alarm and/or a locking contact signal action; the intelligent control unit obtains the gas density value according to the pressure value and the temperature value during contact action, or directly obtains the gas density value, and detects a contact signal action value and/or a contact signal return value of the gas density relay body so as to complete online simulation or virtual check of the gas density relay body; and after all the contact signal check work is completed, the intelligent control unit restores the driving contact action mechanism, and adjusts the online check contact signal sampling unit to the working state, and the contact signal control loop of the gas density relay body restores the normal working state.

More preferably, after the contact signal action value and/or the contact signal return value of the gas density relay body is detected, the intelligent control unit respectively compares the contact signal action value and/or the contact signal return value with the corresponding preset standard value at the same temperature; and if the difference value between the contact signal action value and/or the contact signal return value and the corresponding preset standard value at the same temperature, the current working state of the gas density relay body is a normal working state, otherwise, the current working state of the gas density relay body is an abnormal working state; or, the intelligent control unit respectively compares the contact signal action value and/or the contact signal return value with the historical detection values at the same temperature, and a difference value therebetween is within a preset threshold value, the current working state of the gas density relay body is a normal working state, otherwise, the current working state of the gas density relay body is an abnormal working state; or, the intelligent control unit compares the contact signal action value and/or the contact signal return value with an allowable value corresponding to the temperature value during simulation check; and if the difference value between the contact signal action value and/or the contact signal return value and the allowable value corresponding to the temperature value during simulation check is in an allowable error range, the current working state of the gas density relay body is a normal working state, otherwise, the current working state of the gas density relay body is an abnormal working state.

Preferably, when the current working state of the gas density relay body is the abnormal working state, the intelligent control unit outputs a corresponding abnormal alarm contact signal; and preferably, the abnormal alarm contact signal is uploaded to target equipment through an alarm signal line.

Compared with the prior art, technical solutions in the invention have the following beneficial effects:

1) a gas density relay having a simulation check function is provided, which is used to monitor the gas density of gas-insulating or arc-extinguishing electrical equipment, and at the same time, complete online simulation or virtual check of the gas density relay, thereby improving efficiency, reducing operation and maintenance cost and ensuring safe operation of a power grid.

2) A simulation check method of a gas density relay having a simulation check function is provided, so that the normal operation of the gas density relay having the simulation check function can be supported.

3) The present application realizes maintenance-free for the gas density relay so as to the intelligent management of the whole life cycle of the gas density relay: the gas density relay is repaired only if there is a problem, and no maintenance service if there is no problem.

BRIEF DESCRIPTION OF DRAWINGS

The drawings, which form a part of the application, are used to provide a further understanding of the application, and the illustrative embodiments and descriptions of the application are used to explain the application, and do not constitute undue restrictions on the application. In the drawings.

DETAILED DESCRIPTION

In order to make a purpose, a technical solution and effects of the present invention more clear and definite, the present invention is further described in detail below with reference to the drawings and examples. It should be understood that the specific embodiments described herein are merely intended to explain the present invention, rather than to limit the present invention.

Embodiment 1

Figure 1:
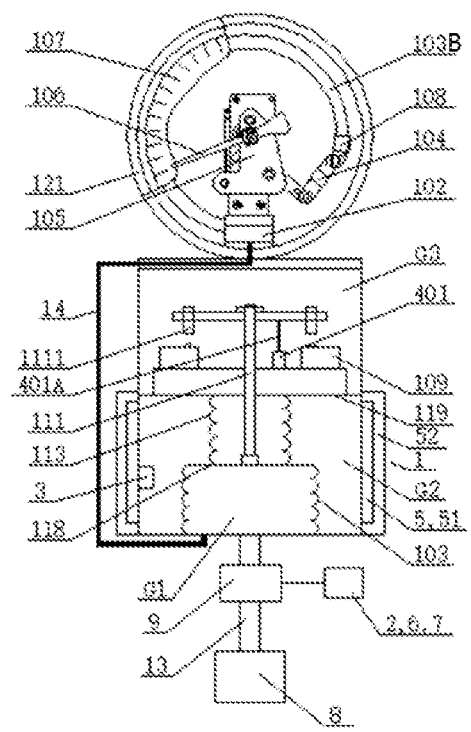
FIG. 1 is a schematic structural diagram of a gas density relay (or gas density monitoring apparatus) applied to high-voltage and medium-voltage electrical equipment and having a simulation check function according to Embodiment 1.

As shown in FIG. 1, a gas density relay (or gas density monitoring apparatus) having a simulation or virtual check function in Embodiment 1 of the present invention includes: a gas density relay body 1, a simulation reference signal unit (formed by a pressure sensor 2 and a temperature sensor 3), a driving contact action mechanism, an online check contact signal sampling unit 6, an intelligent control unit 7, a simulation check signal unit, a multi-way connector 9 and an electrical equipment connector 13. The gas density relay body 1, the pressure sensor 2, the online check contact signal sampling unit 6 and the intelligent control unit 7 are arranged on the multi-way connector 9. The driving contact action mechanism is a temperature adjusting mechanism 5, the temperature adjusting mechanism 5 includes a heating element 51 and a heat insulation part 52, and the temperature sensor 3, the heating element 51 and the heat insulation part 2 are respectively arranged on the density relay body 1. The intelligent control unit 7 is respectively connected to the simulation reference signal unit (formed by the pressure sensor 2 and the temperature sensor 3), the driving contact action mechanism, the online check contact signal sampling unit 6 and the simulation check signal unit.

The specific implementation process is: the gas density relay body 1 includes a housing, and a first bellow tube 103 (that is, a pressure detection element), a second bellow 113, a signal generator 109 (a micro switch in this embodiment) and a signal action mechanism 111 that are located in the housing. A first open end of the first bellow 103 is fixed on an inner wall of the housing, a second open end of the first bellow 103 is connected with a first sealing part 118 in a sealed manner, an inner wall of the first bellow 103, the first sealing part 118, and the inner wall of the housing form a first sealing gas chamber G1 in an encircling manner, and the pressure sensor 2 is communicated with the first sealing gas chamber G1. The first sealing gas chamber G1 is communicated with insulating gas of the electrical equipment 8 through the multi-way connector 9 and the connector 13 for the electrical equipment. A first open end of the second bellow 113 is in sealed connection with the first sealing part 118; a second open port of the second bellow 113 is connected to an inner wall of the housing through a second sealing part 119; a second sealing gas chamber G2 is surrounded jointly by an outer wall of the first bellow 103, the first sealing part 118, an outer wall of the second bellow 113, the second sealing part 119 and the inner wall of the housing; and the second sealing gas chamber G2 is filled with a standard compensation gas with a density value being P20BC, that is, the second sealing gas chamber G2 is a temperature compensation standard gas chamber and forms a temperature compensation element. One cavity G3 (the cavity G3 may be semi-open or closed) is surrounded jointly by the inner wall of the second bellow 113, the second sealing part 119 and the inner wall of the housing. The signal action mechanism 111 and the signal generator 109 are arranged in the cavity G3. The working principle of the gas density relay is: the signal action mechanism 111 is connected to the first sealing part 118, the signal generator 109 is arranged corresponding to the signal action mechanism 111, and the gas density relay body 1 outputs a contact signal through the signal generator 109. In this embodiment, the signal action mechanism 111 includes a moving rod; one end of the moving rod extends into the second bellow 113, is fixedly connected to the first sealing part 118, and is displaced with the deformation of the first bellow 103; and the other end of the moving rod extends out of the second bellow 113, and is fixedly connected to a adjusting and fixing part (such as a cross rod or a plate part); and the adjusting and fixing part is provided with a adjusting screw 1111, and the adjusting screw 1111 is arranged corresponding to the signal generator 109. The gas density relay body 1 monitors the gas density through the first sealing gas chamber G1 and the second sealing gas chamber G2, and is combined with the signal generator 109 to monitor the gas density. When the gas density is lower than and/or higher than the set gas density, an alarm and/or a locking contact signal are output through the signal generator 109.

In this example, a display mechanism is further included. The display mechanism is arranged relatively independently. The display mechanism includes: a display base 102, a display end base 108, a display pressure detection element (Bourdon tube) 103B, a display temperature compensation element 104, a core 105, a pointer 106 and a dial 107. One end of the display pressure detection element (Bourdon tube) 103B is fixed on and communicates with the display base 102, and communicates with a first gas chamber G1 through a gas tube 14; the other end of the display pressure detection element (Bourdon tube) 103B is connected to one end of the temperature compensation element 104 through the display end base 108; the core 105 is fixed on the display end base 102; the other end of the display temperature compensation element 104 is connected to the core 105 through a connection rod or is directly connected to the core 105; and the pointer 106 is mounted on the core 105 and arranged in front of the dial 107, and the pointer 106 is combined with the dial 107 to display the gas density value.

In this example, the simulation check signal unit is a diagnostic sensor 401 (displacement sensor or position sensor), and the simulation check signal generated by the simulation check signal unit is a corresponding position signal and/or displacement quantity signal of the signal action mechanism 111 collected by the diagnostic sensor 401 and used to diagnose the current working state of the gas density relay body 1. The simulation check semaphore may be a digital quantity, or an analog quantity, even a switch quantity. The diagnostic sensor 401 is arranged below the signal action mechanism 111 and opposite to the signal action mechanism 111, may be in contact or associated with the signal action mechanism 111 through a contact part 401A, or may be directly connected to the signal action mechanism 111. The working principle is: the intelligent control unit 7 obtains a gas pressure value P and a temperature value T through the simulation reference signal unit (formed by the pressure sensor 2 and the temperature sensor 3) so as to calculate a gas density value P20 through software according to the gas characteristic. The diagnostic sensor 401 detects the corresponding position of the signal action mechanism 111 under the gas density value P20. Normally, for each gas density value P20, the signal action mechanism 111 corresponds to one corresponding position. If the corresponding position of the signal action mechanism 111 detected by the diagnostic sensor 401 is within the preset threshold, the current working state of the signal action mechanism 111 of the gas density relay (or gas density monitoring apparatus) is a normal working state, otherwise, the current working state of the signal action mechanism 111 of the gas density relay (or gas density monitoring apparatus) is an abnormal working state. Or, a density change value ΔP20 generated by the change of the gas density value P20 monitored by the simulation reference signal unit (pressure sensor 2 and temperature sensor 3) makes the signal action mechanism 111 generate corresponding displacement, the diagnostic sensor 401 detects the displacement quantity ΔS20; and if the displacement quantity ΔS20 is within the preset threshold, the current working state of the signal action mechanism 111 of the gas density relay (or gas density monitoring apparatus) is a normal working state, otherwise, the current working state of the signal action mechanism 111 of the gas density relay (or gas density monitoring apparatus) is an abnormal working state. Or, a corresponding relationship between each density change value monitored by the simulation reference signal unit (pressure sensor 2 and temperature sensor 3) and a corresponding preset standard value of the displacement quantity of the signal action mechanism 111 is designed into a data table in advance; the intelligent control unit 7 obtains the displacement quantity ΔS1 of the signal action mechanism 111 detected by the diagnostic sensor 401, queries a preset standard value ΔS2 corresponding to the current gas density change value in the data table, calculates a difference value |ΔS1−ΔS2| between the displacement quantity ΔS1 and the preset standard value ΔS2, that is, an error, and determines whether the error is within a preset threshold; and if the error is within the preset threshold, the current working state of the signal action mechanism 111 of the gas density relay (or gas density monitoring apparatus) is a normal working state, otherwise, the current working state of the signal action mechanism is an abnormal working state. That is, the intelligent control unit 7 performs determination according to the density value P20 collected at the same gas density and the corresponding position of the signal action mechanism 111 detected by the diagnostic sensor 401, and/or according to the density change value ΔP20 collected under the same gas density change and the corresponding displacement quantity of the signal action mechanism 111 detected by the diagnostic sensor 401, so as to obtain whether the current working state of a monitoring part of the gas density relay body 1 is normal.

The driving contact action mechanism is a temperature adjusting mechanism 5, and the temperature adjusting mechanism 5 includes a heating element 51 and a heat insulation part 52. The heating element 51 and the heat insulation part 52 are respectively arranged on the outer wall of the housing of the gas density relay body 1, that is, arranged outside the second sealing gas chamber G2. The temperature sensor 3 is arranged in the second sealing gas chamber G2. The temperature adjusting mechanism 5 is configured to regulate temperature rise and fall of the temperature compensation element 104 of the gas density relay body 1, so that the gas density relay body 1 generates contact signal action. Specifically, the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body to connect the contact of the gas density relay body 1 to the intelligent control unit 7; then, the intelligent control unit 7 controls heating of the heating element 51, so that the gas temperature in the second sealing gas chamber G2 rises; and the most important thing is that the first sealing gas chamber G1 communicates with the gas chamber of the electrical equipment, so that the gas pressure will not change within a certain time, the gas pressure balance between the first sealing gas chamber G1 and the second sealing gas chamber G2 is broken, and the first bellow 103 is deformed with the movement of the moving rod 111 to generate a certain displacement. When the temperature rises to a corresponding degree, the moving rod 111 downwards drives a adjusting screw 1111 to trigger a button of the signal generator 109, the signal generator 109 sends an alarm and a locking signal, and the alarm and the locking signal action are sensed by the intelligent control unit 7; and if the alarm and the locking signal can be acted and sensed (captured), it means that the execution mechanism of the contact and the contact are normally. Further, when the signal generator 109 sends out an alarm and a locking action signal, the intelligent control unit 7 detects the corresponding gas pressure value P and temperature T during action through the simulation reference signal unit (pressure sensor 2 and temperature sensor 3), so that the intelligent control unit 7 obtains a contact signal action value PDZ20 and/or a contact signal return value PFH20 of the gas density relay body 1 according to the gas characteristic, and respectively compares the contact signal action value PDZ20 and/or a contact signal return value PFH20 of the gas density relay body 1 with the corresponding preset standard value; and if the error between the contact signal action value PDZ20 and/or a contact signal return value PFH20 of the gas density relay body 1 and the corresponding preset standard value, the current working state of the gas density relay body 1 is a normal working state, otherwise, the current working state of the gas density relay body 1 is an abnormal working state. When the current working state of the gas density relay body 1 is the abnormal working state, the intelligent control unit 7 outputs a corresponding abnormal alarm contact signal; and preferably, the abnormal alarm contact signal is uploaded to target equipment through an alarm signal line. In this way, online simulation or virtual check of the gas density relay body 1 is realized conveniently. After all the contact signal check work is completed, the intelligent control unit 7 restores the driving contact action mechanism. In this example, the intelligent unit 7 turns off the heating element 51 through control to stop heating of the heating element 51.

For example, suppose that the rated parameters of the gas density relay described in this embodiment are: the rated pressure is 0.7 MPa, the alarm pressure is 0.62 MPa, the locking pressure is 0.6 MPa (absolute pressure), and the inflation pressure value of the used electrical equipment is 0.71 Mpa. During field operation, the intelligent control unit 7 obtains the gas pressure value P and temperature value T through the simulation reference signal unit (pressure sensor 2 and temperature sensor 3) within the temperature range of −20° C.~50° C., so that the gas density value P20=0.715 MPa (actually between 0.70 MPa and 0.72 MPa) is calculated through software according to the gas characteristic; and the corresponding position of the signal action mechanism 111 detected by the diagnostic sensor 401 is at 0.715 MPa (actually between 0.70 MPa and 0.72 MPa), that is, the corresponding position (the corresponding pressure is 0.715 MPa) monitored by the signal action mechanism 111 is within the preset threshold (for example, 0.70 MPa to 0.72 MPa), it means that the current working state of the signal action mechanism 111 of the gas density relay (or gas density monitoring apparatus) is a normal working state. Further, suppose that when the temperature is 15° C., the gas pressure P of the electrical equipment at this time is 0.6952 Mpa (may be obtained through the pressure sensor 2); the intelligent control unit 7 adjusts the online check contact signal sampling unit 6 to a simulation or virtual check state; in the simulation or virtual check state, the online check contact signal sampling unit 6 cuts off a control loop of the contact signal of the gas density relay body 1 and connects the contact of the gas density relay body 1 to the intelligent control unit 7; then, the intelligent control unit 7 controls heating of the heating element 51, the temperature in the second sealing gas chamber G2 (that is, the temperature compensation element) rises, and the temperature value T may be monitored through the temperature sensor 3; when the temperature value rises to 54.7° C., the alarm contact acts, so that an alarm value PBJDZ20=0.6095 Mpa is obtained (0.6095 Mpa is obtained through conversion according to the gas pressure value PBJDZ being 0.6952 Mpa and the temperature TBJDZ being 54.7° C.; when the temperature value rises to 64.5° C., the locking contact acts, so that the locking value PBSDZ20=0.5896 Mpa is obtained (0.5896 Mpa is obtained through conversion according to the gas pressure value PBSDZ being 0.6952 Mpa and the temperature value TBSDZ being 64.5° C.); and suppose that when the contact signal action values (PBJDZ20=0.6095 Mpa, PBSDZ20=0.5896 Mpa) of the gas density relay body 1 is compared with the corresponding preset standard values (PBJDZ20=0.62 Mpa, PBSDZ20=0.60 Mpa), the error between the contact signal action values of the gas density relay body 1 and the corresponding preset standard values is within the preset threshold, the current working state of the gas density relay body 1 is a normal working state, otherwise, the current working state of the gas density relay body 1 is an abnormal working state. Or, a corresponding relationship between the temperature value Td during action of the simulation or virtual check contact signal and the preset standard value of the contact action value PTDDZ20 when the temperature value is Td is designed into a data table in advance, and comparison and determination are performed according to the data table. For example, the qualified range of the locking contact action value is 0.575 Mpa to 0.625 Mpa at 64.5° C.

The core of this embodiment is: 1) the intelligent control unit 7 performs monitoring according to the simulation reference signal unit (pressure sensor 2 and temperature sensor 3) to obtain the gas density value P20, further, the diagnostic sensor 401 determines the corresponding position and/or displacement quantity detected by the signal action mechanism 111 according to the gas density value P20, and the current working state of the monitoring part of the gas density relay is obtained, so that the accuracy of the gas density relay body can be monitored, and the monitoring accuracy can be ensured quantitatively and accurately; and 2) the driving contact action mechanism (a temperature adjusting mechanism 5 in this example) is controlled to make the gas density relay body 1 generate contact action, the intelligent control unit 7 can detect that the gas density relay body 1 generates contact action, and the intelligent control unit 7 obtains the contact signal action value PDZ20 and/or the contact signal return value PFH20 of the gas density relay body 1, so that the contact execution mechanism of the gas density relay body and the contact can be ensured to be normal on the basis of monitoring the accuracy of the density relay and quantitatively accurately ensuring the monitoring accuracy, thereby completing the online simulation or virtual check of the gas density relay body. That is, the core of the gas density relay body 1 in the online simulation or virtual check is: the online check or detection of the gas density relay may be completed by accurate monitoring the signal action mechanism 111 and qualitatively monitoring the contact signal action value and/or the contact signal return value of the gas density relay body 1 in a wide range of ambient temperature.

In addition, after the gas density relay is put into operation or leaves the factory, when the gas density relay body 1 generates a contact signal action, the contact signal action value PDZ20 and/or the contact signal return value PFH20 of the gas density relay body 1 may be compared with the pre-stored detection value before being put into operation or when leaving the factory to diagnose whether the current working state of the gas density relay body 1 is normal. For example, the temperature compensation test may be performed in advance according to the gas density relay (or even each specific gas density relay) of the corresponding parameter, and the tested data may be stored in the intelligent control unit 7 in advance. For example, data tested by the qualified density relay at −20° C., 50° C., 60° C., 70° C. and 80° C. are stored in the intelligent control unit 7 in advance. During check, when the temperature rises to 80° C., the detected contact signal action value P80DZ20 is compared with the data P80SY20 tested at 80° C. in the temperature compensation test before putting into operation or leaving the factory to diagnose whether the current working state of the gas density relay body 1 is normal.

Or, the contact signal action value PDZ20 and/or the contact signal return value PFH20 of the gas density relay body 1 are compared with historical detection values to diagnose whether the current working state of the gas density relay body 1 is normal. For example, the data detected at 70° C. this year is compared with the data detected at 70° C. (or around 70° C.) in previous years.

Or, the contact signal action value PDZ20 and/or the contact signal return value PFH20 of the gas density relay body 1 are compared with the allowable value corresponding to the temperature value during check; and if the difference value is within the allowable error range corresponding to the temperature value, the current working state of the gas density relay body 1 is diagnosed as a normal working state, otherwise, the current working state of the gas density relay body 1 is an abnormal working state. Density relays of different parameters have different allowable values at different temperature values. The allowable value corresponding to the density relay may be obtained according to the density relay of the corresponding parameter and the temperature value during check. For example, for a density relay, the allowable error value is ±0.025 MPa at 60° C., the allowable error value is ±0.026 MPa at 70° C., and the allowable error value is +0.028 MPa at 80° C.

Or similarly, the intelligent control unit 7 uploads the received data to the background, and the background compares the contact signal action value PDZ20 and/or the contact signal return value PFH20 of the gas density relay body 1 with the pre-stored detection value to diagnose whether the current working state of the gas density relay body 1 is normal; or, the contact signal action value PDZ20 and/or the contact signal return value PFH20 of the gas density relay body 1 is compared with the historical detection value to diagnose whether the current working state of the gas density relay body 1 is normal; or, the contact signal action value PDZ20 and/or the contact signal return value PFH20 of the gas density relay body 1 is compared with the allowable value corresponding to the temperature value during check to diagnose whether the current working state of the gas density relay body 1 is normal.

The actually used temperature range of the gas density relay is limited, such as −30° C. to 60° C. Generally speaking, traditional gas density relays can only be checked within this temperature range. However, due to geographical influences, the ambient temperature in different areas varies greatly. For example, in high-temperature areas, the temperature of the gas density relay when contact signal action occurs has exceeded the used temperature range. The gas density relay that is originally subjected to contact signal action at 60° C. actually requires 70° C. to generate the action, which brings difficulties to the check of the gas density relay. The ambient temperature range of online simulation or virtual check may be very wide, far beyond the limitation of the use range. Before the gas density relay is put into use, the operation situation of the gas density relay at various ambient temperatures (including: exceeding the actually used temperature range) can be accurately simulated and actually reproduced. When the gas density relay is checked under the actual operation environment, the gas density relay can be checked on line at the temperature outside the temperature use range of the gas density relay, and the allowable error range is appropriately widen. For example, when the gas density relay sets the allowable error value at 60° C. to be ±0.025 MPa. During the actual check, the temperature at which the gas density relay acts exceeds 60° C., and the temperature can be regulated to 70° C. (the allowable error value at 70° C. is ±0.026 MPa) through the temperature adjusting mechanism 5. At this time, the gas density relay generates a contact signal action, and the pre-stored and qualified test data obtained when the gas density relay performs simulation check at 70° C. serves as comparative data. The error between the two is within the allowable error value±0.026 Mpa, then it indirectly means that the error of the gas density relay body at 60° C. should also be within the allowable error range, thereby realizing online check of the gas density relay. The test data of online simulation or virtual check may provide a reference basis for the check work of the gas density relay in the actual operation environment. The technical solution of this application may perform online check at a temperature outside the temperature use range of the gas density relay to indirectly verify the performance indicators of the gas density relay within the temperature use range, so as to solve the problem of geographical limitation on the check of the gas density relay. The gas density relay of the present application may be used in both high-cold areas and high-temperature areas.

Embodiment 2

Figure 2:
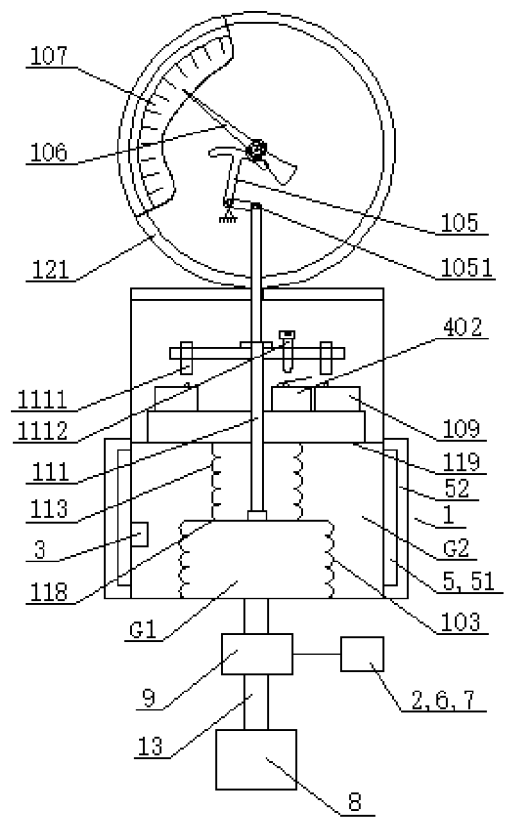
FIG. 2 is a schematic structural diagram of a gas density relay (or gas density monitoring apparatus) applied to high-voltage and medium-voltage electrical equipment and having a simulation check function according to Embodiment 2.

As shown in FIG. 2, a gas density relay (or gas density monitoring apparatus) having a simulation or virtual check function in Embodiment 2 of the present invention includes: a gas density relay body 1, a simulation reference signal unit (formed by a pressure sensor 2 and a temperature sensor 3), a driving contact action mechanism, an online check contact signal sampling unit 6, an intelligent control unit 7, a simulation check signal unit, a multi-way connector 9 and an electrical equipment connector 13. The gas density relay body 1, the pressure sensor 2, the online check contact signal sampling unit 6 and the intelligent control unit 7 are arranged on the multi-way connector 9. The driving contact action mechanism is a temperature adjusting mechanism 5, the temperature adjusting mechanism 5 includes a heating element 51 and a heat insulation part 52, and the heating element 51 and the heat insulation part 2 are respectively arranged on the gas density relay body 1. The intelligent control unit 7 is respectively connected to the simulation reference signal unit (formed by the pressure sensor 2 and the temperature sensor 3), the driving contact action mechanism, the online check contact signal sampling unit 6 and the simulation check signal unit.

The main differences between this embodiment and Embodiment 1 are:

1) the display mechanism includes: a display housing 121, a core 105, a pointer 106 and a dial 107. One end of the moving rod 111 extends into a cavity G3, extends into the display housing 121, and is hinged with an initial end 1051 of the core 105; and the pointer 106 is mounted on the core 105 and arranged in front of the dial 107, and the pointer 106 is combined with the dial 107 to display a gas density value.

2) The simulation check signal unit in this embodiment includes a simulation signal device 402, where the simulation check signal generated by the simulation check signal unit is a contact signal output by the simulation signal unit 402 when gas density monitored by the pressure detection element 103 and the temperature compensation element (a standard compensation gas of a second gas chamber G2) changes, and the contact signal is a switch quantity. In this example, the simulation signal device 402 is a micro switch. The simulation signal device 402 may further include one or more of an electric contact, a mercury switch, a photoelectric switch, a reed switch, a proximity switch, an electronic switch, a photoelectric sensor, a variable resistor and a voltage or current measuring device.

The working principle of this embodiment is as follows:
in a normal working state, the gas density relay (or gas density monitoring apparatus) monitors a gas density value in the electrical equipment 8, and the gas density relay (or gas density monitoring apparatus) monitors the gas density value in the electrical equipment 8 through a gas density detection sensor and a intelligent control unit 7. The gas temperature in the second sealing gas chamber G2 rises through the temperature difference between the gas density relay body 1 and the electrical equipment 8 or heating of the heating element 51 controlled by the intelligent control unit 7. Since the first sealing gas chamber G1 communicates with a gas chamber of the electrical equipment, the gas pressure will not change within a certain time. In this way, the gas pressure balance between the first sealing gas chamber G1 and the second sealing gas chamber G2 is broken, and the first bellow 103 is deformed with the movement of the moving rod 111 to generate a certain displacement. When the temperature rises to a corresponding degree, the moving rod 111 downwards drives a adjusting screw 1112 to trigger a button of the simulation signal device 402, and the simulation signal device 402 outputs a contact signal. At the same time, the intelligent control unit 7 detects a corresponding gas pressure value P and temperature value T when the simulation signal device 402 generates a contact action through the simulation reference signal unit (pressure sensor 2 and temperature sensor 3), so that the intelligent control unit 7 obtains a simulation density value output signal actual action value PFD20 of the gas density relay body 1 according to the gas characteristic. The intelligent control unit 7 or background compares the simulation density value output signal actual action value PFD20 with a simulation density value output signal value PFS20 set in advance to calculate a difference value | PFD20−PFS20| between the detected PFD20 and a preset PFS20, that is an error, and determines whether the error is within a preset threshold. if the error is within the preset threshold, the current working state of the signal action mechanism 111 of the gas density relay (or gas density monitoring apparatus) is a normal working state, otherwise, the current working state of the signal action mechanism 111 of the gas density relay (or gas density monitoring apparatus) is an abnormal working state. The set simulation density value output signal value PFS20 is debugged by the adjusting screw 1112, and the density value range corresponding to the set simulation density value output signal value PFS20 is 85% to 115% of the rated value of the gas density relay. The accuracy of the gas density relay can be monitored quantitatively and accurately by accurate monitoring the signal action mechanism 111 in a wider ambient temperature range. The set simulation density value output signal value is set in advance according to 85% to 115% of the rated pressure value of the gas density relay body. for example, the rated pressure value of the gas density relay body is Pe, then the set simulation density value output signal value PFS20 is Pe* (85% to 115%), which may be specifically implemented by debugging through the adjusting screw 1112.

Then, the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body to connect the contact of the gas density relay body 1 to the intelligent control unit 7; and then, the intelligent control unit 7 controls heating of the heating element 51, so that the gas temperature in the second sealing gas chamber G2 rises, the gas pressure balance between the first sealing gas chamber G1 and the second sealing gas chamber G2 is broken, and the first bellow 103 is deformed with the movement of the moving rod 111 to generate a certain displacement. When the temperature rises to a corresponding degree, the moving rod 111 downwards drives a adjusting screw 1111 to trigger a button of the signal generator 109, the signal generator 109 sends an alarm and a locking signal, and the alarm and the locking signal action are sensed by the intelligent control unit 7; and if the alarm and the locking signal can be acted and sensed (captured), it means that the execution mechanism of the contact and the contact are normally. Further, when the signal generator 109 sends out an alarm and a locking action signal, the intelligent control unit 7 detects the corresponding gas pressure value P and temperature T during action through the simulation reference signal unit (pressure sensor 2 and temperature sensor 3), so that the intelligent control unit 7 obtains a contact signal action value PDZ20 and/or a contact signal return value PFH20 of the gas density relay body 1 according to the gas characteristic. In this way, online simulation or virtual check of the gas density relay body 1 is realized conveniently. After all the contact signal check work is completed, the intelligent control unit 7 restores the driving contact action mechanism. In this example, the intelligent unit 7 turns off the heating element 51 through control to stop heating of the heating element 51.

For example, it is supposed that the rated parameters of the gas density relay described in this embodiment are: the rated pressure is 0.7 MPa, the alarm pressure is 0.62 MPa, the locking pressure is 0.6 MPa (absolute pressure), and the set simulation density value output signal value PFS20 is 0.69 Mpa. The inflation pressure value of the used electrical equipment is 0.71 Mpa (20° C.). It is supposed that the in-situ temperature is 5° C., the gas pressure P of the electrical equipment at this time is 0.6656 MPa (which can be obtained by the pressure sensor 2). The intelligent control unit 7 controls the heating of the heating element 51, so that the temperature in the second sealing gas chamber G2 will rise, and the temperature value T can be monitored by the temperature sensor 3. When the temperature rises to 10.2° C., the simulation signal device 402 outputs a contact signal, and the intelligent control unit 7 obtains the simulation density value output signal actual action value PFD20=0.6939 MPa (0.6939 MPa is obtained through conversion according to the pressure value P being 0.6656 MPa and the temperature T being 10.2° C.) of the gas density relay body 1. A difference value |PFD20−PFS20|=|0.6939 MPa−0.6939 MPa|=0.0039 MPa between the detected PFD20 and the PFS20 set in advance is calculated, that is, the error at 10.2° C. is 0.0039 MPa. It is determined that the error is within the preset threshold, then the current working state of the signal action mechanism 111 of the gas density relay (or gas density monitoring apparatus) is a normal working state, otherwise, the current working state of the signal action mechanism 111 of the gas density relay (or gas density monitoring apparatus) is an abnormal working state. The accuracy of the gas density relay can be monitored quantitatively and accurately by accurate monitoring the signal action mechanism 111 in a wider ambient temperature range. Then, the intelligent control unit 7 adjusts the online check contact signal sampling unit 6 to a simulation or virtual check state; in the simulation or virtual check state, the online check contact signal sampling unit 6 cuts off a control loop of the contact signal of the gas density relay body 1 and connects the contact of the gas density relay body 1 to the intelligent control unit 7; then, the intelligent control unit 7 controls the heating of the heating element 51, the temperature in the second sealing gas chamber G2 rises, and the temperature value T may be monitored through the temperature sensor 3; when the temperature value rises to 34.5° C., the alarm contact acts, so that an alarm value PBJDZ20=0.628 MPa is obtained (0.628 MPa is obtained through conversion according to the gas pressure value PBJDZ being 0.6656 MPa and the temperature TBJDZ being 34.5° C.; when the temperature value rises to 41.8° C., the locking contact acts, so that the locking value PBSDZ20=0.6116 MPa is obtained (0.6116 MPa is obtained through conversion according to the gas pressure value PBSDZ being 0.6656 MPa and the temperature value TBSDZ being 41.8° C.); and suppose that when the contact signal action values (PBJDZ20=0.628 MPa, PBSDZ20=0.6116 MPa) of the gas density relay body 1 is compared with the corresponding preset standard values (PBJDZ20=0.62 MPa, PBSDZ20=0.60 MPa), the error between the contact signal action values of the gas density relay body 1 and the corresponding preset standard values is within the preset threshold, the current working state of the gas density relay body 1 is a normal working state, otherwise, the current working state of the gas density relay body 1 is an abnormal working state. Or, similarly, a corresponding relationship between the temperature value Td during action of the simulation or virtual check contact signal and the preset standard value of the contact action value PTDDZ20 when the temperature value is Td is designed into a data table in advance, and comparison and determination are performed according to the table. For example, the qualified range of the locking contact action value is 0.585 Mpa to 0.615 Mpa at 41.8° C. In this way, online simulation or virtual check of the gas density relay body 1 is completed.

Embodiment 3

Figure 3:
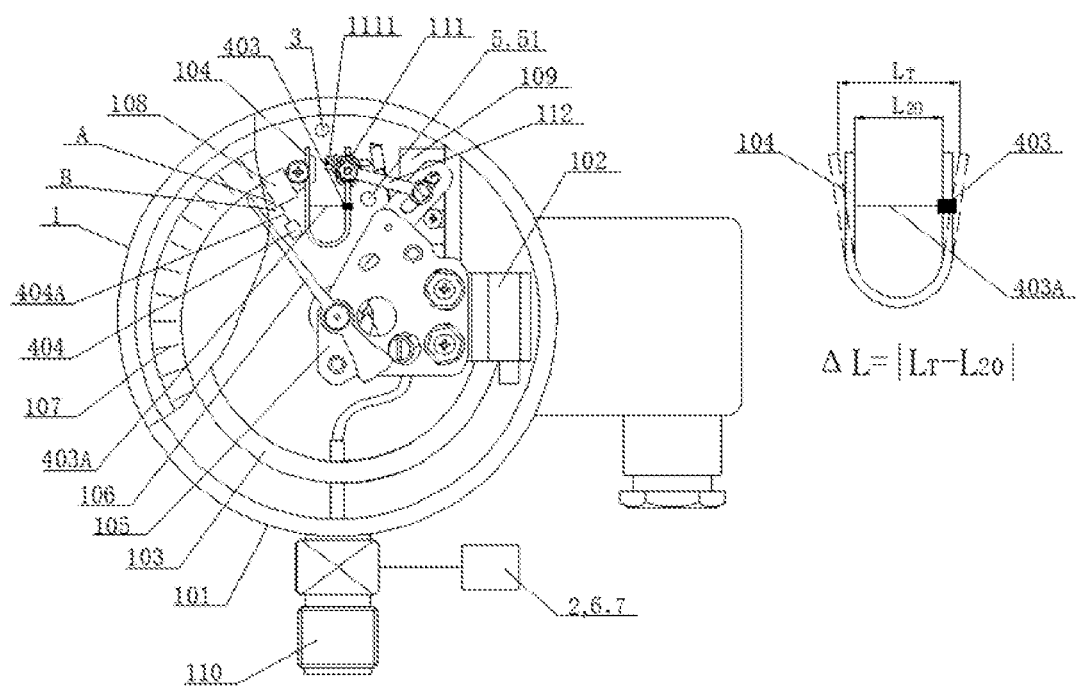
FIG. 3 is a schematic structural diagram of a gas density relay (or gas density monitoring apparatus) applied to high-voltage and medium-voltage electrical equipment and having a simulation check function according to Embodiment 3.

As shown in FIG. 3, a gas density relay (or gas density monitoring apparatus) having a simulation check function includes: a gas density relay body 1, a simulation reference signal unit (a gas density detection sensor, formed by a pressure sensor 2 and a temperature sensor 3), a driving contact action mechanism 5, an online check contact signal sampling unit 6, an intelligent control unit 7, and a simulation check signal unit. The simulation check signal unit includes two diagnostic sensors, namely, a first diagnostic sensor 403 and a second diagnostic sensor 404, which are arranged in a housing 101 of the gas density relay body 1; the pressure sensor 2, the online check contact signal sampling unit 6 and the intelligent control unit 7 are arranged on a connector 110 for connecting electrical equipment; and the temperature sensor 3 is arranged in the housing 101. In a gas path, the pressure sensor 2 of the gas density detection sensor communicates with the gas path of the gas density relay body 1. The pressure sensor 2, the temperature sensor 3, the online check contact signal sampling unit 6 and the simulation check signal unit are respectively connected to the intelligent control unit 7.

Specifically, the gas density relay body 1 includes the housing 101, and a base 102, an end base 108, a pressure detection element (a Bourdon tube in this example) 103, a temperature compensation element (a bimetallic strip in this example) 104, several signal generators 109, a signal action mechanism 111, a movement 105, a pointer 106, a connection rod 112 and a dial 107 that are arranged in the housing 101. One end of the pressure detection element 103 is fixed on the base 102 and communicated with the base 102, the other end of the pressure detection element 103 is connected with one end of the temperature compensation element 104 through the end base 108, the other end of the temperature compensation element 104 is provided with the signal action mechanism 111, and an adjusting part (such as an adjusting screw) for pushing the signal generator 109 and connecting or disconnecting a contact of the signal generator 109 is arranged on the signal action mechanism 1111. The core 105 is fixed on the base 102; the other end of the temperature compensation element 104 is further connected with the core 105 through the connection rod 112 or directly; and the pointer 106 is installed on the core 105 and arranged in front of the dial 107, and the pointer 106 displays a gas density value in combination with the dial 107. The signal generator 109 adopts a micro switch, and the gas density relay body 1 outputs a contact signal through the signal generator 109; the pressure detection element 103 adopts a Bourdon tube; and the temperature compensation element 104 adopts a temperature compensation sheet. In addition, the gas density relay body 1 may further include a digital device or a liquid crystal device capable of displaying indicating values. The gas density relay body 1 in the example may further include: an oil-filled density relay, an oil-free density relay, a gas density meter, a gas density switch, or a gas pressure gauge.

The working principle of this embodiment is as follows:

The first diagnostic sensor 403 is arranged on the temperature compensation element 104 in the housing 101, and is in contact or associated with the temperature compensation element 104 through a contact part 403A; the first diagnostic sensor 403 is a displacement sensor (or a deformation quantity sensor or a photoelectric sensor); and the first diagnostic sensor 403 is configured to collect the deformation quantity of the temperature compensation element 104 of the gas density relay body 1 and diagnose the current working state of the gas density relay body 1. Specifically, in this example, the intelligent control unit 7 obtains the temperature T collected by the temperature sensor 3, and the deformation quantity $\Delta L$ (compared with the overall dimension at 20° C.) of the temperature compensation element 104 detected by the first diagnostic sensor 403. For example, as shown in FIG. 3, the temperature compensation element 104 stretches or contracts under the action of thermal expansion and clod contraction to compensate for the change in density value caused by the rise and fall of temperature. The overall dimension of the temperature compensation element 104 at 20° C. is L20, when the temperature changes, the overall dimension of the temperature compensation element 104 changes and becomes LT, that is, the deformation quantity of the temperature compensation element 104 is $\Delta L=LT-L20$, if the deformation quantity $\Delta L$ is within a preset threshold thereof, a current working state of the temperature compensation element 104 of the gas density relay (or gas density monitoring apparatus) is normal, otherwise, the current working state is abnormal. Further, a corresponding relationship between each temperature change value $\Delta T(\Delta T=|T-20|°$ C.) relative to 20° C. and a preset standard value of the deformation quantity $\Delta L(\Delta L=|LT-L20|)$ of the temperature compensation element 104 corresponding to each temperature change value $\Delta T$ is generated into a data table in advance; the intelligent control unit 7 obtains the deformation quantity $\Delta L1$ of the temperature compensation element 104 detected by the first diagnostic sensor 403 under the current temperature change, queries a preset standard value $\Delta L2$ corresponding to the current temperature change value in the data table, calculates a difference value $|\Delta L1-\Delta L2|$ between the detected deformation quantity $\Delta L1$ and the preset standard value ΔL2, that is, an error, and determines whether the error is in a preset threshold; and if the error is within the preset threshold, the current working state working state of the temperature compensation element 104 of the gas density relay (or gas density monitoring apparatus) is a normal working state, otherwise, the current working state of the temperature compensation element 104 of the gas density relay (or gas density monitoring apparatus) is an abnormal working state.

The second diagnostic sensor 404 is arranged at the end base 108 in the housing 101, and is in contact or associated with the end base 108 through a contact part 404A; the second diagnostic sensor 404 is a displacement sensor (or deformation quantity sensor or a photoelectric sensor or a distance-measuring sensor); and the second diagnostic sensor 404 is configured to collect a position signal or displacement quantity signal of the end base 108 of the gas density relay body 1 and diagnoses the current working state of the gas density relay body 1. Specifically, in this example, the intelligent control unit 7 obtains a pressure value P collected by the pressure sensor 2 of the gas density detection sensor under the same gas pressure, and the position or displacement quantity ΔS (for example, compared with the pressure that is equal to zero) of the end base 108 detected by the second diagnostic sensor 404. For example, as shown in FIG. 3, when the pressure sensor 2 collects the pressure value P, the corresponding position of the end base 108 detected by the second diagnostic sensor 404 is a position A; and if the position A is within the preset threshold, the current working state of the end base 108 of the gas density relay (or gas density monitoring apparatus) is a normal working state, otherwise, the current working state of the end base 108 of the gas density relay (or gas density monitoring apparatus) is an abnormal working state. Or, a corresponding relationship between each gas pressure value and a corresponding preset standard value of the position of the end base 108 is designed into a data table in advance; the intelligent control unit 7 obtains the position S1 of the end base 108 detected by the second diagnostic sensor 404 under the current gas pressure, queries a preset standard value S corresponding to the current gas pressure value in the data table, calculates a difference value |S1−S2| between the detected position S1 and the preset standard value S2 of the position, that is, an error, and determines whether the error is within a preset threshold; and if the error is within in the preset threshold, the current working state of the end base 108 of the gas density relay (or gas density monitoring apparatus) is a normal working state, otherwise, the current working state of the end base 108 of the gas density relay (or gas density monitoring apparatus) is an abnormal working state. During the pressure calculation, a density relay measurement principle (an absolute pressure or a relative pressure) is combined, and accurate calculation may be carried out in combination with the atmospheric pressure. The end base 108 is welded to one end of the pressure detection element 103 (being a Bourdon tube in the example), which indirectly indicates that the current working state of the pressure detection element 103 (being a Bourdon tube in the example) is normal, otherwise, the current working state is abnormal.

Or, when the temperature T=T1 and the pressure value collected by the pressure sensor 2 is PT1, the corresponding position of the end base 108 detected by the second diagnostic sensor 404 is a position A; when the temperature T=T2 and the pressure value collected by the pressure sensor 2 is PT2, the corresponding position of the end base 108 detected by the second diagnostic sensor 404 is a position B; a distance between the position A and the position B is ΔS, that is, the temperature change generates a temperature change value ΔT (ΔT=|T1−T2|), and the pressure value will cause corresponding change and generates a pressure change value ΔP (ΔP=|PT1−PT2|), so that the end base 108 generates a corresponding displacement ΔS; and if the displacement quantity ΔS is within the preset threshold, the current working state of the end base 108 of the gas density relay (or gas density monitoring apparatus) is a normal working state, otherwise, the current working state of the end base 108 of the gas density relay (or gas density monitoring apparatus) is an abnormal working state. Or, a corresponding relationship between each gas pressure change value and a corresponding preset standard value of the displacement quantity of the end base 108 is designed into a data table in advance; the intelligent control unit 7 obtains the displacement quantity ΔS1 of the end base 108 detected by the second diagnostic sensor 404 under the current gas pressure change, queries a preset standard value ΔS2 corresponding to the current gas pressure change value in the data table, calculates a difference value |ΔS1−ΔS2| between the detected displacement quantity ΔS1 and the preset standard value ΔS2, that is, an error, and determines whether the error is within a preset threshold; and if the error is within in the preset threshold, the current working state of the end base 108 of the gas density relay (or gas density monitoring apparatus) is a normal working state, otherwise, the current working state of the end base 108 of the gas density relay (or gas density monitoring apparatus) is an abnormal working state. The end base 108 is welded to one end of the pressure detection element 103 (being a Bourdon tube in the example), which indirectly indicates that the current working state of the pressure detection element 103 (being a Bourdon tube in the example) is normal, otherwise, the current working state is abnormal. Or, that is, the pressure change value ΔP (ΔP=|PT1−PT2|) generated by the pressure value change enables the pressure detection element 103 (being a Bourdon tube in the example) to generate a corresponding deformation quantity, and if the deformation quantity is within a preset threshold thereof, the current working state of the pressure detection element 103 (being a Bourdon tube in the example) is normal, otherwise, the current working state is abnormal.

In this way, the intelligent control unit 7 may respectively diagnose whether the current working states of the temperature compensation element (a bimetallic strip in this example) 104 and the pressure detection element (Bourdon tube in this example) 103 are in normal operation, or whether the monitoring accuracy of the gas density relay is in a qualified state through the simulation reference signal unit (gas density detection sensor, formed by the pressure sensor 2 and the temperature sensor 3) and through the monitoring of the simulation check signal unit (the first diagnostic sensor 403 and the second diagnostic sensor 404), It should be noted that the simulation check signal unit is not limited to the above two diagnostic sensors, and a plurality of diagnostic sensors may be provided, for example, one is arranged on the pressure detection element, one is arranged on the temperature compensation element, one is arranged on the signal action mechanism, and even one is arranged on the signal generator.

The driving contact action mechanism in this embodiment is a temperature adjusting mechanism 5, the temperature adjusting mechanism 5 includes a heating element 51, and the heating element 51 is arranged in the housing 101 of the density relay body 1. The temperature sensor 3 is also arranged in the housing 101. The temperature adjusting mechanism 5 is configured to regulate temperature rise and fall of the temperature compensation element of the gas density relay body 1, so that the gas density relay body 1 generates contact signal action. Specifically, the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body 1 to connect the contact of the gas density relay body 1 to the intelligent control unit 7; and then the intelligent control unit 7 controls the heating of the heating element 51, so that the temperature compensation element 104 is expanded. When the temperature rises to a corresponding degree, the signal action mechanism 111 rightwards drives a adjusting screw 1111 to trigger a button of the signal generator 109, the signal generator 109 sends an alarm and a locking signal, and the alarm and the locking signal action are sensed by the intelligent control unit 7; and if the alarm and the locking signal can be acted and sensed (captured), it means that the execution mechanism of the contact and the contact are normal. Further, when the signal generator 109 sends out an alarm and a locking action signal, the intelligent control unit 7 detects the corresponding gas pressure value P and temperature T during action through the simulation reference signal unit (pressure sensor 2 and temperature sensor 3), so that the intelligent control unit 7 obtains a contact signal action value PDZ20 and/or a contact signal return value PFH20 of the gas density relay body 1 according to the gas characteristic, and respectively compares the contact signal action value PDZ20 and/or a contact signal return value PFH20 of the gas density relay body 1 with the corresponding preset standard value; and if the error between the contact signal action value PDZ20 and/or a contact signal return value PFH20 of the gas density relay body 1 and the corresponding preset standard value, the current working state of the gas density relay body 1 is a normal working state, otherwise, the current working state of the gas density relay body 1 is an abnormal working state. In this way, online simulation or virtual check of the gas density relay body 1 is realized conveniently. After all the contact signal check work is completed, the intelligent control unit 7 restores the driving contact action mechanism. In this example, the intelligent unit 7 turns off the heating element 51 through control to stop heating of the heating element 51.

Example IV

Figure 5:
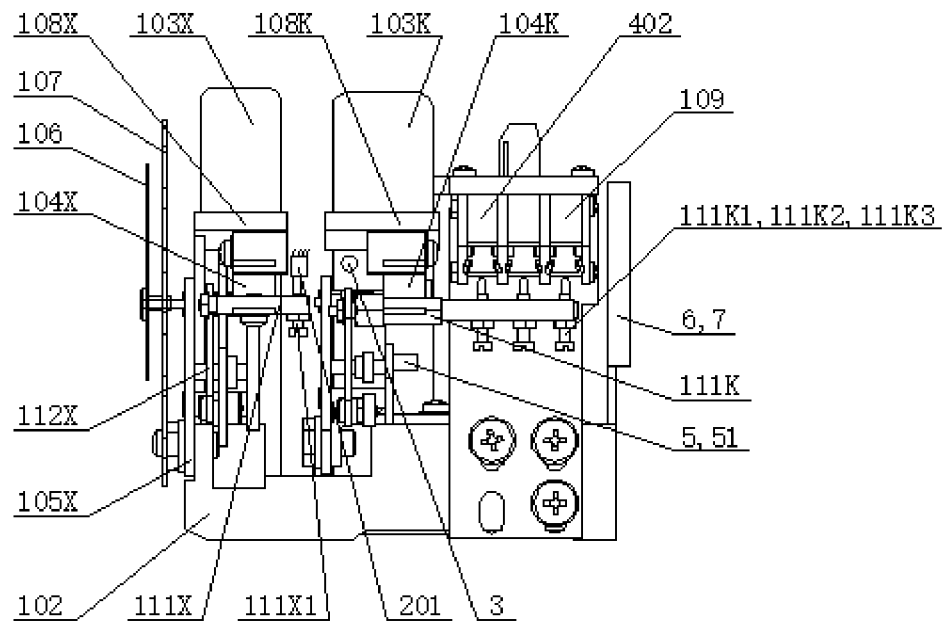
FIG. 5 is a schematic structural diagram of a gas density relay (or gas density monitoring apparatus) applied to high-voltage and medium-voltage electrical equipment and having a simulation check function according to Embodiment 5.

As shown in FIG. 5, a gas density relay (or gas density monitoring apparatus) with a simulation check function mainly includes: a gas density relay body 1, a simulation reference signal unit (a gas density detection sensor, composed of a pressure sensor 2 and a temperature sensor 3), an driving contact action mechanism 5, an online check contact signal sampling unit 6, an intelligent control unit 7 and a simulation check signal unit (including a diagnostic sensor 401). The pressure sensor 2, the online check contact signal sampling unit 6 and the intelligent control unit 7 are provided on a connector 110 for connecting electrical equipment. In a gas path, the pressure sensor 2 of the gas density detection sensor is communicated with the gas density relay body 1. The pressure sensor 2, the temperature sensor 3, the online check contact signal sampling unit 6 and simulation check signal unit are connected to the intelligent control unit 7 respectively.

Specifically, the gas density relay body 1 includes a housing 101, and a base 102, an end base 108, a pressure detection element 103, a temperature compensation element 104, a plurality of signal generators 109, a signal action mechanism 111, a connection rod 112, a core 105, a pointer 106, and a dial 107 which are arranged in the housing 101. The diagnostic sensor 401 is provided in the housing 101 of the gas density relay body 1.

The obvious difference from Embodiment 3 is that: in the present embodiment, the diagnostic sensor 401 is provided at the signal action mechanism 111 inside the housing 101, and is in contact with or associated with the signal action mechanism 111 through a contact part 401A, the diagnostic sensor 401 is a displacement sensor (or a deformation quantity sensor, or a photoelectric sensor), and the diagnostic sensor 401 is configured to collect a corresponding position or displacement quantity of the signal action mechanism 111 of the gas density relay body 1, so as to diagnose whether the current working state of the gas density relay body 1 is normal or not.

Figure 4:
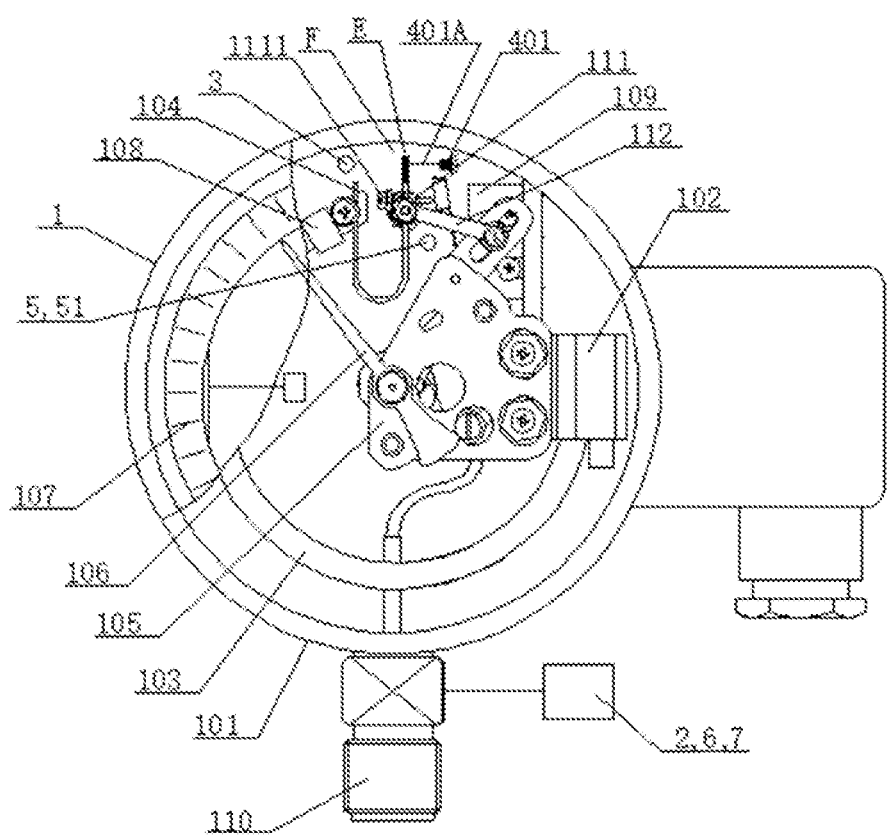
FIG. 4 is a diagram structural schematic of a gas density relay (or gas density monitoring apparatus) applied to high-voltage and medium-voltage electrical equipment and having a simulation check function according to Embodiment 4.

In the embodiment, the working principle is as follows: the intelligent control unit 7 obtains a density value P20 obtained by the pressure sensor 2 and the temperature sensor 3 of the gas density detection sensor, and a corresponding displacement quantity ΔS20 or a corresponding position detected by the diagnostic sensor 401 on the signal action mechanism 111, under the same gas density. For example, as shown in FIG. 4, when the pressure sensor 2 acquires a pressure value P and the temperature sensor 3 acquires a temperature value T, a corresponding density value P20 is obtained, in such a case, the corresponding position detected by the diagnostic sensor 401 for the signal action mechanism 111 is E, which is within a preset threshold, and then the current working state of the signal action mechanism 111 of the gas density relay (or the gas density monitoring apparatus) is a normal working state, otherwise, the current working state is an abnormal working state. Or, a corresponding relationship between each gas density value and a preset standard value of the position of the signal action mechanism 111 corresponding to the gas density value may be designed as a data table in advance; the intelligent control unit 7 obtains a position S1 of the signal action mechanism 111 detected by the diagnostic sensor 401 under the current gas density, queries a preset standard value S2 corresponding to the current gas density value in the data table, calculates a difference |S1−S2| between the detected position S1 and the preset standard value S2, that is, an error, and determines whether the error is within a preset threshold or not, if the error is within the preset threshold, the current working state of the signal action mechanism 111 of the gas density relay (or the gas density monitoring apparatus) is a normal working state, otherwise, the current working state is an abnormal working state. During the density calculation, a density relay measurement principle (an absolute pressure or a relative pressure) is combined, and accurate calculation may be carried out in combination with the atmospheric pressure.

Or, when a density value obtained by the pressure sensor 2 and the temperature sensor 3 on one day D1 is P20D1, a corresponding position detected by the diagnostic sensor 401 on the signal action mechanism 111 is a position E; when a density value obtained by the pressure sensor 2 and the temperature sensor 3 on another day D2 is P20D2, a corresponding position detected by the d diagnostic sensor 401 on the signal action mechanism 111 is a position F; and a distance between the position E and the position F is ΔS20, that is to say, a density change value ΔP20 (ΔP20=|P20D1−P20D2|) caused by density change enables the signal action mechanism 111 to generate a corresponding displacement, and if the displacement quantity ΔS20 is within a preset threshold thereof, the current working state of the signal action mechanism 111 of the gas density relay (or gas density monitoring apparatus) is normal, otherwise, the current working state is abnormal. Or, a corresponding relationship between each density change value and a preset standard value of the displacement quantity of the signal action mechanism 111 corresponding to the density change value may be designed as a data table in advance; the intelligent control unit 7 obtains a displacement quantity ΔS1 of the signal action mechanism 111 detected by the diagnostic sensor 401 under the current gas density, queries a preset standard value ΔS2 corresponding to the current gas density change value in the data table, calculates a difference |ΔS1–ΔS2| between the detected displacement quantity S1 and the preset standard value S2, that is, an error, and determines whether the error is within a preset threshold or not, if the error is within the preset threshold, the current working state of the signal action mechanism 111 of the gas density relay (or the gas density monitoring apparatus) is a normal working state, otherwise, the current working state is an abnormal working state.

Similarly, the simulation check signal unit is not limited to include the above-mentioned one diagnostic sensor, but may be provided with a plurality of diagnostic sensors, which are respectively provided corresponding to the temperature compensation element 104, the core 105, the pointer 106, or the connection rod 112 of the gas density relay body 1. The diagnostic sensor is a displacement sensor (or a deformation quantity sensor, or a photoelectric sensor), which is configured to collect the corresponding position and/or displacement quantity or deformation quantity of the temperature compensation element 104, or the core 105, or the pointer 106, or the connection rod 112 of the gas density relay body 1, and respectively diagnose whether the current working state of the temperature compensation element 104, or the core 105, or the pointer 106, or the connection rod 112 is normal or not, namely, the simulation check signal unit diagnoses whether the monitoring accuracy of gas density relay is in a qualified state or not. The method is the same as the above-mentioned method for monitoring the signal action mechanism 111 by the simulation check signal unit.

In the embodiment, the driving contact action mechanism is a temperature adjusting mechanism 5, and the temperature adjusting mechanism 5 includes a heating element 51. By controlling heating of the heating element 51 through the intelligent control unit 7, the temperature compensation element 104 is expanded. When the temperature rises to a corresponding degree, the signal action mechanism 111 rightwards drives a adjusting screw 1111 to trigger a button of the signal generator 109, the signal generator 109 sends an alarm and a locking signal, and the alarm and the locking signal action are sensed by the intelligent control unit 7; and if the alarm and the locking signal can be acted and sensed (captured), it means that the execution mechanism of the contact and the contact are normal. Furthermore, the intelligent control unit 7 also obtains a contact signal action value PDZ20 and/or a contact signal return value PFH20 of the gas density relay body 1, thus conveniently realizing online simulation or virtual check of the gas density relay body 1. After all the contact signal check work is completed, the intelligent control unit 7 restores the driving contact action mechanism, in the present embodiment, the intelligent control unit 7 stops the heating of the heating element 51 by controlling to turn off the heating element 51.

Embodiment V

As shown in FIG. 5, a gas density relay (or gas density monitoring apparatus) with a simulation check function includes: a gas density relay body 1, a simulation reference signal unit, an driving contact action mechanism 5, an online check contact signal sampling unit 6, an intelligent control unit 7, and a simulation check signal unit (including a simulation signal device 402). The intelligent control unit 7 is provided on the gas density relay body 1. The simulation reference signal unit includes a standard set density value signal contact 201 and a temperature sensor 3. The simulation reference signal unit is provided on the gas density relay body 1. The standard set density value signal contact 201, the temperature sensor 3, the online check contact signal sampling unit 6, and the simulation check signal unit are connected to the intelligent control unit 7 respectively. The driving contact action mechanism is a temperature adjusting mechanism 5, and the temperature adjusting mechanism 5 includes a heating element 51; and the heating element 51 is provided on the gas density relay body 1.

Specifically, the gas density relay body 1 includes a housing, and a gas density control part and a gas density display part which are provided in the housing. The gas density control part includes a base 102, a control end base 108K, a control pressure detection element (a Bourdon tube in the embodiment) 103K, a control temperature compensation element 104K, a plurality of signal generators 109, a control signal action mechanism 111K and a simulation signal device 402. One end of the control pressure detection element 103K is fixed on and communicated with the base 102, the other end of the control pressure detection element 103K is connected to one end of the control temperature compensation element 104K through the control end base 108K, the other end of the control temperature compensation element 104K is provided with the control signal action mechanism 111K, the control signal action mechanism 111K is provided with adjusting parts 111K1, 111K2 and 111K3 (for example, adjusting screws) that push the signal generators 109 and the simulation signal device 402 to connect or disconnect contacts of the signal generators 109 and the simulation signal device 402. The simulation signal device 402 outputs a contact signal, which is a switch quantity. The simulation signal device 402 may further include one or more of an electric contact, a mercury switch, a photoelectric switch, a reed switch, a proximity switch, an electronic switch, a photoelectric sensor, a variable resistor and a voltage or current measuring device. Specifically, the adjusting part 111K1 debugs a set simulation density value output signal value PFS20, and the density value range corresponding to the set simulation density value output signal value PFS20 is 85% to 115% of the rated value of the gas density relay. In the embodiment, the simulation signal device 402 is a micro switch. The gas density display part includes a display end base 108X, a display pressure detection element 103X, a display temperature compensation element 104X, a connection rod 112X, a core 105, a pointer 106, a dial 107, a display signal action mechanism 111X, and a standard set density value signal contact 201. One end of the display pressure detection element (a Bourdon tube in the embodiment) 103K is fixed on and communicates with the base 102, the other end of the display pressure detection element 103X is connected to one end of the display temperature compensation element 104X through the display end base 108X, the other end of the display temperature compensation element 104X is provided with a display signal action mechanism 111X, the display signal action mechanism 111X is provided with an adjusting part 111K1 (for example, an adjusting screw) that pushes the standard set density value signal contact 201 to enable the standard set density value signal contact 201 to be connected or disconnected. The standard set density value signal contact 201 outputs a contact signal, which is a switch quantity. Specifically, the adjusting part 111X1 debugs the action value PFB2 of the set standard set density value signal contact 201, and the action value PFB20 of the set standard set density value signal contact 201 is the same as the set simulation density value output signal value PFS20. The core 105 is fixed on the base 102; the other end of the display temperature compensation element 104X is further connected to the core 105 through the display connection rod 112X or directly connected to the core 105; and the pointer 106 is installed on the core 105 and provided in front of the dial 107, and the pointer 106 displays the gas density value in combination with the dial 107. In addition, the gas density relay body 1 may further include a digital device or a liquid crystal device capable of displaying indicating values.

The working principle of the present embodiment is that: in the normal working state, the gas density relay (or gas density monitoring apparatus) monitors the gas density value in the electrical equipment. By using the temperature difference between the gas density relay body 1 and the electrical equipment, or by controlling the heating of the heating element 51 through the intelligent control unit 7, the control temperature compensation element 104K and the display temperature compensation element 104X are enabled to simultaneously expand. When the temperature rises to a corresponding degree, the control signal action mechanism 111K downwards drives the adjusting screw 111K1 to trigger the simulation signal device 402, so that the contact of the simulation signal device 402 is connected (or disconnected), when the connection (or disconnection) of the contact of the simulation signal device 402 is sensed by the intelligent control unit 7, the intelligent control unit 7 timely collects the temperature value TFS of the temperature sensor 3; the display signal action mechanism 111X downwards drives the adjusting screw 111X1 to trigger the simulation reference signal device to enable the standard set density value signal contact 201 of the simulation reference signal device to be connected (disconnected), when the connection (or disconnection) of the standard set density value signal contact 201 is sensed by the intelligent control unit 7, the intelligent control unit 7 timely collects the temperature value TFB of the temperature sensor 3. The intelligent control unit 7 or background compares TFB with TFS, that is, calculates the difference |TFB−TFS| between TFB and TFS, and determines whether the difference is within a preset threshold, if the difference is within the preset threshold, the current working state of the control signal action mechanism 111K of the gas density relay (or gas density monitoring apparatus) is a normal working state, otherwise, the current working state is an abnormal working state. Therefore, the precision of the gas density relay can be quantitatively and accurately monitored through the accurate monitoring of the control signal action mechanism 111K in a wide range of ambient temperature.

Then, the intelligent control unit 7 adjusts the online check contact signal sampling unit 6 to a simulation or virtual check state, under the simulation or virtual check state, the online check contact signal sampling unit 6 cuts off a control loop of the contact signal of the gas density relay body 1 and connects the contact of the gas density relay body 1 to the intelligent control unit 7; then, the intelligent control unit 7 controls the heating of the heating element 51, when the temperature rises to a corresponding degree, the control signal action mechanism 111K downwards drives the adjusting screws 111K2 and 111K3 to trigger a button of the signal generator 109, the signal generator 109 sends out an alarm and a locking signal, the actions of the alarm and the locking signal are sensed by the intelligent control unit 7, if both the alarm and the locking signal can be actuated and sensed (captured), it indicates that an execution mechanism of the contact and the contact are normal. When the current working state of the gas density relay body is the abnormal working state, the intelligent control unit 7 outputs a corresponding abnormal alarm contact signal; and preferably, the abnormal alarm contact signal is uploaded to target equipment through an alarm signal line.

Furthermore, when the signal generator 109 sends out an alarm and a locking action signal, the intelligent control unit 7 detects the corresponding temperature value TDZ during action through the simulation reference signal unit (temperature sensor 3). According to the rated parameters of the gas density relay and its gas characteristics, the intelligent control unit 7 or background compares TFB with TDZ, that is, calculates the difference |TFB−TDZ| between TFB and TDZ, and determines whether the difference is within a preset threshold, if the difference is within the preset threshold, it indicates that the gas density relay body 1 is normal. Or, according to the parameters of the density relay, the normal relationship between TFB and TDZ is designed as a corresponding data table, and whether the gas density relay body 1 is normal or not is quantitatively determined according to the table. In this way, online simulation or virtual check of the gas density relay body 1 by gas is realized conveniently. After all the contact signal check work is completed, the intelligent control unit restores the driving contact action mechanism. In this example, the intelligent unit 7 turns off the heating element 51 through control to stop heating of the heating element 51.

For example, it is supposed that the rated parameters of the gas density relay described in the present embodiment are: the rated pressure is 0.7 MPa, the alarm pressure is 0.62 MPa, the locking pressure is 0.6 MPa (absolute pressure), the set simulation density value output signal value PFS20 is 0.69 MPa, and the action value PFB20 of the set standard set density value signal contact 201 is 0.69 MPa. That is, it is set that the contact of the simulation signal device of the simulation check unit acts when the gas density is 0.69 MPa, and the contact of the simulation reference signal device of the simulation reference signal unit also acts when the gas density is 0.69 MPa. It is supposed that the inflation pressure value of the used electrical equipment is 0.71 MPa (20° C.). Assuming that the site temperature is 5° C., the gas pressure P of the electrical equipment is 0.6656 MPa (theoretical value) at the moment, by controlling the heating of the heating element 51 through the intelligent control unit 7, the temperatures of the display temperature compensation element 104X and the control temperature compensation element 104K increase, the intelligent control unit 7 obtains TFB=10.2° C. and TFS=11.2° C. respectively, that is, calculates the difference between the detected TFB and TFS is |TFB−TFS|=1° C., if the difference is within a preset threshold, it indicates that the difference between the gas density value when the simulation check signal unit outputs the simulation check signal and the corresponding gas density value (that is, the standard set density value) when the simulation reference signal device outputs the standard set density signal is within the preset threshold, then the current working state of the gas density relay body is a normal working state, the current working state of the control signal action mechanism 111K of the gas density relay (or gas density monitoring apparatus) is an normal working state, so that the precision of the density relay can be quantitatively and accurately monitored through the accurate monitoring of the signal action mechanism 111 in a wide range of ambient temperature. Then, the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body 1 to connect the contact of the gas density relay body 1 to the intelligent control unit 7; and then, the intelligent control unit 7 controls heating of the heating element 51, so that the temperature of the control temperature compensation element 104K increases, its temperature value T can be monitored by the temperature sensor 3, when the temperature value rises to 34.5° C., an alarm contact acts, then TDZBJ=34.5° C. is obtained, when the temperature value rises to 41.8° C., a locking contact acts, and then TDZBS=41.8° C. is obtained. For the alarm contact, it is calculated that the difference between the detected TFB and TDZBJ is |TDZBJ−TFB|=24.3° C.; and for the locking contact, it is calculated that the difference between the detected TFB and TDZBS is |TDZBS−TFB|=31.6° C. The difference is within the preset threshold, it indicates that the gas density relay body 1 is normal. In this way, online simulation or virtual check of the gas density relay body 1 is well completed.

In addition, in the embodiment, the control pressure detection element of the gas density control part may adopt a bellow, and the control temperature compensation element may adopt standard compensation gas, the detailed description can refer to FIG. 1 or FIG. 2, that is, the principle and structure of the gas density control part are the same as those of Embodiment 1 or Embodiment 2.

In the embodiment, the driving contact action mechanism may also be a pressure adjusting mechanism, equipped with a pressure sensor, which monitors the corresponding pressure value PFB when the standard set density value signal contact 201 is connected (or disconnected) and the corresponding pressure value PFS when the connect of the simulation signal device 402 is connected (or disconnected), and calculates the difference between PFB and PFS for determination.

In the embodiment, the simulation reference signal device may also not need a temperature sensor, and outputs set density value signals of two standards only through set density value signal contacts of two standards of the simulation reference signal device, namely, a set density value signal of a first standard and a set density value signal of a second standard. For the set density value signal of a first standard, the contact is a set density value signal contact BS of a first standard, and the signal value is an upper tolerance required value of the corresponding set simulation check signal value; for the set density value signal of the second standard, the contact is set density value signal contact BX of a second standard, and the signal value is a lower tolerance required value of the corresponding set simulation check signal. That is, the set density value signal of the first standard and the set density value signal of the second standard are preset according to the density value when the set simulation check signal unit acts, and their signal values correspond to the allowable variation quantity of density value when the contact of the simulation signal device is allowed to act or the signal changes. In the present embodiment, the simulation check signal refers to a signal output when the contact action of the simulation signal device or the signal changes: on or off; and the set simulation check signal value refers to the corresponding gas density value when the contact action of the preset simulation signal device or the signal changes and the simulation check signal is output. For example, suppose that the rated parameters of the gas density relay described in the present embodiment are: the rated pressure is 0.7 MPa, the alarm pressure is 0.62 MPa, the locking pressure is 0.6 MPa (absolute pressure), the set simulation check signal value (namely, the set simulation density value output signal value) PFS20 is 0.69 MPa, the action value PFBX20 of the set density value signal contact Bx of the second standard of the lower tolerance requirement of the set simulation check signal value is 0.68 MPa, and the action value PFBS20 of the set density value signal contact BS of the first standard of the upper tolerance requirement of the set simulation check signal value is 0.70 MPa. It is supposed that the inflation pressure value of the used electrical equipment is 0.71 MPa (20° C.). The intelligent control unit 7 controls the heating of the heating element 51, if the sequence monitored by the intelligent control unit 7 is: the set density value signal contact action of BS of the first standard of the upper tolerance requirement of the set simulation check signal value first, then the set density value signal contact action of BX of the second standard of the lower tolerance requirement of the set simulation signal device, which indicates that the actual gas density value when the simulation check signal unit outputs the simulation check signal is between the gas density value corresponding to the set density value signal of the first standard output by the simulation reference signal device and the gas density value corresponding to the set density value signal of the second standard output by the simulation reference signal device. If the range between the output set density value of the first standard and the output set density value of the second standard is within an acceptable range, it can be determined that the difference (which is smaller than the difference between the set density value of the first standard and the output set density value of the second standard) between the actual gas density value when the simulation check signal is actually output and the set simulation check signal value is also within an acceptable threshold, then the current working state of the gas density relay body is the normal working state, and the current working state of the control signal action mechanism 111K of the gas density relay (or gas density monitoring apparatus) is the normal working state.

Embodiment VI

Figure 6:
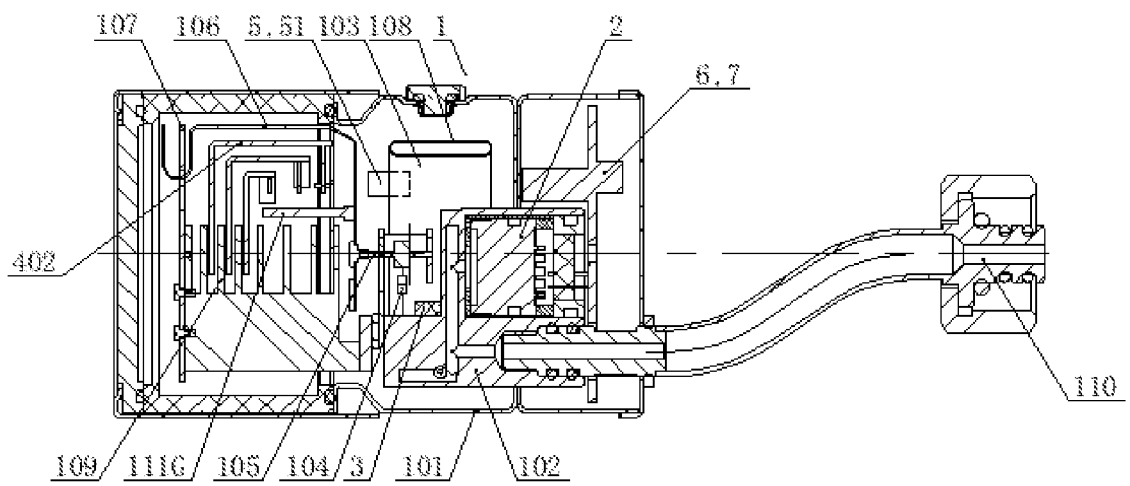
FIG. 6 is a schematic structural diagram of a gas density relay (or gas density monitoring apparatus) applied to high-voltage and medium-voltage electrical equipment and having a simulation check function according to Embodiment 6.

As shown in FIG. 6, a gas density relay (or gas density monitoring apparatus) with a simulation check function includes: a gas density relay body 1, a simulation reference signal unit (a gas density detection sensor, composed of a pressure sensor 2 and a temperature sensor 3), an driving contact action mechanism 5, an online check contact signal sampling unit 6, an intelligent control unit 7 and a simulation check signal unit (including a simulation signal device 402). The online check contact signal sampling unit 6 and the intelligent control unit 7 are provided on the gas density relay body 1; the simulation reference signal unit consists of a pressure sensor 2 and a temperature sensor 3, and is provided on the gas density relay body 1; the pressure sensor 2, the temperature sensor 3, the online check contact signal sampling unit 6 and the simulation check signal unit are respectively connected to the intelligent control unit 7; and the driving contact action mechanism is a temperature adjusting mechanism 5, the temperature adjusting mechanism 5 includes a heating element 51, and the heating element 51 is provided on the gas density relay body 1.

Specifically, in the embodiment, the gas density relay body 1 includes a housing 101, and a base 102, an end base 108, a pressure detection element (a Bourdon tube in the example) 103, a temperature compensation element 104, a plurality of signal generators (magnetic-assisted electrical contacts in the embodiment) 109, a signal action rod 111G, a core 105, a pointer 106 and a dial 107 which are arranged in the housing 101. The simulation signal device 402 is arranged in the housing 101 of the gas density relay body 1. One end of the pressure detection element 103 is fixed to the base 102 and communicates with the base 102, the other end of the pressure detection element 103 is connected to one end of the temperature compensation element 104 through the end base 108, the other end of the temperature compensation element 104 is connected to the core 105, the core 105 is provided with the signal action rod 111G, the signal action rod 111G pushes the signal generators 109 and the simulation signal device 402 for connecting or disconnecting the contacts of the signal generators 109 and the simulation signal device 402, and the simulation signal device 402 (a magnetic-assisted electrical contact is adopted in the embodiment) outputs a contact signal, which is a switch quantity. The pressure sensor 2 is provided on the base 102, and a gas path of the pressure sensor 2 communicates with the pressure detection element (a Barden tube is adopted in the embodiment) 103; and the temperature sensor 3 is provided near the temperature compensation element 104. By adjusting the position of a static contact of the simulation signal device (a magnetic-assisted electrical contact is adopted in the embodiment) 402, the action value of its contact is debugged and set, and the density value range corresponding to the set simulation density value output signal value PFS20 is 85% to 115% of the rated value of the gas density relay.

The working principle of the present embodiment is the same as that of Embodiment 2 with the differences as follows: (1) the pressure detection element of the present embodiment adopts the Barden tube; (2) the simulation signal device 402 adopts the magnetic-assisted electrical contact; and (3) the pressure sensor 2 is provided on the base 102.

Embodiment VII

Figure 7:
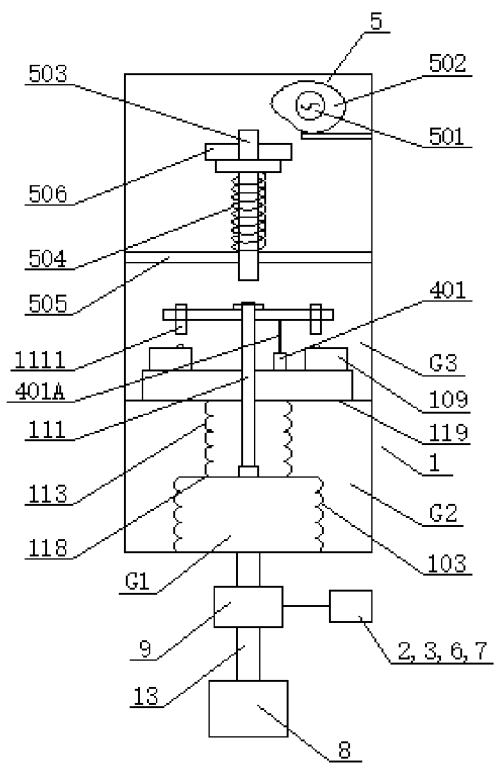
FIG. 7 is a schematic structural diagram of a gas density relay (or gas density monitoring apparatus) applied to high-voltage and medium-voltage electrical equipment and having a simulation check function according to Embodiment 7.

As shown in FIG. 7, a gas density relay (or gas density monitoring apparatus) with a simulation check function in Embodiment 7 of the present disclosure includes: a gas density relay body 1, a simulation reference signal unit (a gas density detection sensor, composed of a pressure sensor 2 and a temperature sensor 3), an driving contact action mechanism 5, an online check contact signal sampling unit 6, an intelligent control unit 7, a multi-way connector 9, a simulation check signal unit (including a diagnostic sensor 401) and an electrical equipment connector 13. The gas density relay body 1, the pressure sensor 2, the temperature sensor 3, the on-line check contact signal sampling unit 6 and the intelligent control unit 7 are arranged on the multi-way connector 9.

Specifically, the gas density relay body 1 includes: a housing, and a first bellow 103 (i.e. a pressure detection element), a second bellow 113, a signal generator 109 (a micro switch is adopted in the embodiment), and a signal action mechanism 111 in the housing. A first open end of the first bellow 103 is fixed on an inner wall of the housing, a second open end of the first bellow 103 is connected with a first sealing part 118 in a sealed manner, an inner wall of the first bellow 103, the first sealing part 118, and the inner wall of the housing form a first sealing gas chamber G1 in an encircling manner, and the pressure sensor 2 is communicated with the first sealing gas chamber G1. The first sealing gas chamber G1 is communicated with insulating gas of the electrical equipment 8 through the multi-way connector 9 and the connector 13 for the electrical equipment. A first open end of the second bellow 113 is connected with the first sealing part 118 in a sealed manner, a second open end of the second bellow 113 is connected with the inner wall of the housing through a second sealing part 119, an outer wall of the first bellow 103, the first sealing part 118, an outer wall of the second bellow 113, the second sealing part 119 and the inner wall of the housing form a second sealing gas chamber G2 in an encircling manner, and the second sealing gas chamber G2 is filled with standard compensation gas with a density value of P20BC, that is, the second sealing gas chamber G2 is a standard gas chamber for temperature compensation, the temperature compensation element is formed, and the second pressure sensor 4 is arranged in the second sealing gas chamber G2, and used for detecting a gas pressure in the second sealing gas chamber G2. The inner wall of the second bellow 113, the second sealing part 119 and the inner wall of the housing form a cavity G3 in an encircling manner. The signal action mechanism 111 and the signal generator 109 are arranged in the cavity G3. The signal action mechanism 111 is connected with the first sealing part 118, the signal generator 109 is arranged corresponding to the signal action mechanism 111, and the gas density relay body 1 outputs contact signals through the signal generator 109. In the present embodiment, the signal action mechanism 111 includes a moving rod; one end of the moving rod extends into the second bellow 113, is fixedly connected to the first sealing part 118, and displaces with the deformation of the first bellow 103; and the other end of the moving rod extends out of the second bellow 113, and is fixedly connected to a adjusting and fixing part, the adjusting and fixing part is provided with a adjusting screw 1111, and the adjusting screw 1111 is arranged corresponding to the signal generator 109. The gas density is monitored through the first sealing gas chamber G1 and the second sealing gas chamber G2, the gas density is monitored in combination with the signal generator 109, when the gas density is lower than and/or higher than the set gas density, an alarm and/or a locking contact signal are/is output through the signal generator 109.

The principle of the embodiment is as follows: the diagnostic sensor 401 is a displacement sensor (or a deformation quantity sensor, or a photoelectric sensor), which is arranged below the signal action mechanism 111, arranged opposite to the signal action mechanism 111, and contacts with or is associated with the signal action mechanism 111 through a contact part 401A, and the diagnostic sensor 401 is configured to acquire the corresponding position signal or/and displacement quantity signal of the signal action mechanism 111 of the gas density relay body 1, and diagnose the current working state of the gas density relay body 1. The intelligent control unit 7 monitors the gas density value in real time through the pressure sensor 2 and the temperature sensor 3, the diagnostic sensor 401 detects the corresponding position of the signal action mechanism 111, and if the position is within a preset threshold thereof, the current working state of the signal action mechanism 111 of the gas density relay (or gas density monitoring apparatus) is the normal working state, otherwise, the current working state is the abnormal working state. Or, the density change value $\Delta P20$ generated by the gas density value change enables the signal action mechanism 111 to generate a corresponding displacement, the diagnostic sensor 401 detects the displacement quantity $\Delta S20$, and if the displacement quantity $\Delta S20$ is within a preset threshold thereof, the current working state of the signal action mechanism 111 of the gas density relay (or gas density monitoring apparatus) is normal, otherwise, the current working state is abnormal. Or, a corresponding relationship between each density change value and a corresponding preset standard value of the displacement quantity of the signal action mechanism 111 may be pre-designed into a data table; the intelligent control unit 7 obtains a displacement quantity ΔS1 detected by the diagnostic sensor 401, of the signal action mechanism 111, under the current gas density change, queries the corresponding preset standard value ΔS2 of the current gas density change value in the data table, calculates a difference |ΔS1−ΔS2|, that is, an error, between the detected displacement quantity ΔS1 and the preset standard value ΔS2, and judges whether the error is within a preset threshold or not, and if the error is within the preset threshold, a current working state of the signal action mechanism 111 of the gas density relay (or gas density monitoring apparatus) is normal, otherwise, the current working state is abnormal. That is, the intelligent control unit 7 makes determination according to the density value collected under the same gas density and the corresponding position or/and displacement quantity detected by the diagnostic sensor 401 on the signal action mechanism 111, and obtains whether the current working state of a monitored part of the gas density relay is normal or not, and then the precision of the gas density relay can be quantitatively and accurately monitored through the accurate monitoring of the signal action mechanism 111 in a wide range of ambient temperature.

Then, the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body 1 and connects the contact of the gas density relay body 1 to the intelligent control unit 7; and then, the intelligent control unit 7 controls the driving contact action mechanism 5, the driving contact action mechanism 5 is provided above the signal action mechanism 111 of the gas density relay body 1 and is configured to apply an action force to the signal action mechanism 111 so that the moving rod moves, the balance of the forces of the first sealing gas chamber G1 and the cavity G3 acting on the upper end face of the first bellow 103 is broken, and the first bellow 103 deforms with the movement of the moving rod to generate a certain displacement. The moving rod 111 drives the adjusting screw 1111 to trigger a button of the signal generator 109, the signal generator 109 sends an alarm and a locking signal, and action of the alarm and the locking signal is sensed by the intelligent control unit 7; and if the alarm and the locking signal can both be acted and sensed (captured), it indicates that the execution mechanism of the contact and the contact are normal.

In the example, the driving contact action mechanism 5 includes a force application mechanism and a movement mechanism, and the force application mechanism drives the movement mechanism to move. The force application mechanism includes a drive component 501 and a force transmission part 502 (being a cam in the example, and the cam rotates under driving of the drive component 501) driven by the drive component 501; and the movement mechanism includes a push rod 503, a fixing part 506 is arranged at one end, close to the force application mechanism, of the push rod 503, and the other end of the push rod 503 penetrates through a fixed frame 505 fixed into the housing of the gas density relay body 1, and is directly opposite to the moving rod of the signal action mechanism 111. A reset spring 504 is arranged on the push rod 503 between the fixing part 506 and the fixed frame 505 in a sleeved manner, that is, the push rod 503 carries out vertical reciprocating movement under the action of the force application mechanism. When the force application mechanism does not apply a force, under the action of the reset spring 504, the push rod 503 is away from the moving rod of the signal action mechanism 111, and the push rod 503 does not apply a force on the moving rod of the signal action mechanism 111. During simulation or virtual check, the force transmission part 502 rotates under the driving of the drive part 501, the push rod 503 is pushed to move downward, then an action force is applied on the spring 504 and the signal action mechanism 111, that is, the drive part 501 applies an action force on the signal action mechanism 111 through the force transmission part 502, so that the gas density relay body 1 generates a contact signal action.

The drive part 501 includes, but is not limited to, one of a magnetic driving mechanism, gravity, a motor (for example, an electric push rod motor or stepping motor), a reciprocating movement mechanism, a Carnot cycle mechanism, an air compressor, a compressor, a vent valve, a pressure making pump, a booster pump, a booster valve, an electric air pump, an electromagnetic air pump, a pneumatic element, a magnetic coupling thrust mechanism, a mechanism generating thrust with heating, a mechanism generating thrust with electrical heating, and a mechanism generating thrust with chemical reaction; and the force transmission part 502 includes, but is not limited to, one of a cam, a connection rod, a spring, a metal part, a non-metal part, an expansion part and a non-expansion part.

In the embodiment, the detected corresponding position or/and displacement quantity of the signal action mechanism 111 is determined through the simulation signal device 401, the current working state of the monitored part of the gas density relay is obtained, if the accuracy is qualified, the elements of the gas density relay body 1 are enabled to generate corresponding displacement through the driving contact action mechanism 5, and/or the gas density relay body 1 is driven to generate a contact signal action to verify that an execution mechanism of its contact is normal, and then the simulation or virtual online check is completed.

Embodiment VIII

Figure 8:
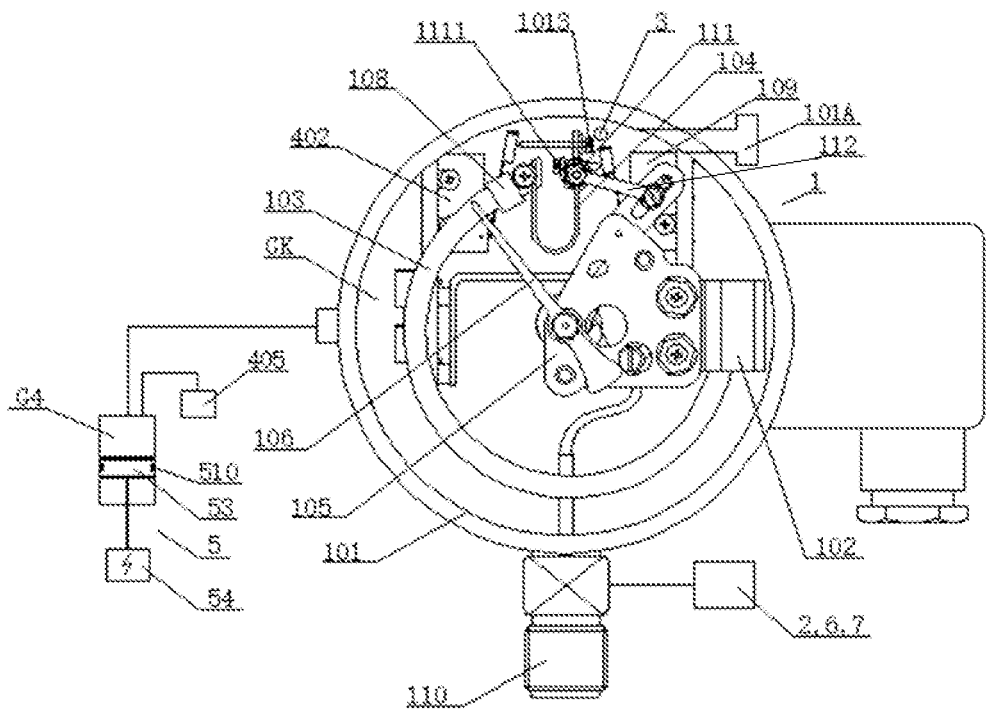
FIG. 8 is a schematic structural diagram of a gas density relay (or gas density monitoring apparatus) applied to high-voltage and medium-voltage electrical equipment and having a simulation check function according to Embodiment 8.

As shown in FIG. 8, a gas density relay (or gas density monitoring apparatus) with a simulation check function in Embodiment 8 of the disclosure includes: a gas density relay body 1, a simulation reference signal unit (a gas density detection sensor, composed a pressure sensor 2 and a temperature sensor 3), an driving contact action mechanism 5, an online check contact signal sampling unit 6, an intelligent control unit and a simulation check signal unit (including a simulation signal device 402). The pressure sensor 2, the online check contact signal sampling unit 6 and the intelligent control unit 7 are provided on a connector 110 for connecting electrical equipment; in the gas path, the pressure sensor 2 of the gas density detection sensor communicates with the gas density relay body 1; and the pressure sensor 2, the temperature sensor 3, the online check contact signal sampling unit 6 and the simulation check signal unit are respectively connected to the intelligent control unit 7.

Specifically, the gas density relay body 1 includes a housing 101, and a base 102, an end base 108, a pressure detection element 103, a temperature compensation element 104, a plurality of signal generators 109, a signal action mechanism 111, a connection rod 112, a core 105, a pointer 106, and a dial 107 which are arranged in the housing 101. The simulation signal device 402 is arranged in the housing 101 of the gas density relay body 1. The driving contact action mechanism is a pressure adjusting mechanism 5, in the embodiment, the pressure adjusting mechanism 5 is a cavity G4 with an opening at one end, the cavity G4 is internally provided with a piston 53 which is provided with a seal ring 510, one end of the piston 53 is connected to a adjusting rod, the outer end of the adjusting rod is connected to a drive part 54, the other end of the piston 53 extends into the opening and is in contact with the inner wall of the cavity G4, and the drive part 54 drives the adjusting rod 54 so as to drive the piston 53 to move in the cavity G4. The drive part 54 includes, but not limited to one of a magnetic driving mechanism, a motor (such as a variable frequency motor or a stepping motor), a reciprocating mechanism, a Carnot cycle mechanism, and a pneumatically operated element. On the gas path, the cavity G4 of the pressure adjusting mechanism 5 communicates with the gas chamber GK in the housing 101 of the gas density relay body 1. The gas density relay (or gas density monitoring apparatus) further includes a second pressure sensor 405, where the second pressure sensor 405 communicates with the cavity G4.

As shown in FIG. 8, Embodiment 8 of the present invention is different from Embodiments 2 and 5 in that the simulation signal device 402 in the present embodiment has an adjustable density action value. Specifically, the housing 101 is provided with an adjusting hole (or adjusting window) 101A, through the adjusting hole (or adjusting window) 101A, a tool (such as a screwdriver) can be used to adjust a signal adjusting part 1013, the density action value of the simulation check signal 402 can be conveniently set on the site as required, that is, the contact signal action value (density action value) of the simulation signal device 402 can be adjusted as required to match the inflation value of the electrical equipment running on site (debug it to be consistent, that is, debug the set simulation density value output signal value PFS20 to be inflation value), so that during normal working state, by utilizing the temperature difference between the gas density relay body 1 and the electrical body, when the temperature at the gas density relay body 1 is higher than that at the gas chamber of the electrical equipment, the simulation signal device 402 outputs a contact signal, at the same time, the intelligent control unit 7 detects a corresponding gas pressure value P and temperature value T when the simulation signal device 402 generates a contact action through the simulation reference signal unit (pressure sensor 2 and temperature sensor 3), so that the intelligent control unit 7 obtains a simulation density value output signal actual action value PFD20 of the gas density relay body 1 according to the gas characteristic, the intelligent control unit 7 or background compares the simulation density value output signal actual action value PFD20 with a simulation density value output signal value PFS20 set in advance and calculates a difference value |PFD20−PFS20| between the detected PFD20 and the preset PFS20, that is an error, and determines whether the error is within a preset threshold, if the error is within the preset threshold, the current working state of the signal action mechanism 111 of the gas density relay (or gas density monitoring apparatus) is the normal working state, otherwise, the current working state is an abnormal working state. Therefore, the accuracy of the gas density relay can be monitored quantitatively and accurately by accurately monitoring the signal action mechanism 111 in a wide range of ambient temperature.

Then the intelligent control unit 7 adjusts the online check contact signal sampling unit 6 to a simulation or virtual check state, and in the simulation or virtual check state, the online check contact signal sampling unit 6 cuts off a control loop of the contact signal of the gas density relay body 1 and connects the contact of the gas density relay body 1 to the intelligent control unit 7. Then the intelligent control unit 7 drives the pressure adjusting mechanism, so that gas pressure in the gas chamber GK inside the housing 101 rises slowly, the gas density relay body 1 generates a contact action, which is transmitted to the intelligent control unit 7 through the online check contact signal sampling unit 6, the alarm and locking signal action are sensed by the intelligent control unit 7, and if the alarm and the locking signal action can be generated and sensed (captured), it means that the executing mechanism of the contact and the contact are normally. Furthermore, the intelligent control unit 7 obtains a gas density value P20 by calculating or inquiring a corresponding data table according to a pressure value P1 collected by the pressure sensor 2 during contact action, a pressure value P2 collected by the second pressure sensor 405, and a temperature value T, detects a contact signal action value PD20 of the gas density relay body, and completes the check work of the contact signal action value PD20 of the gas density relay body. Specifically, when the gas density relay body 1 generates the contact signal action or switching, its equivalent gas pressure value is P=P1-P2; the online simulation check of the gas density relay is completed according to the equivalent gas pressure value P and the pressure value which corresponds to 20° C. and is converted according to the gas pressure-temperature characteristics, i.e. the gas density value P20.

In the embodiment, the simulation signal device 402 is an emulation signal device 402 with a set density value, and the generated simulation check signal belongs to a switch quantity signal, and may also include one or more of a digital quantity signal and an analog quantity signal, the digital quantity signal is that an output signal is a digital quantity, and the analog quantity signal is that an output signal is an analog quantity (such as voltage and current).

Embodiment IX

Figure 9:
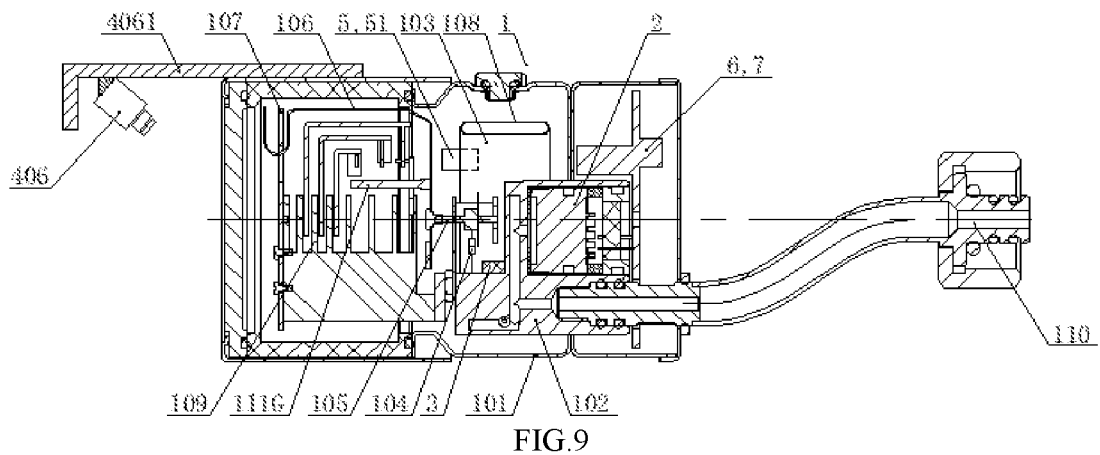
FIG. 9 is a schematic structural diagram of a gas density relay (or gas density monitoring apparatus) applied to high-voltage and medium-voltage electrical equipment and having a simulation check function according to Embodiment 9.

As shown in FIG. 9, a gas density relay (or gas density monitoring apparatus) with a simulation check function includes: a gas density relay body 1, a simulation reference signal unit (a gas density detection sensor, composed of a pressure sensor 2 and a temperature sensor 3), an driving contact action mechanism 5, an online check contact signal sampling unit 6, an intelligent control unit 7 and a simulation check signal unit (including a diagnostic sensor 406). The online check contact signal sampling unit 6 and the intelligent control unit 7 are provided on the gas density relay body 1; the simulation reference signal unit consists of the pressure sensor 2 and the temperature sensor 3, and is provided on the gas density relay body 1; the pressure sensor 2, the temperature sensor 3, the online check contact signal sampling unit 6 and the simulation check signal unit are respectively connected to the intelligent control unit 7; and the driving contact action mechanism is a temperature adjusting mechanism 5, the temperature adjusting mechanism 5 includes a heating element 51, and the heating element 51 is provided on the gas density relay body 1.

Different from Embodiment 6, in the embodiment, the diagnostic sensor 406 is a camera, and the camera is arranged on (or outside) the housing 101 of the gas density relay body 1 through a mounting frame 4061, arranged opposite to the pointer 106 and the dial 107, and further connected to the intelligent control unit 7. The pointer display value or the digital display value of the gas density relay body 1 obtained by the camera through an image recognition technology is a simulation check signal, which is PFZ20, a gas density value by the gas density detection sensor is a simulation reference signal density value FB20, and the intelligent control unit 7 or the background compares the simulation check signal PFZ20 with the simulation reference signal density value PFB20 to obtain a density difference |PFZ20−PFB20|; and if the density difference |PFZ20collected−PFB20| is within a preset threshold thereof, the current working state of the monitored part of the gas density relay (or gas density monitoring apparatus) is the normal working state. Then the precision of the density relay can be quantitatively and accurately monitored.

Then, the intelligent control unit 7 adjusts the online check contact signal sampling unit 6 to a simulation or virtual check state, under the simulation or virtual check state, the online check contact signal sampling unit 6 cuts off a control loop of the contact signal of the gas density relay body 1 and connects the contact of the gas density relay body 1 to the intelligent control unit 7; then, the intelligent control unit 7 controls the heating of the heating element 51, the temperature of the temperature compensation element 104 rises, when the temperature rises to a corresponding degree, the signal generator 109 sends out an alarm and a locking signal, the action of the alarm and the locking signal is sensed by the intelligent control unit 7, if both the alarm and the locking signal can be actuated and sensed (captured), it indicates that an execution mechanism of the contact and the contact are normal. Further, when the signal generator 109 sends out an alarm and a locking action signal, the intelligent control unit 7 detects the corresponding gas pressure value P and temperature T during action through the simulation reference signal unit (pressure sensor 2 and temperature sensor 3), so that the intelligent control unit 7 obtains a contact signal action value PDZ20 and/or a contact signal return value PFH20 of the gas density relay body 1 according to the gas characteristic, and respectively compares the contact signal action value PDZ20 and/or the contact signal return value PFH20 of the gas density relay body 1 with the corresponding preset standard values, if the error is within a preset threshold, the current working state of the gas density relay body 1 is a normal working state, otherwise, the current working state is an abnormal working state. In this way, online simulation or virtual check of the gas density relay body 1 by gas is realized conveniently. After all the contact signal check work is completed, the intelligent control unit restores the driving contact action mechanism. In this example, the intelligent unit 7 turns off the heating element 51 through control to stop heating of the heating element 51.

Embodiment X

Figure 10:
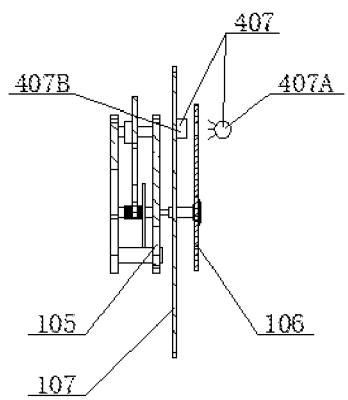
FIG. 10 is a schematic partial diagram of a gas density relay (or gas density monitoring apparatus) applied to high-voltage and medium-voltage electrical equipment and having a simulation check function according to Embodiment 10.

As shown in FIG. 10, a gas density relay (or gas density monitoring apparatus) with a simulation check function is different from Embodiment 9 in that the simulation check signal unit of the present embodiment is a diagnostic sensor 407, the diagnostic sensor 407 is a photoelectric sensor, and the diagnostic sensor 407 is provided in the housing of the gas density relay body 1 and connected to the intelligent control unit 7. The diagnostic sensor 407 includes a receiving host 407B and a light-emitting part 407A, the receiving host 407B is arranged on a dial 107, and the light-emitting part 407A and the receiving host 407B correspond in position to form a light path, such that light emitted from the light-emitting part 407A is received by the receiving host 407B. The receiving host 407B just faces position through which the pointer 106 rotates. The pointer 106 blocks the light path when placed between the light-emitting part 407A and the receiving host 407B, the receiving host 407B cannot receive light emitted by the light-emitting part 407A, at this moment, the receiving host 407B sends a signal, the intelligent control unit 7 knows that the pointer 106 is located at a set density value PFS20 through the signal, and at the same time, a gas density value collected by the gas density detection sensor is the simulation reference signal density value PFB20, and the intelligent control unit 7 or the background compares the density value PFS20 with the density value PFB20 to obtain a density difference |PFB20−PFS20|; and if the density difference |PFB20−PFS20| is within a preset threshold thereof, the current working state of the monitored part of the gas density relay (or gas density monitoring apparatus) is normal, otherwise, the current working state is abnormal. Then the precision of the density relay can be quantitatively and accurately monitored.

Referring to FIG. 9, then the intelligent control unit 7 adjusts the online check contact signal sampling unit 6 to a simulation or virtual check state, under the simulation or virtual check state, the online check contact signal sampling unit 6 cuts off a control loop of the contact signal of the gas density relay body 1 and connects the contact of the gas density relay body 1 to the intelligent control unit 7; then, the intelligent control unit 7 controls the heating of the heating element 51, the temperature of the temperature compensation unit rises, when the temperature rises to a corresponding degree, the signal generator 109 sends out an alarm and a locking signal, the action of the alarm and the locking signal is sensed by the intelligent control unit 7, if both the alarm and locking signal can be actuated and sensed (captured), it indicates that an execution mechanism of the contact and the contact are normal.

The embodiment may further be designed as follows: the dial 107 is provided with an open hole, and when the diagnostic sensor 407 is not aligned with the pointer 106, the light emitted by the diagnostic sensor 407 is not reflected back immediately; when the diagnostic sensor 407 is aligned with the pointer 106, the light emitted by the photoelectric sensor 407 is reflected back by the pointer 106 immediately, at this moment, the diagnostic sensor 407 sends a signal, the intelligent control unit 7 knows that the pointer 106 is located at a set density value PFS20 through the signal, and at the same time, a gas density value collected by the gas density detection sensor is PFB20, and the intelligent control unit 7 or the background compares the density value PS20 with the density value PFB20 to obtain a density difference |PFB20−PFS20|; and if the density difference |PFB20−PFS20| is within a preset threshold value thereof, the current working state of the monitored part of the gas density relay (or gas density monitoring apparatus) is a normal working state, and maintenance is not required, otherwise, the current working state is abnormal.

Embodiment XI

Figure 11:
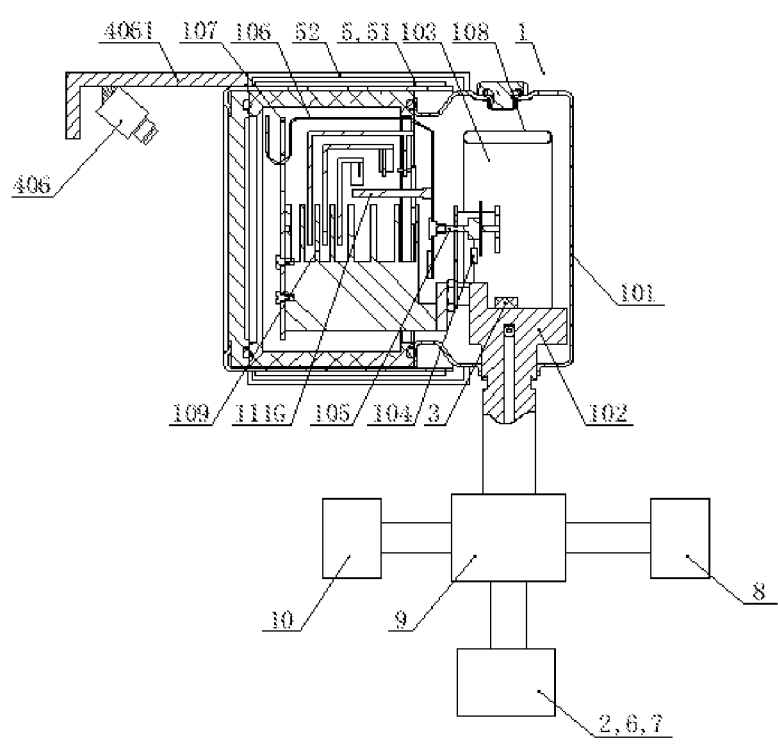
FIG. 11 is a structural schematic diagram of a gas density relay (or gas density monitoring apparatus) applied to high-voltage and medium-voltage electrical equipment and having a simulation check function according to Embodiment 11.

As shown in FIG. 11, a gas density relay (or gas density monitoring apparatus) with simulation check function includes: a gas density relay body 1, a simulation reference signal unit (a gas density detection sensor, formed by a pressure sensor 2 and a temperature sensor 3), an driving contact action mechanism 5, an online check contact signal sampling unit 6, an intelligent control unit 7, a simulation check signal unit (including a diagnostic sensor 406), a multi-way connector 9 and an air supply connector 10. The driving contact action mechanism is a temperature adjusting mechanism 5, the temperature adjusting mechanism 5 includes a heating element 51 and a heat insulation part 52, the heating element 51 is provided outside the housing 101 of the gas density relay body 1, the heat insulation part 52 is provided outside the heating element 51, and the heating element 51 and the heat insulation part 52 are fixed on the housing 101. The temperature sensor 3 is provided inside the housing 101 or outside the housing 101. The gas density relay body 1 is fixed on the multi-way connector 9, the pressure sensor 2, the online check contact signal sampling unit 6 and the intelligent control unit 7 are provided together and are all fixed on the multi-way connector 9, the gas supply connector 10 is also provided on the multi-way connector 9, and the multi-way connector 9 and electrical equipment 8 are connected together. In the embodiment, the diagnostic sensor is also adopts a camera, which is fixed in or outside the housing of the gas density relay body 1 through a mounting frame 4061, and provided opposite to the pointer 106 and the dial 107. The camera, the pressure sensor 2, the temperature sensor 3, the driving contact action mechanism 5 (heating element 51), and the online check contact signal sampling unit 6 are all connected to the intelligent control unit 7. After carrying out simulation check on the gas density relay, if the density relay is abnormal, the intelligent control unit 7 can output an abnormal alarm signal, which can be parallelly connected to an alarm contact of the gas density relay body 1, and the abnormal alarm signal can be uploaded through an alarm circuit.

The working principle of the present embodiment is the same as that of Embodiment 9, which will not be elaborated herein again. The difference from Embodiment 9 is that: 1) the driving contact action mechanism 5 (heating element 51) is provided outside the housing 101 of the gas density relay body 1; 2) a multi-way connector 9 is included.

The technical solution of the embodiment can be used to transform and upgrade an existing density relay on site, the specific method is as follows: the driving contact action mechanism 5 (heating element 51) is provided outside the housing 101 of the existing gas density relay body 1 on site; the camera is fixed on the housing (or outside the housing) of the existing gas density relay body 1 through the mounting frame 4061, and the camera is arranged opposite to the pointer 106 and the dial 107, so that the camera can completely capture the images of the pointer 106 and the dial 107; the temperature sensor 3 is provided inside the housing 101 or outside the housing 101; the gas density relay body 1 is arranged on the multi-way connector 9, and the multi-way connector 9 can use existing or new ones; the pressure sensor 2, the online check contact signal sampling unit 6 and the intelligent control unit 7 are arranged together and installed on the multi-way connector 9; the multi-way connector 9 and the electrical equipment 8 are connected and fixed; and the online check contact signal sampling unit 6 is connected to the alarm and locking contacts of the gas density relay body 1. Through the technical solution, the existing ordinary density relay in a substation may be upgraded or transformed, online simulation or virtual check may be realized without manual check, the efficiency is improved, and the operation and maintenance costs are reduced. In addition, a cover can be provided outside the gas density relay body 1, the heating element 51 is provided inside the cover, and the temperature sensor 3 is provided inside or outside the housing of the gas density relay body 1.

The above gas density relay can compare error performance thereof at different temperatures and in different time periods. That is, the performance of the electrical equipment and the gas density relay are determined through comparison in different time periods and within the same temperature range, the comparison having the comparison of various historical periods, history and present; the gas density relay can also be simulatedly or virtually checked.

A type of the above pressure sensor 2 is: an absolute pressure sensor, a relative pressure sensor, or an absolute pressure sensor and a relative pressure sensor, the number of which may be several. The form of the pressure sensor may be a diffusion silicon pressure sensor, an MEMS pressure sensor, a chip-type pressure sensor, a coil induction pressure sensor (such as a Bourden tube pressure sensor with an inducting coil), and a resistance pressure sensor (such as a Bourden tube pressure sensor with a slide-wire resistance). The pressure sensor may be an analog quantity pressure sensor, or may also be a digital quantity pressure sensor. Pressure acquisition uses various pressure sensing elements such as a pressure sensor and a pressure transmitter, for example, the type of diffusion silicon, sapphire, piezoelectricity and a strain gage (the type of a resistance strain gage and a ceramic strain gage).

The above temperature sensor 3 may be: a thermocouple, a thermistor, or a semiconductor type; may be a contact type and a non-contact type; and may be a thermal resistance and a thermocouple. To sum up, various temperature sensing elements such as the temperature sensor and the temperature transmitter may be used for temperature acquisition.

The above gas density relay body includes a density relay with indication (a density relay with pointer display, or a density relay with digital display, or a density relay with liquid crystal display), and a density relay without indication (i.e., a density switch).

The gas density relay has the functions of pressure and temperature measurement and software conversion. On the premise that the safety running of the electrical equipment is not influenced, an alarm and/or locking contact value and/or return value of the gas density relay may be detected online. Certainly, the return value of the alarm and/or locking contact signal may also not be tested as required.

The intelligent control unit 7 mainly completes the control and signal acquisition over the driving contact action mechanism, and can detect the pressure value and temperature value for the contact signal of the gas density relay body 1 having an action, and convert same to the pressure value P20 (the density value) corresponding to 20° C., that is, the contact action value PD20 of the gas density relay body can be detected so as to complete the check on the gas density relay body. Alternatively, the intelligent control unit 7 can directly detect the density value PD20 for the contact signal of the gas density relay body having the action to complete the check on the gas density relay body, which is the most basic requirement. Of course, the intelligent control unit 7 may further achieve: a storage of test data; and/or an export of test data; and/or printing of test data; and/or data communication with a host; and/or input of information of the analog and digital quantities. The intelligent control unit 7 further includes a communication module, and long-distance transmission for test data and/or a check result and other information is realized through the communication module. When a rated pressure value of the gas density relay body outputs a signal, the intelligent control unit 7 acquires a current density value at the same time, so that check on the rated pressure value of the gas density relay is completed. When the check is completed, the gas density relay may automatically perform mutual comparison and determination, and if the error is large, an abnormal prompt may be sent: there is something wrong with the pressure detector or the pressure sensor, the temperature sensor, etc. of the gas density relay itself, that is, the gas density relay can complete the function of mutual check on the pressure detector or the pressure sensor, the temperature sensor or the density transmitter. After the check on the gas density relay is completed, a check report may be automatically generated by the intelligent control unit 7, and if there is any abnormality, an alarm may be automatically sent or sent to a designated receiver, for example, to a mobile phone. The intelligent control unit may display the density value and the check results on the spot or through a back end, and the specific manner is flexible; has the functions of real-time on-line data display of the density value, the pressure value, the temperature value, etc., an analysis of a changing trend, an inquiry of historical data, a real-time alarm, etc; may perform on-line monitoring on the gas density value, or the density value, the pressure value, and the temperature value; has the self-diagnosis function to notice the abnormality in time, such as disconnection, short-circuit alarm, sensor damage, etc.; and can compare the error performance of the gas density relay at different temperatures and different time periods, that is, realize the comparison in different periods and within the same temperature range to determine the performance of the gas density relay; realize the comparison of various historical periods, history and present; the gas density relay may further be examined; and whether the gas density relay and the density value of the monitored electrical equipment is normal or not is judged. That is, normality and abnormality judgment, analysis and comparison may be carried out on the density value of the electrical equipment, and the pressure detector, the pressure sensor, the temperature sensor, etc. of the gas density relay, and then the gas density monitoring for the electrical equipment, the judgment, comparison and analysis for the state of the gas density relay are realized; and an analysis system (expert management and analysis system) is further included, and used for monitoring the gas density, and detecting, analyzing and judging the gas density relay and the monitored elements, so as to know where the problem lies, whether in the electrical equipment or the gas density relay; and the contact signal state of the gas density relay body is further monitored, and the state is transmitted remotely. The contact signal state of the gas density relay body may be known to be open or closed at the background, so that another layer of monitoring is provided to improve reliability; the temperature compensation performance of the gas density relay body can further be detected, or detected and judged; contact resistance of the contact of the gas density relay body can further be detected, or detected and judged; and the gas density relay has functions of data analysis and data processing, and can carry out corresponding fault diagnosis and prediction on the electrical equipment.

As long as detection data among the pressure sensor 2, the temperature sensor 3, the pressure detection element 103, the temperature compensation element 104, etc. are consistent and normal, the gas density relay is normal, it is unnecessary for maintenance personnel to verify the gas density relay on the spot in a traditional manner, and manual verification throughout a whole life may be realized. Unless the detection data among the pressure sensor 2 and the temperature sensor 3 of electrical equipment in a substation, and the pressure detection element 103, the temperature compensation element 104, etc. of the gas density relay are inconsistent and abnormal, maintenance personnel are arranged for handling. Manual verification is not required for the consistent and normal detection data, so that reliability is greatly improved, efficiency is greatly increased, and cost is reduced.

In addition, in the present technical solution, the method for implementing the gas density relay having a simulation check function includes: in a normal working state, the gas density relay (or gas density monitoring apparatus) monitors a gas density value in electrical equipment through a gas density detection sensor. The simulation check signal acquires a deformation quantity signal of a component deformed when the pressure, or the temperature, or the gas density changes in the gas density relay body, and/or a position signal or displacement quantity signal of a displaced component; or the simulation check signal action is output; the simulation reference signal unit acquires a signal corresponding to the simulation check signal. The intelligent control unit controls the driving contact action mechanism, so that the gas density relay body generates a contact action, and the intelligent control unit can detect that the gas density relay body generates the contact action, so as to complete on-line simulation or virtual check on the gas density relay body; when all the contact signal check work is completed, the intelligent control unit resumes the driving contact action mechanism.

Specifically, the method further may be: monitoring, by the gas density relay (or the gas density monitoring apparatus) in a normal working state, the gas density value in the electrical equipment, and monitoring online, by the gas density relay (or the gas density monitoring apparatus) through the gas density detection sensor and the intelligent control unit, the gas density value in the electrical equipment. The gas density relay (or the gas density monitoring apparatus), according to a set check time or/and check instruction, and a gas density value status and/or temperature value status, and under the condition that the gas density relay body is allowed to or/and can be checked: adjusts the online check contact signal sampling unit to a check state through the intelligent control unit, where in the check state, the online check contact signal sampling unit cuts off a control loop of the contact signal of the gas density relay body to connect the contact of the gas density relay body to the intelligent control unit. The intelligent control unit controls the driving contact action mechanism, so that the pressure detection element or/and temperature compensation element of the gas density relay body changes, and a deformation quantity signal of a component deformed when the pressure, the temperature, or the gas density changes in the gas density relay body, and/or a position signal or displacement quantity signal of a displaced component are collected from the simulation check signal by the intelligent control unit; or the simulation check signal action is output; a signal corresponding to the simulation check signal is collected from the simulation reference signal unit by the intelligent control unit. Controlling the driving contact action mechanism through the intelligent control unit to enable the gas density relay body to generate a contact action, where the intelligent control unit can detect the contact action of the gas density relay body, and then on-line simulation or virtual check on the gas density relay body is completed. When all the contact signal check work is completed, the intelligent control unit resumes the driving contact action mechanism.

Specifically, the method further may be: detecting, by the intelligent control unit based on data and/or signals collected by the simulation reference signal unit and the simulation check signal, and when the gas density relay body has a contact signal action, a contact signal action value and/or a contact signal return value of the gas density relay body; and diagnosing whether the current working state of the gas density relay body is normal by determining whether an error between a semaphore corresponding to the simulation check signal and a semaphore corresponding to the simulation reference signal unit is within a preset threshold, and whether the contact signal action value and/or the contact signal return value of the gas density relay body are within a preset threshold, or by comparing the semaphore corresponding to the simulation check signal with the semaphore corresponding to the simulation reference signal unit and comparing the contact signal action value and/or the contact signal return value of the gas density relay body with a preset standard value corresponding thereto. Alternatively, the intelligent control unit uploads the received data to the background that diagnoses whether the current working state of the gas density relay body is normal by determining whether the error between the semaphore corresponding to the simulation check signal and the semaphore corresponding to the simulation reference signal unit is within a preset threshold, and whether the contact signal action value and/or the contact signal return value of the gas density relay body are within a preset threshold, or by comparing the semaphore corresponding to the simulation check signal with the semaphore corresponding to the simulation reference signal unit and comparing the contact signal action value and/or the contact signal return value of the gas density relay body with a preset standard value corresponding thereto.

Specifically, the method further may be: diagnosing, by the intelligent control unit based on the data and/or signals collected by the simulation reference signal unit and the simulation check signal, whether the current working state of the gas density relay body is normal by determining the deformation quantity signal, and/or the position signal, and/or the displacement quantity signal for comparison, or by comparing the deformation quantity signal, and/or the position signal, and/or the displacement quantity signal with a preset standard value corresponding thereto; or uploading, by the intelligent control unit, the received data to the background that diagnoses whether the current working state of the gas density relay body is normal by determining the deformation quantity signal, and/or the position signal, and/or the displacement quantity signal for comparison, or by comparing the deformation quantity signal, and/or the position signal, and/or the displacement amount signal with a preset standard value corresponding thereto.

Embodiment XII

Figure 12:
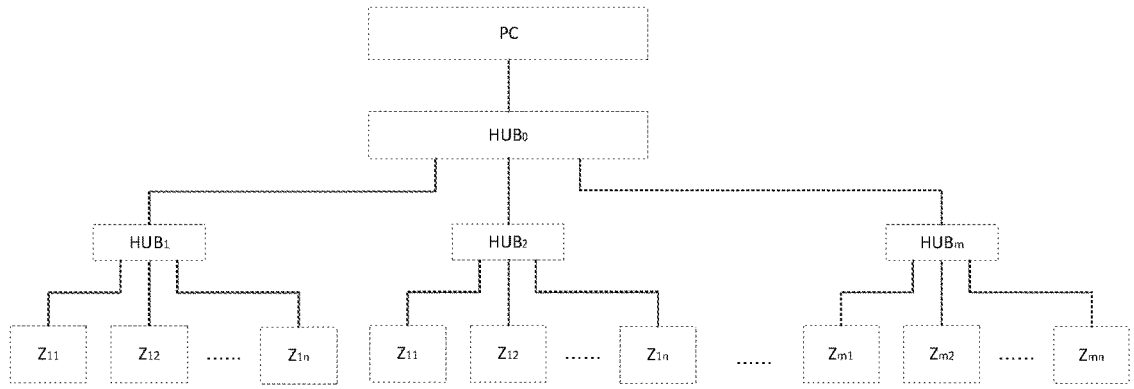
FIG. 12 to FIG. 13 are a gas density monitoring system having a simulation check function according to Embodiment 12.
Figure 13:
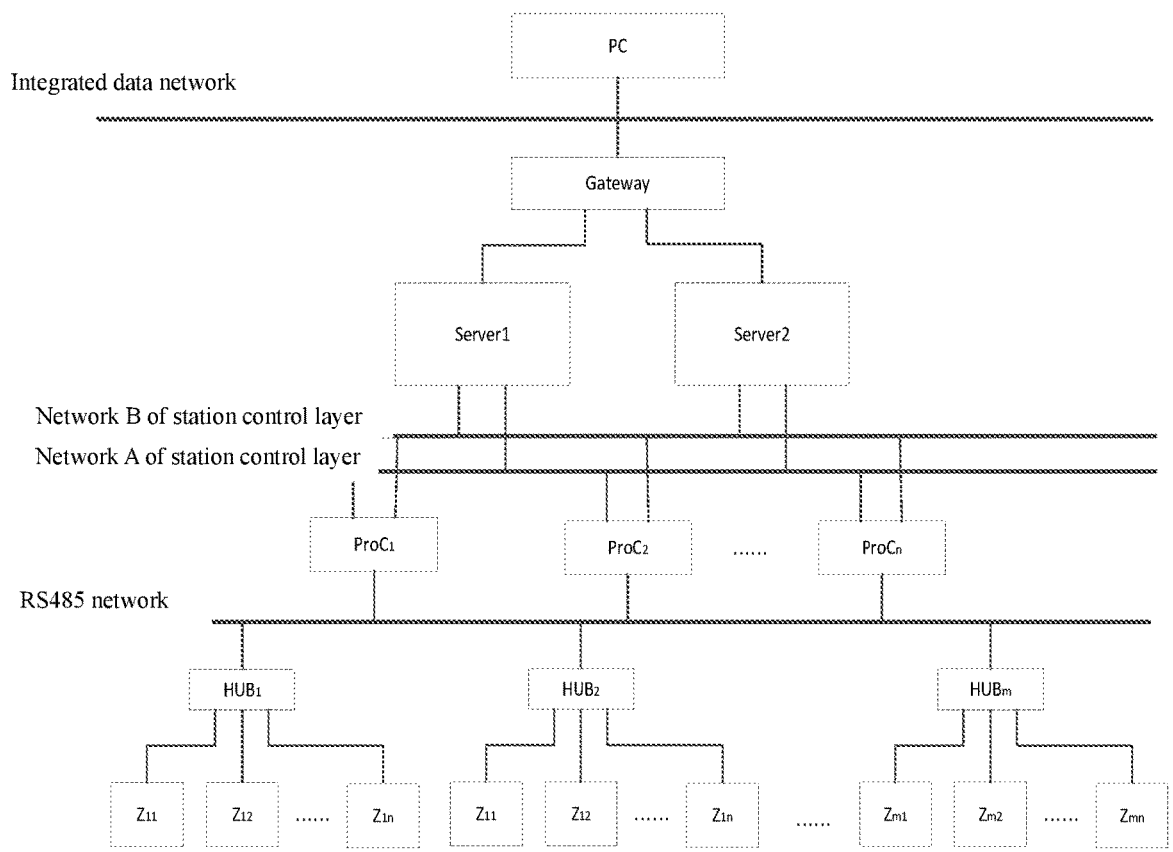

FIGS. 12 and 13 show a gas density monitoring system having a simulation or virtual check configuration, and the gas density monitoring system includes the above gas density relay (or the gas density monitoring apparatus) having a simulation check function.

As shown in FIG. 12, a plurality of electrical equipments provided with a gas chamber, and a plurality of gas density relays (or gas density monitoring apparatuses) having a simulation check function are all connected to a remote background detection system through a hub and an IEC61850 protocol converter in sequence, where the gas density relays (or the gas density monitoring apparatuses) having a simulation check function are respectively provided on an electrical equipment having a corresponding gas chamber.

As shown in FIGS. 12 and 13, PC is an online monitoring background host and system, Gateway is a network switch, Server is a comprehensive application server, ProC is a protocol converter/online monitoring intelligent unit, HUB is a hub, and Z is a gas density relay (or a gas density monitoring apparatus) having a simulation check function. An on-line monitoring system architecture includes: a simple architecture (FIG. 12) and a conventional architecture (FIG. 13) which are listed in detail.

TA system architecture diagram and simple description: 1) background software platform: based on Windows, Linux and others, or VxWorks, Android, Unix, UCos, FreeRTOS, RTX, embOS, MacOS; 2) key service modules and basic functions of background software: for example, rights management, equipment management, data storage and query, etc. and user management, alarm management, real-time data, historical data, real-time curves, historical curves, configuration management, data acquisition, data analysis, recording conditions, abnormity handling, etc; and 3) interface configuration: for example, a Form interface, a Web interface, a configuration interface, etc.

Specifically, as shown in FIG. 12, the on-line monitoring background host and system PC communicates with a plurality of HUBs (HUB1, HUB2, . . . HUBm) through a HUB0. Each hub HUB is connected to a group of gas density relays (or gas density monitoring apparatuses) Z having a simulation check function. For example, the hub HUB1 is connected to gas density relays (or gas density monitoring apparatuses) Z11, Z12, . . . , Z1n having a simulation check function, the hub HUB2 is connected to gas density relays (or gas density monitoring apparatuses) Z21, Z22, . . . , Z2n having a simulation check function, . . . , and the hub HUBm is connected to gas density relays (or gas density monitoring apparatuses) Zm1, Zm2, . . . , Zmn, where m and n both are natural numbers.

As shown in FIG. 13, the on-line monitoring background host and system PC is connected with two integrated application servers (Server1 and Server2) through a network switch Gateway, and the two integrated application servers (Server1 and Server2) communicate with a plurality of protocol converters/on-line monitoring intelligent units ProC (ProC1, ProC2, . . . ProCn) through a network A and a network B of a station control layer, and the protocol converter/on-line monitoring intelligent unit ProC communicates with a plurality of HUBs (HUB1, HUB2, . . . HUBm) through a R5485 network. Each HUB is connected with a group of the self-diagnostic gas density relays (or gas density monitoring apparatuses) Z, for example, the HUB1 is connected with the self-diagnostic gas density relays (or gas density monitoring apparatuses) Z11, Z12, . . . Z1n, the HUB2 is connected with the self-diagnostic gas density relays (or gas density monitoring apparatuses) Z21, Z22, . . . Z2n, and the HUBm is connected with the self-diagnostic gas density relays (or gas density monitoring apparatuses) Zm1, Zm2, . . . Zmn, where m and n are both natural numbers.

In addition, there may be a wireless transmission architecture, for example, a plurality of the integrated application servers (Server1, Server2, . . . Server n) communicate with each gas density relay wirelessly through a Cloud, a wireless gateway, and a wireless module of each gas density relay. N is a natural number.

The gas density relay (or the gas density monitoring apparatus) having a simulation check function may implement the functions of: 1) performing online monitoring on gas density, or being capable of implementing online monitoring on gas density and micro-water, or being capable of implementing online monitoring on gas density, micro-water and decomposition product content; 2) online check on the density relay itself (being capable of online checking a contact signal value and a display value of the density relay); 3) being capable of achieving a reliable performance of the system through mutual check of electronic detection (monitoring) and mechanical detection (monitoring), thereby achieving no manual check throughout the whole life. Unless detection data among the pressure sensor 2, the temperature sensor 3, and the gas density relay body 1 of electrical equipment in a substation are inconsistent and abnormal, maintenance personnel are arranged for handling. For the matched and normal operation, there is no need for a check, which greatly improves the reliability and efficiency and reduces the cost; 4) even being capable of performing zero check on the pressure sensor 2.

The gas density relay (or the gas density monitoring apparatus) having a simulation check function has a self-diagnosis function, and can perform self-diagnosis on each element and diagnosis on a process, for example, a monitoring or check process; the gas density relay has a self-check and comparison performance.

The gas density relay (or the gas density monitoring apparatus) having a simulation check function includes a plurality of pressure sensors, temperature sensors, and mutual check among test data of the plurality of pressure sensors and temperature sensors and among test data of these sensors and the gas density relay body ensures normal operation of the gas density relay.

The gas density relay (or the gas density monitoring apparatus) having a simulation check function compares an environment temperature value with a sampling value of a temperature sensor to complete check on the temperature sensor.

Based on a signal detected by the simulation reference signal unit, the simulation reference signal unit monitors a corresponding position and/or corresponding displacement and/or deformation quantity of at least one of main elements in the gas density relay body, so as to diagnose the current working state of the gas density relay body; or based on gas pressure at the time of monitoring, the simulation reference signal unit monitors a corresponding position and/or corresponding displacement and/or deformation quantity of at least one of the main elements in the gas density relay body, so as to diagnose the current working state of the gas density relay body; or based on temperature at the time of monitoring, the simulation reference signal unit monitors a corresponding position and/or corresponding displacement and/or deformation quantity of at least one of the main elements in the gas density relay body, so as to diagnose the current working state of the gas density relay body. The main elements of the gas density relay body may include: a pressure detection element, a temperature compensation element, a signal generator, a signal adjustment mechanism, a core, and a pointer. For example, the simulation check signal unit includes a diagnostic sensor provided on the core, the pointer, or a connection rod; or the simulation check signal unit includes two diagnostic sensors, one of which is provided on the pressure detection element and the other of which is provided on the temperature compensation element. The intelligent control unit or the background, based on a pressure value collected at the same gas pressure and the simulation check signal unit, makes a determination from a corresponding position and/or corresponding displacement and/or deformation quantity detected by the pressure detection element; and/or the intelligent control unit, based on a temperature value collected at the same gas environment temperature and the simulation check signal unit, makes a determination from a corresponding position and/or corresponding displacement and/or deformation quantity detected by the temperature compensation element; or the intelligent control unit, based on a density value collected at the same gas density and the simulation check signal unit, makes a determination from a corresponding position and/or corresponding displacement and/or deformation quantity detected by the signal adjusting mechanism and/or the core and/or the pointer, so as to obtain a current working state of the monitored part of the gas density relay. The core is connected with the temperature compensation element directly, and transfers the density value.

It should be noted that the gas density relay having a simulation or virtual check function descried in the present application generally means that the elements are designed into an integrated structure; and the gas density monitoring apparatus generally means that the elements are designed into a split structure with flexible composition. The gas temperature generally refers to a temperature in the gas or a corresponding environment temperature. The diagnosing method in the present invention may include that corresponding differences are respectively within a preset threshold thereof, that a detection value is within a set range thereof, and a result of dividing two corresponding detection values is within a preset threshold thereof; in addition, the comparison between corresponding detection results may also be made by the intelligent control unit and/or the background, a method of which may be flexible.

In the present technical solution, the intelligent control unit detects, based on data and/or signals collected by the simulation reference signal unit and the simulation check signal, and when the gas density relay body has a contact signal action, a contact signal action value and/or a contact signal return value of the gas density relay body; and whether the current working state of the gas density relay body is normal is diagnosed by determining whether an error between a semaphore corresponding to the simulation check signal and a semaphore corresponding to the simulation reference signal unit is within a preset threshold, and whether the contact signal action value and/or the contact signal return value of the gas density relay body are within a preset threshold, or by comparing the semaphore corresponding to the simulation check signal with the semaphore corresponding to the simulation reference signal unit and comparing the contact signal action value and/or the contact signal return value of the gas density relay body with a preset standard value corresponding thereto. Alternatively, the intelligent control unit uploads the received data to the background that diagnoses whether the current working state of the gas density relay body is normal by determining whether the error between the semaphore corresponding to the simulation check signal and the semaphore corresponding to the simulation reference signal unit is within a preset threshold, and whether the contact signal action value and/or the contact signal return value of the gas density relay body are within a preset threshold, or by comparing the semaphore corresponding to the simulation check signal with the semaphore corresponding to the simulation reference signal unit and comparing the contact signal action value and/or the contact signal return value of the gas density relay body with a preset standard value corresponding thereto. In addition, the intelligent control unit diagnoses, based on the data and/or signals collected by the simulation reference signal unit and the simulation check signal, whether the current working state of the gas density relay body is normal by determining whether the deformation quantity signal, and/or the position signal, and/or the displacement quantity signal are within a preset threshold, or by comparing the deformation quantity signal, and/or the position signal, and/or the displacement quantity signal with a preset standard value corresponding thereto; or the intelligent control unit uploads the received data to the background that diagnoses whether the current working state of the gas density relay body is normal by determining whether the deformation quantity signal, and/or the position signal, and/or the displacement quantity signal are within a preset threshold, or by comparing the deformation amount signal, and/or the position signal, and/or the displacement quantity signal with a preset standard value corresponding thereto. Alternatively, a contact signal action value and/or a contact signal return value of the gas density relay body is detected when the gas density relay body has a contact signal action; the contact signal action value and/or the contact signal return value of the gas density relay body are compared with a pre-stored required value to diagnose whether the current working state of the gas density relay body is normal; or the contact signal action value and/or the contact signal return value of the gas density relay body are compared with a historical detection value to diagnose whether the current working state of the gas density relay body is normal; or the contact signal action value and/or the contact signal return value of the gas density relay body are compared with an allowable value corresponding to a temperature value during the check to diagnose whether the current working state of the gas density relay body is normal; or the intelligent control unit uploads the received data to the background, and the background diagnoses whether the current working state of the gas density relay body is normal by comparing the contact signal action value and/or the contact signal return value of the gas density relay body with a pre-stored required value; or the contact signal action value and/or the contact signal return value of the gas density relay body are compared with a historical detection value to diagnose whether the current working state of the gas density relay body is normal; or the contact signal action value and/or the contact signal return value of the gas density relay body are compared with an allowable value corresponding to a temperature value during the check to diagnose whether the current working state of the gas density relay body is normal.

The driving contact action mechanism includes a force application mechanism and a movement mechanism, the force application mechanism includes a drive part and a force transmission part driven by the drive part, and the movement mechanism includes a push rod that moves under the drive of the force application mechanism, applies a force to the gas density relay body, directly or indirectly displaces the signal action mechanism to trigger the signal generator to generate a contact signal action, where the contact signal includes an alarm and/or locking.

In the present technical solution, the diagnostic sensor detects a position of the signal action mechanism at a set gas density value, and the intelligent control unit obtains a gas density value collected by the gas density detection sensor; the intelligent control unit or the background determines whether the position is within a preset threshold, and if the position is within the preset threshold, the current working state of the signal action mechanism is normal, otherwise, it is abnormal. Alternatively, each historically detected gas density value and a corresponding preset standard value of the position of the signal action mechanism are generated into a data table; and the intelligent control unit or the background calculates a difference, namely, an error, at a current gas density value acquired by the gas density detection sensor and obtained by the intelligent control unit, between the position of the signal action mechanism detected by the diagnostic sensor and the corresponding preset standard value obtained by querying the data table, and determines whether the error is within a preset threshold. If the error is within the preset threshold, the current working state of the signal action mechanism is normal, otherwise, it is abnormal. Alternatively, the diagnostic sensor detects displacement quantity of the signal action mechanism when the gas density value changes, and the intelligent control unit or the background determines whether the displacement quantity is within a preset threshold. If the displacement quantity is within the preset threshold, the current working state of the signal action mechanism is normal, otherwise, it is abnormal. Alternatively, each historically detected gas density change value and a corresponding preset standard value of the displacement quantity of the signal action mechanism are generated into a data table; and the intelligent control unit or the background calculates a difference, namely, an error, between the displacement amount of the signal action mechanism detected by the diagnostic sensor under the current gas density change and the corresponding preset standard value obtained by querying the data table, and determines whether the error is within a preset threshold. If the error is within the preset threshold, the current working state of the signal action mechanism is normal, otherwise, it is abnormal.

The intelligent control unit controls the driving contact action mechanism, and the intelligent control unit can monitor that the gas density relay body has a contact signal action, and compare a contact signal action value and/or a contact signal return value of the gas density relay body with a preset standard value corresponding thereto. If an error between the two is within a preset threshold, the current working state of the gas density relay body is normal, otherwise, it is abnormal.

When the current working state of the gas density relay body is the abnormal working state, the intelligent control unit outputs a corresponding abnormal alarm contact signal; and preferably, the abnormal alarm contact signal is uploaded to target equipment through an alarm signal line.

In addition, the pressure adjusting mechanism may be an electric control valve, one end of which is directly or indirectly connected to an electrical equipment and the other end of which is directly or indirectly connected to the gas density relay body. The electric control valve is configured to cut off, by using natural temperature changes, a gas path between the gas density relay body and the electrical equipment in time when the temperature is high, and when the temperature decreases, the gas pressure thereof decreases, thereby adjusting the gas pressure to decrease.

The intelligent control unit controls the driving contact action mechanism, and the driving mechanism contact action changes, by adjusting temperature rise and fall of the temperature compensation element of the gas density relay body, the gas temperature monitored by the temperature compensation element; or the driving contact action mechanism changes, by adjusting pressure rise and fall in the pressure detection element or the housing of the gas density relay body, the gas pressure monitored by the pressure detection element; or the driving contact action mechanism changes, by directly or indirectly applying an external force to the signal action mechanism, the gas density monitored by the pressure detection element and the temperature compensation element.

A pressure value, or a temperature value, or a gas density value in the gas density relay body is acquired through the simulation reference signal unit; one or more of a deformation state signal of a part subjected to deformation and a position signal of a part subjected to displacement due to pressure change or temperature change or gas density change in the gas density relay body are collected through the simulation check signal unit; whether a difference between the deformation state of the part subjected to deformation and/or the position of the part subjected to displacement when the pressure or temperature or gas density in the gas density relay body changes and a preset standard value corresponding thereto is within a preset threshold is determined. Alternatively, the simulation reference signal unit is configured to acquire a pressure value or a temperature value or a gas density value in the gas density relay body; the simulation check signal unit is configured to detect one or more of the deformation state of a part subjected to deformation or the position of a part subjected to displacement due to pressure change or temperature change or gas density change in the gas density relay body; the intelligent control unit determines whether a difference between the deformation state of the part subjected to deformation and/or the position of the part subjected to displacement corresponding to a pressure value or temperature value or gas density value in the gas density relay body and a preset standard value, and a preset standard value corresponding thereto is within a preset threshold. The preset standard value generally refers to a corresponding required value or a corresponding value complying with requirements in a normal state; an ideal state generally refers to a zero error state.

Determining whether a difference between the pressure value, and/or the temperature value, and/or the gas density value on the gas density relay body and a preset standard value corresponding thereto when the simulation reference signal unit outputs the simulation check signal is within a preset threshold means: for example, in a simulation check signal action, determining whether a difference between the pressure value, and/or the temperature value, and/or the gas density value on the gas density relay body that are output (or collected) by the simulation reference signal unit and a preset standard value corresponding thereto is within a preset threshold.

To sum up, by providing the simulation reference signal unit and the simulation check signal unit, the present application implements that: in the long-term operation of the gas density relay, the intelligent control unit 7 obtains the current working state of a monitored part of the gas density relay body based on a check of the simulation reference signal unit on a simulation check signal generated by the simulation check signal unit, so that the monitoring accuracy may be ensured quantitatively and accurately and the precision of the gas density relay may be monitored. The present application further provides the driving contact action mechanism, so that the gas density relay body 1 has a contact action, and the intelligent control unit 7 can detect that the gas density relay body 1 generates an alarm and/or a locking contact action, and obtain the contact signal action value PDZ20 and/or the contact signal return value PFH20 of the gas density relay body 1, which may ensure that a contact execution mechanism of the gas density relay body and a contact itself are normal. The present application completes online simulation or virtual check on the gas density relay body through accurate monitoring on a monitored part and qualitative monitoring on the contact signal action value and/or the contact signal return value of the gas density relay body 1, so as to achieve significant effects and progress of the most reliable product quality, optimal costs, and a large use range (both in the south and the north). The gas density relay body may be upgraded using a gas density relay of a substation; by using the technology described in the present invention, it is possible to manufacture a gas density relay check apparatus having a simulation check function; the number of the diagnostic sensors described in the present invention may be two or more. In the present technical solution, a corresponding diagnostic sensor may further be used to diagnose whether the current working state of the core, and/or the pointer, and/or the core connection rod, etc. of the gas density relay body is normal, thereby monitoring whether the current working state of the gas density relay body is normal.

The technical solution implements simulation check mainly through two steps: (1) in the first step, verifying that components in the gas density relay body are good, that is, ensuring that the precision thereof meets requirements. Achieving this requires a temperature change, a pressure change, or a gas density change inside the body, so that the components may have deformation or displacement. If the deformation and the displacement are within an allowable range, the precision thereof is good. Specifically, this may be implemented by: setting the simulation check signal unit as a diagnostic sensor to detect a deformation quantity and a displacement quantity; or setting the simulation check signal unit as a simulation signal device, where when the temperature, pressure or gas density changes slightly, the simulation signal device is triggered to generate a contact action and output a simulation check signal, which indicates that each component is sensitive and good; furthermore, determining that a difference between a gas density value at the occurrence of the contact action and a rated value is within a preset range indicates that the precision thereof is good. It should be noted that the contact action generated by the simulation signal device is different from a subsequent alarm and locking contact action generated by the signal generator at a higher temperature. (2) In the second step, in a case where the precision is verified to meet the requirements, for example, the housing may be heated through the driving contact action mechanism to rise to a higher temperature, so that the signal action mechanism is displaced and the contact of the signal generator is triggered to generate an alarm and a locking contact action, thereby verifying that the execution mechanism of the contact and the contact are good, and further verifying that the gas density relay is good. In addition, this patent also focuses on that: a gas density relay that can operate at 60° C. may operate at 70° C. or 80° C. due to geographical influences, while a conventional gas density relay requires check within a temperature range (e.g., −30° C. to 60° C.). Thus, a simulation (indirect) method is used for verification. If an allowable error value at 60° C. is ±0.025 MPa, an allowable error value at 70° C. may be set to ±0.026 MPa, and an allowable error value at 80° C. may be set to ±0.027 MPa (i.e., the standard is broadened properly). The gas density relay body may be heated to 70° C. to make the body generate a contact action. The action value is compared with a test value at 70° C. stored in advance, and if the error is within the allowable error value at 70° C., it is indirectly proved that the gas density relay body is also good at 60° C. (i.e., the error at 60° C. is also within an operating error range at 60° C.). That is, by performing online simulation (or virtual) check at a temperature outside the temperature use range of the gas density relay, performance indexes of the gas density relay within the temperature use range is verified indirectly, thereby solving the problem that a check using a heating method on the gas density relay is limited by region, which has significant progress and innovation.

The embodiments of the present invention have been described in detail above, but are merely embodiments, and the present invention is not limited thereto. Any equivalent modifications and substitutions made to the present invention are also within the scope of the present invention for those skilled in the art. Therefore, equivalent changes and modifications made without departing from the spirit and scope of the present invention should be included within the scope of the present invention.

What is claimed is:

1. A gas density relay having a simulation check function, comprising: a gas density relay body, a simulation reference signal unit, a simulation check signal unit, a driving contact action mechanism, and an intelligent control unit, wherein
    the gas density relay body comprises: a housing, and a pressure detection element, a temperature compensation element, a signal generator, and a signal action mechanism which are arranged in the housing;
    the driving contact action mechanism is configured to trigger the signal generator to make the gas density relay body generate an alarm and/or locking contact signal action;
    the intelligent control unit is respectively connected to the simulation reference signal unit, the simulation check signal unit, and the driving contact action mechanism, and is configured to receive data and/or signals collected by the simulation reference signal unit and the simulation check signal unit, control the driving contact action mechanism, and monitor the occurrence of a contact signal action of the gas density relay body;
    the simulation reference signal unit is configured to monitor a pressure change value or a temperature change value or a gas density change value in the gas density relay body; the simulation check signal unit is configured to detect one or more of the deformation quantity of a part subjected to deformation and the displacement quantity of a part subjected to displacement due to pressure change or temperature change or gas density change in the gas density relay body; the intelligent control unit determines whether a difference value between the deformation quantity of the part subjected to deformation and/or the displacement quantity of the part subjected to displacement when pressure or temperature or gas density in the gas density relay body changes and a preset standard value, and a corresponding preset standard value is within a preset threshold; or,
    the simulation reference signal unit is configured to collect a pressure value or a temperature value or a gas density value in the gas density relay body; the simulation check signal unit is configured to detect one or more of the deformation state of a part subjected to deformation or the position of a part subjected to displacement due to pressure change or temperature change or gas density change in the gas density relay body; the intelligent control unit determines whether a difference value between the deformation state of the part subjected to deformation and/or the position of the part subjected to displacement corresponding to a set pressure value or temperature value or gas density value in the gas density relay body and a preset standard value, and a preset standard value corresponding thereto is within a preset threshold; or,
    the simulation check signal unit is configured to output a simulation check signal when any one or more of pressure, temperature and gas density in the gas density relay body changes; the simulation reference signal unit is configured to monitor one or more of a pressure value, a temperature value and a gas density value in the gas density relay body when the simulation check signal is output; and the intelligent control unit determines whether a difference value between the pressure value and/or the temperature value and/or the gas density value and a preset standard value, and a preset standard value corresponding thereto is within a preset threshold.

2. The gas density relay having a simulation check function according to claim 1, wherein the simulation check signal unit comprises at least one diagnostic sensor provided in the housing of the gas density relay body, and is configured to detect, through the diagnostic sensor, any one or more of a deformation state and a deformation quantity of a component, and a position and a displacement quantity of a component that are deformed or displaced due to a pressure change, or a temperature change, or a gas density change in the gas density relay body.

3. The gas density relay having a simulation check function according to claim 2, wherein the diagnostic sensor is provided on the pressure detection element; or the diagnostic sensor is provided on the temperature compensation element; or the diagnostic sensor is provided in the signal action mechanism; or there are two diagnostic sensors, one of which is provided on the pressure detection element and the other of which is provided on the temperature compensation element.

4. The gas density relay having a simulation check function according to claim 1, wherein the simulation check signal unit comprises a simulation signal device provided in the housing of the gas density relay body, and is configured to output, when gas pressure monitored by the pressure detection element changes, and/or when gas density monitored by the pressure detection element and the temperature compensation element changes, and/or when gas temperature monitored by the temperature compensation element changes, a simulation check signal by triggering a contact action or a signal change of the simulation signal device, wherein the simulation signal device comprises one or more of a micro switch, an electric contact, a mercury switch, a photoelectric switch, a reed switch, a proximity switch, an electronic switch, a photoelectric sensor, a variable resistor, and a voltage or current measuring device, and the simulation check signal generated by the simulation check signal unit comprises one of a switch quantity signal, a digital quantity signal, and an analog quantity signal.

5. The gas density relay having a simulation check function according to claim 1, wherein the simulation reference signal unit comprises a gas density detection sensor communicated with the gas density relay body; and/or
    the simulation reference signal unit comprises a pressure sensor communicated with a gas path of the gas density relay body; and/or
    the simulation reference signal unit comprises a temperature sensor mounted on or outside the gas path of the gas density relay body, or mounted in the gas density relay body, or mounted outside the gas density relay body.

6. The gas density relay having a simulation check function according to claim 5, wherein the gas density detection sensor comprises at least one pressure sensor and at least one temperature sensor; or the gas density detection sensor is a gas density transmitter composed of a pressure sensor and a temperature sensor; or the gas density detection sensor is a density detection sensor using a quartz tuning fork technology.

7. The gas density relay having a simulation check function according to claim 1, wherein the simulation reference signal unit comprises a simulation reference signal device, and further comprises a second pressure detection element and a second temperature compensation element, and the simulation reference signal unit is configured to monitor a gas density change in the gas density relay body, and when a standard set density value is reached, the simulation reference signal device outputs a standard set density value signal; or the simulation reference signal unit comprises a simulation reference signal device, and further comprises a second pressure detection element, and the simulation reference signal unit is configured to monitor a pressure change in the gas density relay body, and when a standard set pressure value is reached, the simulation reference signal device outputs a standard set pressure value signal; or the simulation reference signal unit comprises a simulation reference signal device, and further comprises a second temperature compensation element, and the simulation reference signal unit is configured to monitor a temperature change in the gas density relay body, and when a standard set temperature value is reached, the simulation reference signal device outputs a standard set temperature value signal, wherein the simulation reference signal device comprises one or more of a micro switch, an electric contact, a mercury switch, a photoelectric switch, a reed switch, a proximity switch, an electronic switch, a photoelectric sensor, a variable resistor, and a voltage or current measuring device.

8. The gas density relay having a simulation check function according to claim 1, wherein the driving contact action mechanism is a temperature adjusting mechanism that is a heating element; or the temperature adjusting mechanism comprises a heating element, a heat insulation part, a temperature controller, a temperature detector, and a temperature adjusting mechanism outer housing; or the temperature adjusting mechanism comprises a heating element and a temperature controller; or the temperature adjusting mechanism comprises a heating element, a heating power adjuster, and a temperature controller; or the temperature adjusting mechanism comprises a heating element, a refrigeration element, a heating power adjuster, and a temperature controller; or the temperature adjusting mechanism comprises a heating element, a heating power adjuster, and a thermostatic controller; or the temperature adjusting mechanism comprises a heating element, a temperature controller, and a temperature detector; or the temperature adjusting mechanism is a miniature thermostat.

9. The gas density relay having a simulation check function according to claim 1, wherein the driving contact action mechanism is a pressure adjusting mechanism that is a cavity with an opening at one end, and the other end of the cavity is communicated with an inner gas chamber of the housing of the gas density relay body; the cavity is internally provided with a piston, one end of the piston is connected to a adjusting rod, an outer end of the adjusting rod is connected to a drive part, the other end of the piston extends into the opening and is in sealed contact with the inner wall of the cavity, and the adjusting rod is driven by the drive part to drive the piston to move in the cavity; or the pressure adjusting mechanism is a sealing gas chamber that is communicated with the inner gas chamber of the housing of the gas density relay body, the sealing gas chamber is internally provided with a piston, the piston is in sealed contact with the inner wall of the sealing gas chamber, a drive part is arranged outside the sealing gas chamber, and the drive part pushes the piston through an electromagnetic force to move in the cavity; or, the pressure adjusting mechanism is an airbag of which one end is connected to a drive part, the airbag has volume changes under the driving of the drive part, and the airbag communicates with the internal gas chamber of the housing of the gas density relay body; or the pressure adjusting mechanism is a bellow, one end of the bellow communicates with the internal gas chamber of the housing of the gas density relay body, and the other end of the bellow extends and withdraws under the driving of the drive part.

10. The gas density relay having a simulation check function according to claim 1, wherein the driving contact action mechanism comprises a force application mechanism and a movement mechanism, the force application mechanism comprises a drive part and a force transmission part driven by the drive part, and the movement mechanism comprises a push rod that moves under the drive of the force application mechanism, applies an action force to the gas density relay body, directly or indirectly displaces the signal action mechanism to trigger the signal generator to generate an alarm and/or a locking contact signal action, wherein the force transmission part comprises one of a cam, a connection rod, a spring, a metal part, a non-metal part, a telescopic part, and a non-telescopic part.

11. The gas density relay having a simulation check function according to claim 1, wherein the gas density relay further comprises an online check contact signal sampling unit that is connected respectively to the signal generator and the intelligent control unit of the gas density relay body, and configured to sample an alarm and/or a locking contact signal of the gas density relay body;

the online check contact signal sampling unit comprises an isolation sampling element controlled by the driving contact action mechanism or the intelligent control unit; in a non-check state, the online check contact signal sampling unit is relatively isolated in a circuit from a contact signal of the gas density relay body through an isolation sampling element; in a check state, the online check contact signal sampling unit cuts off a contact signal control loop of the gas density relay body through the isolation sampling element, and connects a contact of the gas density relay body to the intelligent control unit, wherein the isolation sampling element comprises one of a travel switch, a micro switch, a button, an electric switch, a displacement switch, an electromagnetic relay, an optocoupler, and a silicon controlled rectifier.

12. The gas density relay having a simulation check function according to claim 11, wherein the gas density relay further comprises a multi-way connector, and one or more of the gas density relay body, the simulation reference signal unit, the online check contact signal sampling unit, and the intelligent control unit are provided on the multi-way connector.

13. The gas density relay having a simulation check function according to claim 1, wherein the housing of the gas density relay body is further provided with a display mechanism for displaying the density of an insulation gas.

14. The gas density relay having a simulation check function according to claim 1, wherein at least two gas density relays are connected to a remote background detection system through a hub and a protocol converter in sequence, wherein the gas density relays are provided on an electrical equipment of a gas chamber corresponding to the gas density relays.

15. A simulation check method of the gas density relay having a simulation check function according to claim 1, the method comprising precision measurement that uses any one or more of A) to C):
- A) monitoring a pressure change value or a temperature change value or a gas density change value in the gas density relay body by a simulation reference signal unit; collecting, by a simulation check signal unit, one or more of the deformation quantity of a part subjected to deformation and the displacement quantity of a part subjected to displacement in the change value interval when pressure or temperature or gas density in the gas density relay body changes; determining whether a difference value between the deformation quantity of the part subjected to deformation and/or the displacement quantity of the part subjected to displacement when pressure or temperature or gas density in the gas density relay body changes and a preset standard value, and a preset standard value corresponding thereto is within a preset threshold;
- B) collecting a pressure value or a temperature value or a gas density value in the gas density relay body by the simulation reference signal unit; detecting, by the simulation check signal unit, one or more of a deformation state signal of a part subjected to deformation or a position signal of a part subjected to displacement due to pressure change or temperature change or gas density change in the gas density relay body; determining whether a difference value between the deformation state of the part subjected to deformation and/or the position of the part subjected to displacement corresponding to a set pressure value or temperature value or gas density value in the gas density relay body and a preset standard value, and a preset standard value corresponding thereto is within a preset threshold; and
- C) outputting a simulation check signal by the simulation check signal unit when any one or more of pressure, temperature and gas density in the gas density relay body changes; monitoring one or more of a pressure value, a temperature value and a gas density value in the gas density relay body by the simulation reference signal unit when the simulation check signal is output; determining whether a difference value between the pressure value and/or the temperature value and/or the gas density value and a preset standard value, and a preset standard value corresponding thereto is within a preset threshold.

16. The simulation check method of the gas density relay having a simulation check function according to claim 15, wherein the method comprises: controlling, by an intelligent control unit, a driving contact action mechanism to, through temperature adjusting, pressure adjusting, or directly or indirectly applying an external force to a signal action mechanism of the gas density relay body, change gas pressure monitored by a pressure detection element of the gas density relay body, or change gas temperature monitored by a temperature compensation element, or change gas density monitored by the pressure detection element and the temperature compensation element.

17. The simulation check method of the gas density relay having a simulation check function according to claim 15, wherein the method comprises:
- comprising, by the simulation reference signal unit, a simulation reference signal device, and further comprising a second pressure detection element and a second temperature compensation element, wherein when the gas density in the gas density relay body monitored by the second pressure detection element and the temperature compensation element changes, the gas density in the gas density relay body monitored by the second pressure detection element and the second temperature compensation element changes simultaneously, the simulation check signal unit outputs a simulation check signal, and when the gas density reaches a standard set density value, the simulation reference signal unit outputs a standard set density value signal by triggering a contact action or a signal change of the simulation reference signal device; the intelligent control unit receives data and/or signals collected by the simulation reference signal unit, and compares a corresponding gas density value when the simulation check signal unit outputs a simulation check signal with a corresponding gas density value when the simulation reference signal unit outputs the standard set density value signal, and when a difference between the two is within a preset threshold, a current working state of the gas density relay body is normal, otherwise, it is abnormal; or
- Preferably, the simulation reference signal unit includes a simulation reference signal device, and further includes a second pressure detection element; when gas pressure in the gas density relay body monitored by the pressure detection element changes, the gas pressure in the gas density relay body monitored by the second pressure detection element changes at the same time, the simulation check signal unit outputs a simulation check signal; the simulation check signal unit outputs a standard set pressure value signal by triggering the contact action or signal change of the simulation reference signal device when the gas pressure reaches a standard set pressure value; the intelligent control unit receives data and/or signals collected by the simulation reference signal unit, and compares the corresponding gas pressure value when the simulation check signal unit outputs the simulation check signal with the corresponding gas pressure value when the simulation reference signal unit outputs the standard set pressure value signal; and if the difference value between the two gas pressure values is within the preset threshold, the current working state of the gas density relay body is a normal working state, otherwise, the current working state of the gas density relay body is an abnormal working state; or,
- the simulation reference signal unit includes a simulation reference signal device, and further includes a second temperature compensation element; when the gas temperature in the gas density relay body monitored by the temperature compensation element changes, the gas temperature in the gas density relay body monitored by the second temperature compensation element changes at the same time, the simulation check signal unit outputs a simulation check signal when the gas temperature reaches to a standard set temperature value, and the simulation reference signal unit outputs a standard set temperature value signal by triggering the contact action or signal change of the simulation reference signal device; the intelligent control unit receives data and/or signals collected by the simulation reference signal unit, and compares the corresponding gas temperature value when the simulation check signal unit outputs the simulation check signal with the corresponding gas temperature value when the simulation reference signal unit outputs the standard set temperature value signal; and if the difference value between the two gas temperature values is within the preset threshold, the current working state of the gas density relay body is a normal working state, otherwise, the current working state of the gas density relay body is an abnormal working state.

18. The simulation check method of the gas density relay having a simulation check function according to claim 15, wherein the simulation reference signal unit comprises a simulation reference signal device, a second pressure detection element and/or a second temperature compensation element, the simulation reference signal unit outputs two standard set values through the simulation reference signal device: a first standard set value when a first simulation reference signal is output and a second standard set value when a second simulation reference signal is output, and simultaneously, a set simulation check signal value is a corresponding temperature value, pressure value, or gas density value when a preset simulation check signal is output, and the set simulation check signal value is located between the first standard set value and the second standard set value; the simulation check method comprises:

when the simulation check signal actually output by the simulation check signal unit, and the first simulation reference signal and the second simulation reference signal output by the simulation reference signal unit are output according to a preset sequence, the intelligent control unit determines that the difference value between the pressure value and/or temperature value and/or gas density value when the simulation check signal unit actually outputs the simulation check signal and the preset standard value, and a preset standard value corresponding thereto is within the preset threshold, the current working state of the gas density relay body is a normal working state, otherwise, the current working state of the gas density relay body is an abnormal working state.

19. The simulation check method of the gas density relay having a simulation check function according to claim 15, wherein the gas density relay further comprises an online check contact signal sampling unit that is respectively connected to the signal generator and the intelligent control unit of the gas density relay body, and configured to sample an alarm and/or a locking contact signal of the gas density relay body; the simulation check method further comprises:

the gas density relay, according to a set simulation check time and/or simulation check instruction, and a gas density value status and/or temperature value status, and under the condition that the gas density relay body is allowed to and/or can be simulatedly checked:

the intelligent control unit adjusts the online check contact signal sampling unit to a simulation or virtual check state, and in the simulation or virtual check state, the online check contact signal sampling unit cuts off a control loop of the contact signal of the gas density relay body to connect the contact of the gas density relay body to the intelligent control unit;

the intelligent control unit controls a driving contact action mechanism, the driving contact action mechanism applies an external force to a signal action mechanism through temperature adjustment or pressure adjustment or directly or indirectly, so that the gas density relay body generates an alarm and/or a locking contact signal action; the intelligent control unit obtains the gas density value according to the pressure value and the temperature value during contact action, or directly obtains the gas density value, and detects a contact signal action value and/or a contact signal return value of the gas density relay body so as to complete online simulation or virtual check of the gas density relay body; and after all the contact signal check work is completed, the intelligent control unit restores the driving contact action mechanism, and adjusts the online check contact signal sampling unit to the working state, and the contact signal control loop of the gas density relay body restores the normal working state.

20. The simulation check method of the gas density relay having a simulation check function according to claim 15, wherein the method comprises: comparing, by the intelligent control unit after a contact signal action value and/or a contact signal return value of the gas density relay body are detected, the contact signal action value and/or the contact signal return value respectively with a preset standard value corresponding thereto at the same temperature, wherein when differences therebetween are both within a preset threshold, a current working state of the gas density relay body is normal, otherwise, it is abnormal; or the intelligent control unit respectively compares the contact signal action value and/or the contact signal return value with the historical detection values at the same temperature, and a difference value therebetween is within a preset threshold value, the current working state of the gas density relay body is a normal working state, otherwise, the current working state of the gas density relay body is an abnormal working state; or, the intelligent control unit compares the contact signal action value and/or the contact signal return value with an allowable value corresponding to the temperature value during simulation check; and if the difference value between the contact signal action value and/or the contact signal return value and the allowable value corresponding to the temperature value during simulation check is in an allowable error range, the current working state of the gas density relay body is a normal working state, otherwise, the current working state of the gas density relay body is an abnormal working state.

* * * * *